United States Patent
Kim et al.

(10) Patent No.: US 12,243,888 B2
(45) Date of Patent: Mar. 4, 2025

(54) IMAGE SENSOR AND IMAGE PROCESSING METHOD, AND ELECTRONIC DEVICE INCLUDING THE IMAGE SENSOR

(71) Applicant: SAMSUNG ELECTRONICS CO., LTD., Suwon-si (KR)

(72) Inventors: Hyochul Kim, Yongin-si (KR); Younggeun Roh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 546 days.

(21) Appl. No.: 17/377,729

(22) Filed: Jul. 16, 2021

(65) Prior Publication Data

US 2022/0028909 A1 Jan. 27, 2022

(30) Foreign Application Priority Data

Jul. 23, 2020 (KR) .................. 10-2020-0091857
May 11, 2021 (KR) .................. 10-2021-0060946
May 31, 2021 (KR) .................. 10-2021-0070195

(51) Int. Cl.
  *H01L 23/00* (2006.01)
  *H01L 27/146* (2006.01)
  *H04N 25/131* (2023.01)

(52) U.S. Cl.
  CPC .. *H01L 27/14621* (2013.01); *H01L 27/14627* (2013.01); *H01L 27/14629* (2013.01); *H04N 25/131* (2023.01)

(58) Field of Classification Search
  CPC ......... H01L 27/14621; H01L 27/14627; H01L 27/14629
  See application file for complete search history.

(56) References Cited

U.S. PATENT DOCUMENTS

| | | | |
|---|---|---|---|
| 6,365,950 B1* | 4/2002 | Sohn | H01L 27/14643 257/233 |
| 9,100,597 B2 | 8/2015 | Hu | |
| 9,883,149 B2 | 1/2018 | Vogelsong | |
| 2012/0129269 A1 | 5/2012 | Choi et al. | |
| 2013/0163005 A1* | 6/2013 | Tsang | G01J 3/26 356/519 |
| 2014/0247415 A1* | 9/2014 | Kleptsyn | G02F 1/133514 359/891 |

(Continued)

FOREIGN PATENT DOCUMENTS

JP 6692749 B2 5/2020
KR 1020180015067 A 2/2018

(Continued)

OTHER PUBLICATIONS

U.S. Appl. No. 17/366,523 (Year: 2021).*

(Continued)

*Primary Examiner* — Anthony Ho
(74) *Attorney, Agent, or Firm* — Sughrue Mion, PLLC

(57) ABSTRACT

An image sensor and an image processing method of the image sensor are provided. The image sensor includes: a spectral filter including a plurality of unit filters arranged in two dimensions and having different wavelengths; an image sensor including a pixel array receiving light transmitted through the spectral filter and outputting image signals; and a processor performing image processing on image signals output from the pixel array.

42 Claims, 47 Drawing Sheets

(56) References Cited

U.S. PATENT DOCUMENTS

| | | |
|---|---|---|
| 2015/0144770 A1 | 5/2015 | Choi |
| 2018/0204863 A1 | 7/2018 | Tack et al. |
| 2019/0004222 A1 | 1/2019 | Hwang et al. |
| 2019/0187347 A1 | 6/2019 | Bilger et al. |
| 2020/0021782 A1 | 1/2020 | Sugizaki |
| 2020/0109991 A1 | 4/2020 | Tack et al. |
| 2021/0033466 A1 | 2/2021 | Kim et al. |
| 2022/0003906 A1 | 1/2022 | Kim et al. |
| 2022/0020796 A1 | 1/2022 | Kim et al. |
| 2022/0050205 A1* | 2/2022 | Ebbers ................. H04N 13/271 |
| 2022/0128407 A1 | 4/2022 | Lee et al. |
| 2022/0342129 A1 | 10/2022 | Lee et al. |
| 2022/0342130 A1 | 10/2022 | Kim et al. |

FOREIGN PATENT DOCUMENTS

| | | |
|---|---|---|
| KR | 1020210014491 A | 2/2021 |
| KR | 10-2021-0125397 A | 10/2021 |
| WO | 2019/239139 A1 | 12/2019 |

OTHER PUBLICATIONS

U.S. Appl. No. 17/722,655 (Year: 2022).*
Communication dated Feb. 16, 2022 by the European Patent Office in European Patent Application No. 21185826.1.

* cited by examiner

IMAGE SENSOR AND IMAGE PROCESSING METHOD, AND ELECTRONIC DEVICE INCLUDING THE IMAGE SENSOR

CROSS-REFERENCE TO RELATED APPLICATIONS

This application is based on and claims priority under 35 U.S.C. § 119 to Korean Patent Applications No. 10-2020-0091857, filed on Jul. 23, 2020, No. 10-2021-0060946, filed on May 11, 2021, and No. 10-2021-0070195, filed on May 31, 2021, in the Korean Intellectual Property Office, the disclosures of which are incorporated by reference herein in their entirety.

BACKGROUND

1. Field

The disclosure relates to an image sensor, an image processing method, and an electronic device including the image sensor.

2. Description of the Related Art

Image sensors using spectral filters are one of important optical instruments in the field of optics. Related art optical instruments and devices for measuring spectrum, are bulky and heavy. Recently, according to the demand for miniaturization of image sensors, research has been conducted to simultaneously implement an integrated circuit and an optical element on a single semiconductor chip.

SUMMARY

Provided are an image sensor and an image processing method of the image sensor.

Additional aspects will be set forth in part in the description which follows and, in part, will be apparent from the description, or may be learned by practice of the presented example embodiments of the disclosure.

According to an aspect of the disclosure, there is provided an image sensor comprising: a spectral filter comprising a plurality of unit filters arranged in two dimensions, the plurality of unit filters having different center wavelengths; a pixel array comprising a plurality of pixels configured to receive light transmitted through the spectral filter and output image signals; and a processor configured to perform image processing on the image signals output from the pixel array, wherein the plurality of unit filters comprise: at least one first unit filter having a first center wavelength in a first wavelength range; and at least one second unit filter having a second center wavelength in a second wavelength range, and wherein the at least one first unit filter comprises: a plurality of first metal reflective layers spaced apart from each other and comprising a first metal; and at least one first cavity provided between the plurality of first metal reflective layers.

The pixel array may be provided to correspond to the plurality of unit filters.

The processor may be further configured to independently perform image processing on each of the image signals output from the pixel array and output processed image signals.

The processor may be further configured to: group two or more image signals from among the image signals output from the pixel array, perform the image processing on the two or more image signals, and output processed image signals.

The processor may be further configured to: group two or four image signals from among the image signals output from the pixel array, perform the image processing on the two or four image signals, and output processed image signals.

The two or more image signals may be output from adjacent pixels, and the plurality of unit filters may be arranged such that center wavelengths of the plurality of unit filters corresponding to the two or more image signals are adjacent to one another.

The spectral filter may further comprise a red color filter, a green color filter, and a blue color filter provided on a same plane as the plurality of unit filters.

The pixel array may be provided to correspond to the plurality of unit filters and the red color filter, the green color filter, and the blue color filter.

The processor may be further configured to perform image processing on image signals output from pixels in the pixel array corresponding to the red color filter, the green color filter, and the blue color filter.

The spectral filter may comprise a blank filter provided on a same plane as the plurality of unit filters, and wherein the blank filter may be configured to directly transmit incident light.

The pixel array may be provided to correspond to the plurality of unit filters and the blank filter.

The processor may be further configured to perform image processing on an image signal output from a pixel in the pixel array corresponding to the blank filter.

The at least one first unit filter may comprise a plurality of first unit filters having different center wavelengths provided to form a first filter array, and the at least one second unit filter comprises a plurality of second unit filters having different center wavelengths provided to form a first filter array.

The at least one second unit filter may comprise: a plurality of second metal reflective layers spaced apart from each other and comprising a second metal different from the first metal; and at least one second cavity provided between the plurality of second metal reflective layers.

The center wavelength of the at least one first unit filter may be adjusted by changing a thickness or an effective refractive index of the at least one first cavity, and the center wavelength of the at least one second unit filter is adjusted by changing a thickness or an effective refractive index of the at least one second cavity.

The at least one first unit filter may further comprises a first dielectric layer provided below the at least one first cavity and a second dielectric layer provided above the at least one first cavity, and wherein the at least one second unit filter further comprise a third dielectric layer provided below the at least one second cavity and a fourth dielectric layer provided above the at least one second cavity.

A thickness or an effective refractive index of each of the first dielectric layer and the second dielectric layer may be adjusted based on the center wavelength of the at least one first unit filter, and a thickness or an effective refractive index of each of the third dielectric layer and the fourth dielectric layer may be adjusted according to the center wavelength of the at least one second unit filter.

The at least one second unit filter may comprises: a plurality of Bragg reflective layers spaced apart from each other; and at least one second cavity provided between the plurality of Bragg reflective layers.

The image sensor may further comprise a timing controller, a row decoder, and an output circuit.

According to another aspect of the disclosure there is provided an electronic device comprising the image sensor.

The electronic device may comprise a mobile phone, a smartphone, a tablet, a smart tablet, a digital camera, a camcorder, a notebook computer, a television, a smart television, a smart refrigerator, a security camera, a robot, or a medical camera.

According to another aspect of the disclosure there is provided an image processing method of an image sensor including a spectral filter having a plurality of unit filters arranged in two dimensions and having different center wavelengths, and a pixel array including a plurality of pixels, the method comprising: receiving light transmitted through the spectral filter and outputting image signals; and performing image processing on the image signals output from the pixel array, wherein the plurality of unit filters comprise: at least one first unit filter having a first center wavelength in a first wavelength range; and at least one second unit filter having a second center wavelength in a second wavelength range, and wherein the at least one first unit filter comprises: a plurality of first metal reflective layers spaced apart from each other and comprising a first metal; and at least one first cavity provided between the plurality of first metal reflective layers.

The pixel array may be provided to correspond to the plurality of unit filters.

The image processing method further comprising: independently performing the image processing on each of image signals output from the pixel array and output processed image signals.

The image processing method further comprising: grouping two or more image signals from among the image signals output from the pixel array, performing the image processing on the two or more image signals, and outputting processed image signals.

The image processing method further comprising: grouping two or four image signals from among the image signals output from the pixel array, performing the image processing on the two or four image signals, and outputting the two or four image signals.

The two or more image signals are output from adjacent pixels, and the plurality of unit filters are arranged such that center wavelengths of the plurality of unit filters corresponding to the two or more image signals are adjacent to each other.

The spectral filter further comprises a red color filter, a green color filter, and blue color filter provided on a same plane as the plurality of unit filters, and wherein the pixel array is provided to correspond to the plurality of unit filters and the red color filter, the green color filter, and the blue color filter.

The image processing method further comprising: performing image processing on image signals output from pixels in the pixel array corresponding to the red color filter, the green color filter, and the blue color filter.

The spectral filter may further comprise a blank filter provided on a same plane as the plurality of unit filters, wherein the blank filter is configured to directly transmit incident light, and wherein the pixel array is provided to correspond to the plurality of unit filters and the blank filter.

The image processing method further comprising: performing image processing on an image signal output from a pixel in the pixel array corresponding to the blank filter.

The at least one second unit filter comprise: a plurality of second metal reflective layers spaced apart from each other and comprising a second metal different from the first metal; and at least one second cavity provided between the plurality of second metal reflective layers.

The at least one second unit filter comprises: a plurality of Bragg reflective layers provided spaced apart from each other; and at least one second cavity provided between the plurality of Bragg reflective layers.

According to another aspect of the disclosure, there is provided an image sensor comprising: a spectral filter comprising a plurality of unit filters having different center wavelengths; a pixel array comprising a plurality of pixels configured to receive light transmitted through the spectral filter and outputting image signals; and a processor configured to perform image processing on the image signals output from the pixel array, wherein the processor is further configured to group two or more image signals from among the image signals output from the pixel array, perform image processing on the two or more image signals, and output processed image signals.

The pixel array comprises a plurality of blue pixels, a plurality of green pixels, and a plurality of red pixels.

The processor is further configured to: group at least one of first image signals output from the blue pixels and perform image processing on the at least one of the first image signals, group at least one of second image signals output from the green pixels and perform image processing on the at least one of the second image signals, and group at least one of third image signals output from the red pixels and perform image processing on the at least one of the third image signals.

The pixel array further comprises one or more ultraviolet (UV) pixels.

The processor is further configured to group at least one of UV image signals output from the one or more ultraviolet pixels and perform image processing on the at least one of the UV image signals.

The pixel array further comprises one or more near-infrared (NIR) pixels.

The processor is further configured to group at least one of NIR image signals output from the one or more NIR pixels and perform image processing on the at least one of NIR image signals.

The processor is further configured to perform processing on spectrum information regarding each of the image signals output from the pixel array and output the spectrum information.

The processor is further configured apply a weight to at least one of image signals output from the pixel array based on a specific wavelength range corresponding to the image signals, and perform image processing based on a sum of the image signals or a difference between the image signals.

The plurality of unit filters comprise: at least one first unit filter having a first center wavelength in a first wavelength range; and at least one second unit filter having a second center wavelength in a second wavelength range.

The at least one first unit filter comprises: a plurality of first metal reflective layers spaced apart from each other and comprising a first metal; and at least one first cavity provided between the plurality of first metal reflective layers.

The at least one second unit filter comprises: a plurality of second metal reflective layers spaced apart from each other and comprising a second metal different from the first metal; and at least one second cavity provided between the plurality of second metal reflective layers.

The at least one second unit filter comprises: a plurality of Bragg reflective layers spaced apart from each other; and at least one second cavity provided between the plurality of Bragg reflective layers.

The image sensor further comprises a timing controller, a row decoder, and an output circuit.

According to another aspect of the disclosure, there is provided an electronic device comprising the image sensor.

The electronic device comprises a mobile phone, a smartphone, a tablet, a smart tablet, a digital camera, a camcorder, a notebook computer, a television, a smart television, a smart refrigerator, a security camera, a robot, or a medical camera.

According to another aspect of the disclosure, there is provided an image processing apparatus comprising: a memory storing one or more instructions, and a processor configured to execute the one or more instructions to: receive image signals output from an image sensor including a spectral filter and a pixel array, the spectral filter comprising a plurality of unit filters having different center wavelength, group two or more image signals from among the image signals output from the image sensor based on a wavelength range, perform image processing on the two or more image signals, and output processed image signals.

According to another aspect of the disclosure, there is provided an image processing method comprising: receiving image signals output from an image sensor including a spectral filter and a pixel array, the spectral filter comprising a plurality of unit filters having different center wavelength; grouping two or more image signals from among the image signals output from the image sensor based on a wavelength range, performing image processing on the two or more image signals, and outputting processed image signals.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
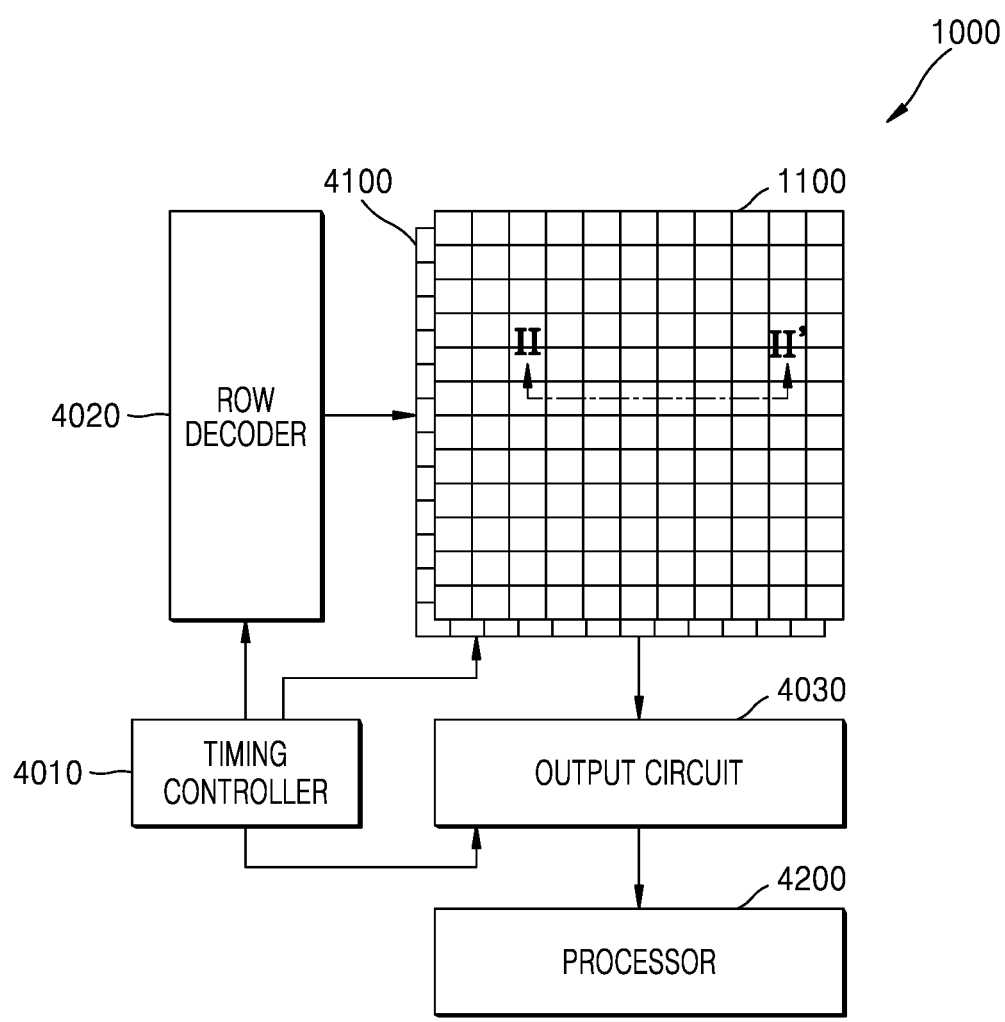
FIG. 1 is a block diagram of an image sensor according to example embodiments.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. In the following drawings, like reference numerals refer to like elements. The size of each constituent element illustrated in the drawings may be exaggerated for convenience of explanation and clarity. In the above, although example embodiments have been described, these are merely exemplary, and those skilled in the art to which the present disclosure pertains could make various modifications and changes from these descriptions.

When a constituent element is disposed "above" or "on" to another constituent element, the constituent element may include not only an element directly contacting on the upper/lower/left/right sides of the other constituent element, but also an element disposed above/under/left/right the other constituent element in a non-contact manner. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps.

Furthermore, terms such as "to portion," "to unit," "to module," and "to block" stated in the specification may signify a unit to process at least one function or operation and the unit may be embodied by hardware, software, or a combination of hardware and software.

Furthermore, the connecting lines, or connectors shown in the various figures presented are intended to represent functional relationships and/or physical or logical couplings between the various elements.

The use of any and all examples, or language (e.g., "such as") provided herein, is intended merely to better illuminate the disclosure and does not pose a limitation on the scope of the disclosure unless otherwise claimed.

FIG. 1 is a schematic block diagram of an image sensor 1000 according to an example embodiment.

Referring to FIG. 1, the image sensor 1000 may include a spectral filter 1100, a pixel array 4100, a timing controller 4010, a row decoder 4020, an output circuit 4030, and a processor 4200. The image sensor may include a charge coupled device (CCD) image sensor or a complementary metal oxide semiconductor (CMOS) image sensor, but the disclosure is not limited thereto.

The spectral filter 1100 may include a plurality of unit filters that transmit light of different wavelength ranges and are arranged in two dimensions. The pixel array 4100 may include a plurality of pixels that detect light of different wavelengths that transmitted through the unit filters. In detail, the pixel array 4100 may include pixels arranged in two dimensions along a plurality of rows and columns. The row decoder 4020 may select one of the rows of the pixel array 4100 based on a row address signal output from the timing controller 4010. The output circuit 4030 may output a light detection signal in units of columns from the pixels arranged in a selected row. To this end, the output circuit 4030 may include a column decoder and an analog-to-digital converter (ADC). For example, the output circuit 4030 may include a plurality of ADCs arranged for each column between the column decoder and the pixel array 4100, or a single ADC arranged at an output end of the column decoder. The timing controller 4010, the row decoder 4020, and the output circuit 4030 may be implemented by a single chip or separate chips. An image signal output through the output circuit 4030 may be processed by the processor 4200. An image processing method performed by the processor 4200 will be described later. The processor 4200 may also be implemented by a single chip with the timing controller 4010, the row decoder 4020, and the output circuit 4030. The pixel array 4100 may include a plurality of pixels that detect light of different wavelengths, and the pixels may be arranged in various methods.

Figure 2:
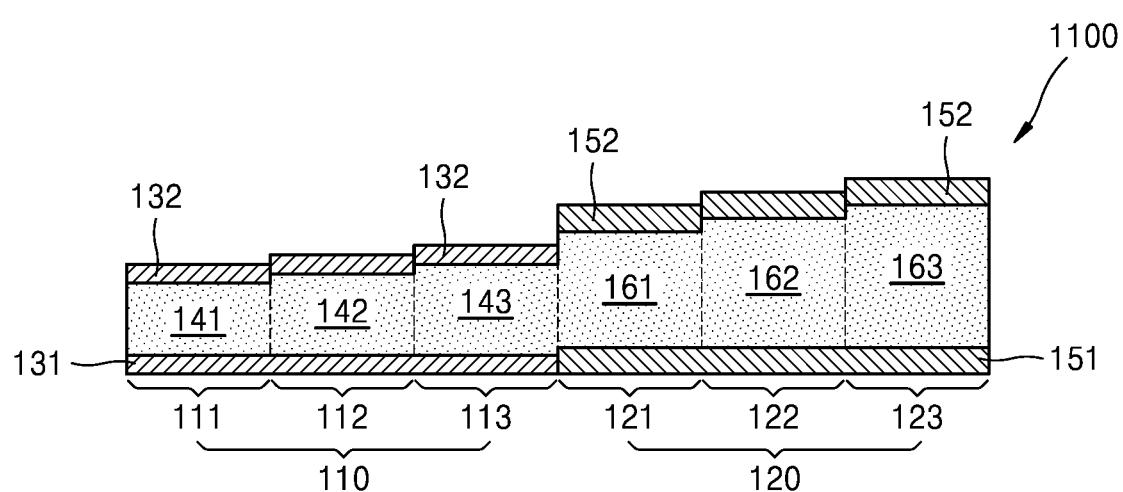
FIG. 2 is a schematic cross-sectional view of a spectral filter taken along line II-II' of FIG. 1.

In the following description, the spectral filter 1100 of the image sensor 1000 is described in detail. FIG. 2 is a cross-sectional view of the spectral filter taken along line II-II' shown in FIG. 1.

Referring to FIGS. 1 and 2, the spectral filter 1100 may include a plurality of unit filters arranged in two dimensions. FIG. 2 illustrates an example of cross-sections of six unit filters 111, 112, 113, 121, 122, and 123.

The spectral filter 1100 may include first and second filter arrays 110 and 120 arranged on a plane. Although the first and second filter arrays 110 and 120 may be arranged on substantially the same plane, the disclosure is not limited thereto. As such, according to another example embodiment, the first and second filter arrays 110 and 120 may be arranged on different planes. The first filter array 110 may include at least one unit filter having a center wavelength in a first wavelength range. The first wavelength range may be a range of, for example, about 250 nm to about 600 nm. However, this is merely exemplary, and the first wavelength range may also be various wavelength ranges according to a design condition. FIG. 2 illustrates a case in which the first filter array 110 includes first, second, and third unit filter 111, 112, and 113.

The second filter array 120 may include at least one unit filter having a center wavelength in a second wavelength range. The second wavelength range may be longer than the first wavelength range. For example, the second wavelength range may be a range of about 600 nm to about 1100 nm. However, this is merely exemplary, and the second wavelength range may also be various wavelength ranges according to a design condition. FIG. 2 illustrates a case in which the second filter array 120 includes the fourth, fifth, and sixth unit filters 121, 122, and 123.

Although FIG. 2 illustrates a case in which each of the first and second filter arrays 110 and 120 includes three unit filters 111, 112, and 113, and 121, 122, and 123, this is merely exemplary, and the number of unit filters constituting each of the first and second filter arrays 110 and 120 may be variously changed.

Each of the first, second, and third unit filters 111, 112, and 113 constituting the first filter array 110 may transmit light having a specific center wavelength in the first wavelength range, and have a Fabry-Perot structure in which cavities 141, 142, and 143 are provided between two first metal reflective layers 131 and 132 spaced apart from each other.

When light is incident on the cavities 141, 142, and 143 by transmitting through the first metal reflective layers 131 and 132, the light may reciprocate between the first metal reflective layers 131 and 132 inside the cavities 141, 142, and 143, during which a constructive interference and a destructive interference occur. Light having a specific center wavelength and satisfying a constructive interference condition may exit to the outside of each of the first, second, and third unit filters 111, 112, and 113. The wavelength band and the center wavelength of the light passing through the first, second, and third unit filters 113 may be determined according to a reflection band of the first metal reflective layers 131 and 132 and the characteristics of the cavities 141, 142, and 143.

The first metal reflective layers 131 and 132 may include a first metal capable of reflecting light in the first wavelength range. For example, the first metal may include Al, Ag, Au, TiN, or the like. However, the disclosure is not limited thereto. In an example embodiment, the first metal reflective layers 131 and 132 may have a thickness of tens of nanometers. However, the disclosure is not limited to this example embodiment. As such, according to another example embodiment, the first metal reflective layers 131 and 132 may have a thickness of about 10 nm to about 30 nm.

The cavities 141, 142, and 143 provided between the first metal reflective layers 131 and 132, as resonance layers, may include a dielectric material having a certain refractive index. For example, the cavities 141, 142, and 143 may include silicon, a silicon oxide, a silicon nitride, a hafnium oxide, or a titanium oxide. However, the disclosure is not limited thereto.

The first, second, and third unit filters 111, 112, and 113 may have different center wavelengths in the first wavelength range. To this end, the first, second, and third unit filters 111, 112, and 113 may respectively include the first, second, and third cavities 141, 142, and 143 having different thicknesses. FIG. 2 illustrates a case in which the second cavity 142 is thicker than the first cavity 141, and the third cavity 143 is thicker than the second cavity 142. In this case, among the first, second, and third unit filters 111, 112, and 113, the third unit filter 113 may have the longest center wavelength, and the first unit filter 111 may have the shortest center wavelength. Furthermore, some unit filters may have a plurality of center wavelengths according to the thickness of a cavity.

Each of the fourth, fifth, and sixth unit filters 121, 122, and 123 constituting the second filter array 120 may transmit light having a specific center wavelength in the second wavelength range, and may have a Fabry-Perot structure in which cavities 161, 162, and 163 are provided between two second metal reflective layers 151 and 152 spaced apart from each other. The wavelength band and the center wavelength of the light passing through the fourth, fifth, and sixth unit filters 121, 122, and 123 may be determined according to a reflection band of the second metal reflective layers 151 and 152 and the characteristics of the cavities 161, 162, and 163.

The second metal reflective layers 151 and 152 may include a second metal capable of reflecting light in the second wavelength range. For example, the second metal may include Cu, Ag, Au, TiN, or the like. However, the disclosure is not limited thereto. The second metal reflective layer may have a thickness of tens of nanometers, but this is merely exemplary. In a detailed example, the second metal reflective layers 151 and 152 may have a thickness of about 40 nm to about 50 nm.

The second metal constituting the second metal reflective layers 151 and 152 may be a metal different from the first metal constituting the above-described first metal reflective layers 131 and 132. For example, when the first metal reflective layers 131 and 132 include Al, the second metal reflective layers 151 and 152 may include Cu. Furthermore, for example, when the first metal reflective layers 131 and 132 include Al, the second metal reflective layers 151 and 152 may include Ag. Furthermore, for example, when the first metal reflective layers 131 and 132 include Ag, the second metal reflective layers 151 and 152 may include Cu.

The cavities 161, 162, and 163 provided between the second metal reflective layers 151 and 152, as resonance layers, may include a dielectric material having a certain refractive index. For example, the cavities 161, 162, and 163 may include silicon, a silicon oxide, a silicon nitride, a hafnium oxide, or a titanium oxide.

The cavities 161, 162, and 163 provided between the second metal reflective layers 151 and 152 may include the same material as the cavities 141, 142, and 143 provided between the first metal reflective layers 131 and 132. In this case, the thicknesses of the cavities 161, 162, and 163 provided between the second metal reflective layers 151 and 152 may be different from the thicknesses of the cavities 141, 142, and 143 provided between the first metal reflective layers 131 and 132. The cavities 161, 162, and 163 provided between the second metal reflective layers 151 and 152 may include a material different from the cavities 141, 142, and 143 provided between the first metal reflective layers 131 and 132.

The fourth, fifth, and sixth unit filters 121, 122, and 123 may have different center wavelengths in the second wavelength range. To this end, the fourth, fifth, and sixth unit filters 121, 122, and 123 may include the fourth, fifth, and sixth cavities 161, 162, and 163 having different thicknesses. FIG. 2 illustrates a case in which the fifth cavity 162 is thicker than the fourth cavity 161, and the sixth cavity 163 is thicker than the fifth cavity 162. In this case, among the fourth, fifth, and sixth unit filters 121, 122, and 123, the sixth unit filter 123 may have the longest center wavelength, and the fourth unit filter 121 may have the shortest center wavelength. Furthermore, some unit filters may have a plurality of center wavelengths according to the thickness of a cavity.

As described above, as the first filter array 110 in which the cavities 141, 142, and 143 are provided between the first metal reflective layers 131 and 132 and the second filter array 120 in which the cavities 161, 162, and 163 are provided between the second metal reflective layers 151 and 152 are arranged on a plane, a spectral filter having the characteristics of a broadband including the first wavelength range and the second wavelength range, for example, a wavelength range from ultraviolet to near infrared, may be implemented.

Figure 3A:
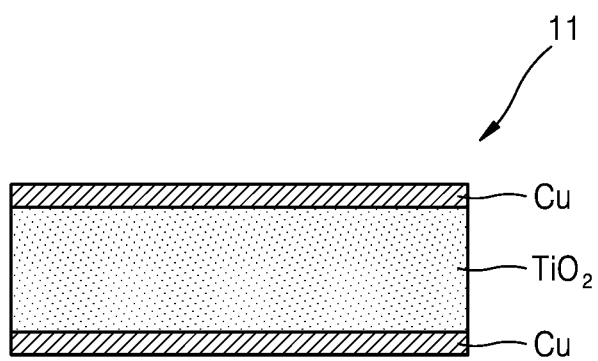
FIG. 3A is a cross-sectional view of a unit filter having a $TiO_2$ cavity between Cu reflective layers.
Figure 3B:
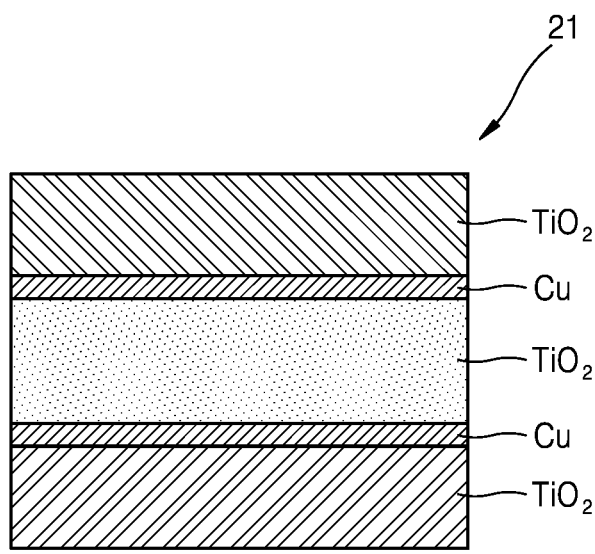
FIG. 3B is a cross-sectional view of a unit filter having a $TiO_2$ dielectric layer in each of upper and lower portions of a structure illustrated in FIG. 3A.

FIG. 3A is a cross-sectional view of a unit filter 11 having a $TiO_2$ cavity between Cu reflective layers. FIG. 3B is a cross-sectional view of a unit filter 21 having a $TiO_2$ dielectric layer in each of upper and lower portions of a structure of FIG. 3A.

Figure 4:
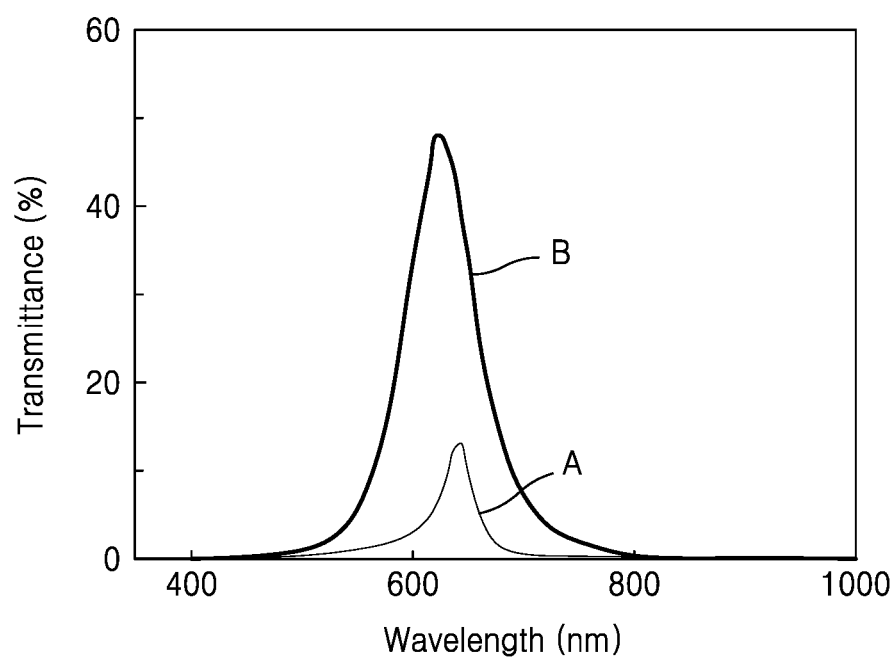
FIG. 4 is a graph of transmittance spectrums of the unit filter of FIG. 3A and the unit filter of FIG. 3B.

FIG. 4 is a graph of transmittance spectrums of the unit filter 11 of FIG. 3A and the unit filter 21 of FIG. 3B. In FIG. 4, "A" denotes a transmittance spectrum of the unit filter 11 of FIG. 3A, and "B" denotes a transmittance spectrum of the unit filter 21 of FIG. 3B. Referring to FIG. 4, it may be seen that the unit filter 21 of FIG. 3B has a higher transmittance than the unit filter 11 of FIG. 3A.

As such, the unit filter 21 with an improved transmittance may be implemented by further providing the TiO$_2$ dielectric layer in each of the upper and lower portions of the structure having the TiO$_2$ cavity between the Cu reflective layers. The thickness of the TiO$_2$ dielectric layer may be adjusted according to the center wavelength of the unit filter 21.

Figure 5:
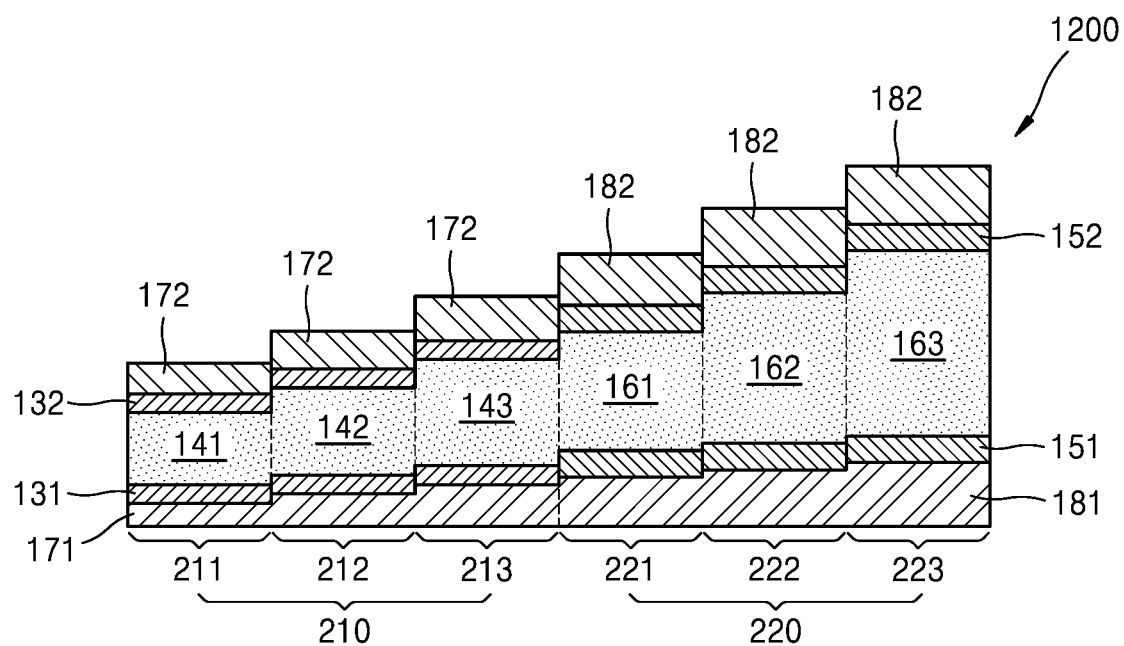
FIG. 5 is a schematic cross-sectional view of a spectral filter according to another example embodiment.

FIG. 5 is a schematic cross-sectional view of a spectral filter 1200 according to another example embodiment.

Referring to FIG. 5, a first filter array 210 may include first, second, and third unit filters 211, 212, and 213 having center wavelengths in the first wavelength range. A second filter array 220 may include fourth, fifth, and sixth unit filters 221, 222, and 223 having center wavelengths in the second wavelength range.

Each of the first, second, and third unit filters 211, 212, and 213 constituting the first filter array 210 may include the two first metal reflective layers 131 and 132 provided spaced apart from each other, the cavities 141, 142, and 143 provided between the first metal reflective layers 131 and 132, and first dielectric layer 171 provided below each of the cavities 141, 142, and 143 and second dielectric layer 172 provided above each of the cavities 141, 142, and 143. The first, second, and third unit filters 211, 212, and 213 may include the first, second, and third cavities 141, 142, and 143 having different thicknesses, and as such, the first, second, and third unit filters 211, 212, and 213 may have different center wavelengths in the first wavelength range. The first metal reflective layers 131 and 132 and the first, second, and third cavities 141, 142, and 143 are as described above.

The first dielectric layer 171 may be provided below the first reflective metal layer 131, and the second dielectric layer 172 may be provided above the first metal reflective layer 132. The first and second dielectric layers 171 and 172 may improve transmittance of the first, second, and third unit filters 211, 212, and 213. The first and second dielectric layers 171 and 172 may have a single layer structure. Each of the first and second dielectric layers 171 and 172 may include, for example, a titanium oxide, a silicon nitride, a hafnium oxide, a silicon oxide, a high index polymer, and the like. However, this is merely exemplary.

The thicknesses of the first and second dielectric layers 171 and 172 may be changed according to the center wavelengths of the first, second, and third unit filters 211, 212, and 213. FIG. 5 illustrates a case in which the thicknesses of the first and second dielectric layers 171 and 172 increase as the center wavelengths of the first, second, and third unit filters 211, 212, and 213 increase. Although the thickness of each of the first and second dielectric layers 171 and 172 may be about 10 nm to about 20000 nm, the disclosure is not limited thereto.

Each of the fourth, fifth, and sixth unit filters 221, 222, and 223 constituting the second filter array 220 may include the two second metal reflective layers 151 and 152 provided spaced apart from each other, the cavities 161, 162, and 163 provided between the second metal reflective layers 151 and 152, and third and fourth dielectric layers 181 and 182 respectively provided below and above each of the cavities 161, 162, and 163. The fourth, fifth, and sixth unit filters 221, 222, and 223 may include the fourth, fifth, and sixth cavities 161, 162, and 163 having different thicknesses, to have different center wavelengths in the second wavelength range. The second metal reflective layers 151 and 152 and the fourth, fifth, and sixth cavities 161, 162, and 163 are as described above.

The third dielectric layer 181 may be provided below the second metal reflective layer 151, and the fourth dielectric layer 182 may be provided above the second metal reflective layer 152. The third and fourth dielectric layers 181 and 182 may improve transmittance of the fourth, fifth, and sixth unit filters 221, 222, and 223. The third and fourth dielectric layers 181 and 182 may have a single layer structure. Each of the third and fourth dielectric layers 181 and 182 may include, for example, a titanium oxide, a silicon nitride, a hafnium oxide, a silicon oxide, a high index polymer, and the like, like the above-described first and second dielectric layers 171 and 172, but the disclosure is not limited thereto.

The thicknesses of the third and fourth dielectric layers 181 and 182 may be changed according to the center wavelengths of the fourth, fifth, and sixth unit filters 221, 222, and 223. FIG. 5 illustrates a case in which the thickness of the third and fourth dielectric layers 181 and 182 increase as the center wavelengths of the fourth, fifth, and sixth unit filters 221, 222, and 223 increase. Although the thickness of each of the third and fourth dielectric layers 181 and 182 may be about 10 nm to about 20000 nm, the disclosure is not limited thereto.

Figure 6:
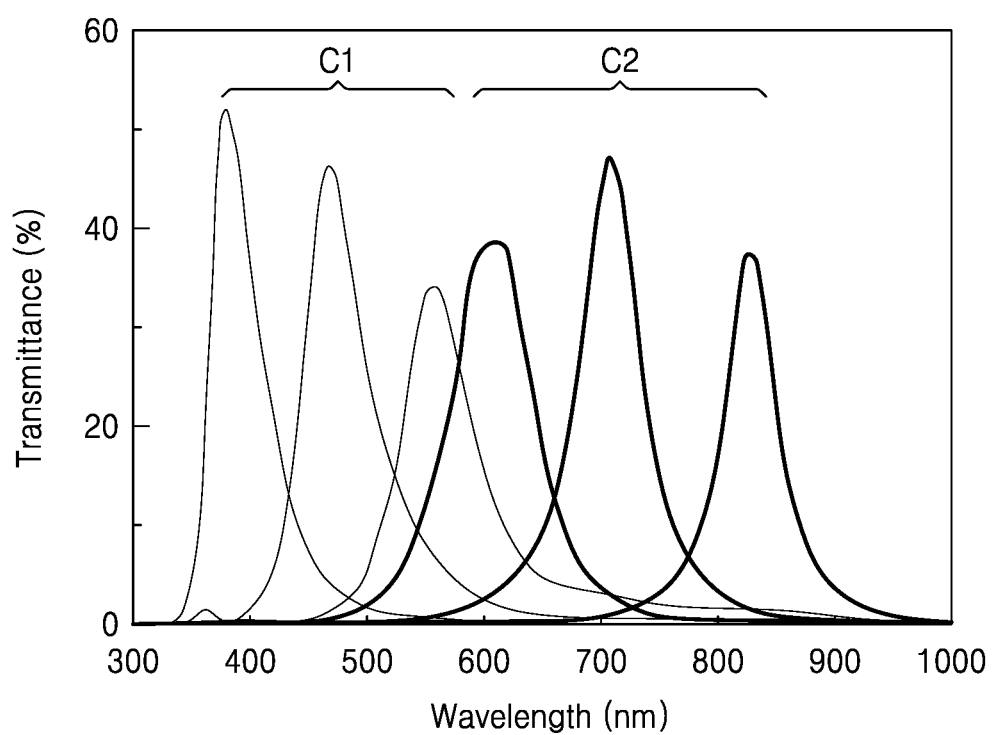
FIG. 6 is a graph of transmittance spectrums of the spectral filter of FIG. 5.

FIG. 6 is a graph of transmittance spectrums of the spectral filter 1200 of FIG. 5. The first metal reflective layers 131 and 132 include Al and the second metal reflective layers 151 and 152 include Cu, and the first to sixth cavities 141, 142, 143, 161, 162, and 163 include TiO$_2$. The first, second, third, and fourth dielectric layers 171, 172, 181, and 182 all include TiO$_2$. In FIG. 6, "C1" denotes a transmittance spectrum of the first filter array 210, and "C2" denotes a transmittance spectrum of the second filter array 220.

Figure 7:
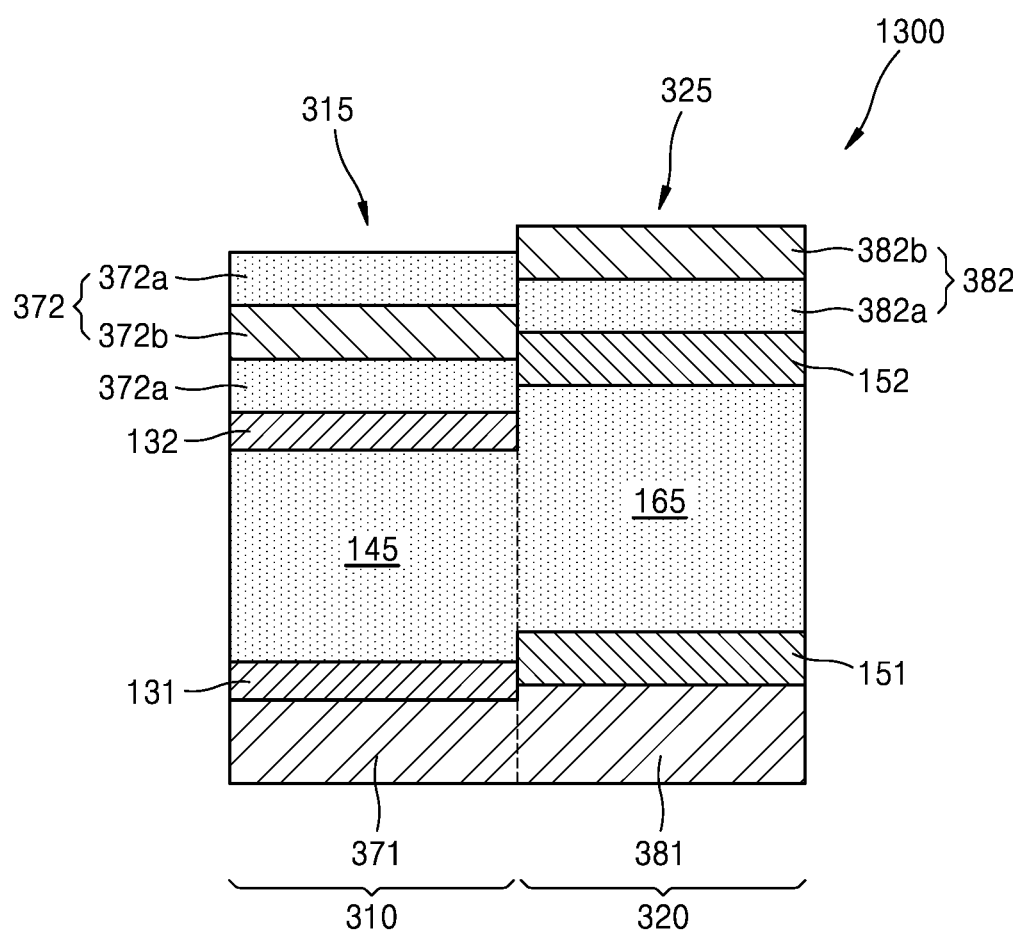
FIG. 7 is a schematic cross-sectional view of a spectral filter according to another example embodiment.

FIG. 7 is a schematic cross-sectional view of a spectral filter 1300 according to another example embodiment.

Referring to FIG. 7, a first filter array 310 may include at least one unit filter having a center wavelength in a first wavelength range. A second filter array 320 may include at least one unit filter having a center wavelength in a second wavelength range.

FIG. 7 illustrates a case in which the first filter array 310 includes one unit filter (a first unit filter 315), and the second filter array 320 includes one unit filter (a second unit filter 325). However, one first unit filter and one second unit filter were merely shown for convenience of explanation, and as such, when each of the first and second filter arrays 310 and 320 includes a plurality of unit filters, the unit filters may include cavities of different thicknesses.

The first unit filter 315 constituting the first filter array 310 may include the two first metal reflective layers 131 and 132 arranged spaced apart from each other, a first cavity 145 provided between the first metal reflective layers 131 and 132, and first and second dielectric layers 371 and 372 respectively provided below and above the first cavity 145.

The first dielectric layer 371 may be provided below the first metal reflective layer 131, and the second dielectric layer 372 may be provided above the first metal reflective layer 132. Each of the first and second dielectric layers 371 and 372 may include a titanium oxide, a silicon nitride, a hafnium oxide, a silicon oxide, a high index polymer, and the like, but the disclosure is not limited thereto.

The first dielectric layer 371 may have a single layer structure. However, the disclosure is not limited thereto, and the first dielectric layer 371 may have a multi-layer structure. The second dielectric layer 372 may have a multi-layer structure. For example the second dielectric layer 372 may have a structure in which the first and second material layers 372a and 372b different from each other are alternately stacked. The thickness and number of material layers constituting the second dielectric layer 372 may be adjusted according to the center wavelength of the first unit filter 315.

The second dielectric layer 372 may include three or more material layers different from one another.

The second unit filter 325 constituting the second filter array 320 may include the second metal reflective layers 151 and 152 arranged spaced apart from each other, a second cavity 165 provided between the second metal reflective layers 151 and 152, and third and fourth dielectric layers 381 and 382 respectively provided below and above the second cavity 165.

The third dielectric layer 381 may be provided below the second metal reflective layer 151, and the fourth dielectric layer 382 may be provided above the second metal reflective layer 152. The third and fourth dielectric layers 381 and 382 may include a titanium oxide, a silicon nitride, a hafnium oxide, a silicon oxide, a high index polymer, and the like, like the first and second dielectric layers 371 and 372, but the disclosure is not limited thereto.

The third dielectric layer 381 may have a single layer structure or a multi-layer structure. The fourth dielectric layer 382 may have a multi-layer structure. For example, the fourth dielectric layer 382 may have a structure in which first and second material layers 382a and 382b different from each other are alternately stacked. The thickness and number of material layers constituting the fourth dielectric layer 382 may be adjusted according to the center wavelength of the second unit filter 325. The fourth dielectric layer 382 may include three or more material layers different from one another.

Figure 8:
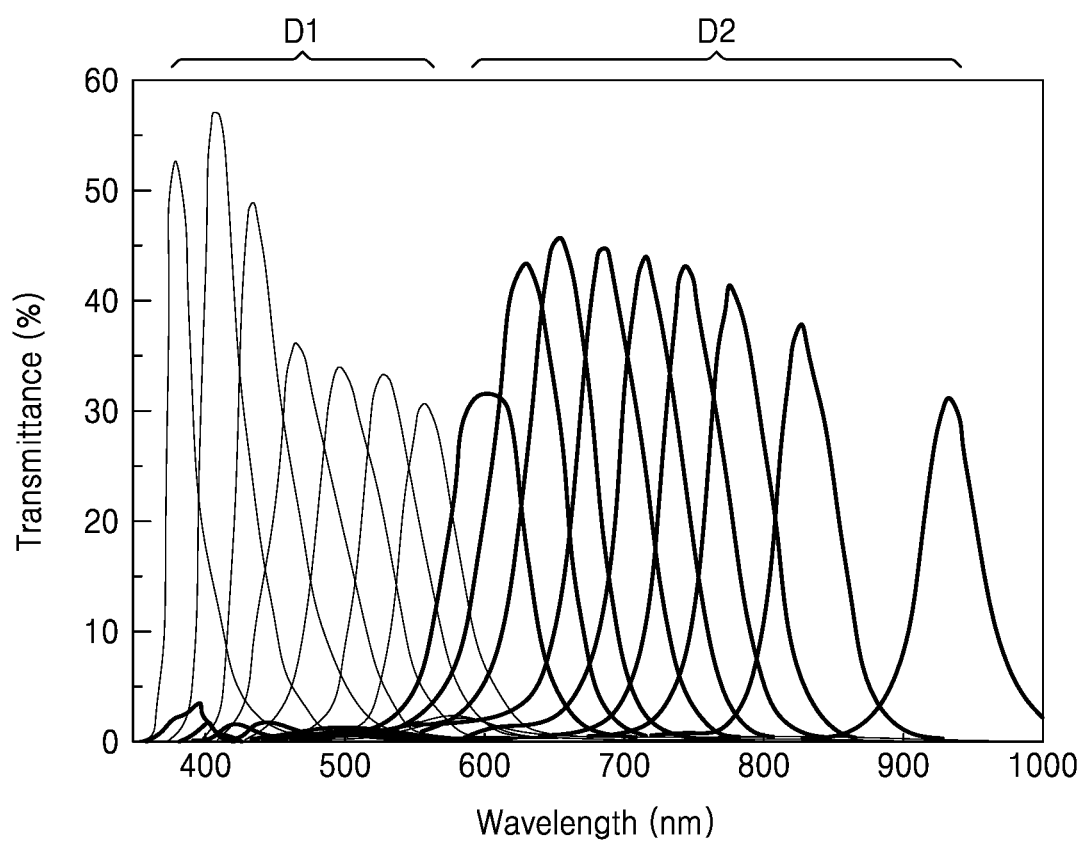
FIG. 8 illustrates transmittance spectrums of the spectral filter of FIG. 7.

FIG. 8 is a graph of transmittance spectrums of the spectral filter 1300 of FIG. 7. FIG. 8 illustrates transmittance spectrums in a case in which, in the spectral filter 1300 of FIG. 7, the first filter array 310 includes seven unit filters having different center wavelengths, and the second filter array 320 includes nine unit filters having different center wavelengths.

The first metal reflective layers 131 and 132 include Al, and the second metal reflective layers 151 and 152 include Cu, and each of the first and second cavities 145 and 165 include a multi-layer film of $TiO_2$ and SiN. Each of the first and third dielectric layers 371 and 381 include SiN, and each of the second and fourth dielectric layers 372 and 382 may include a multi-layer film of $TiO_2$ and SiN. In FIG. 8, "D1" denotes a transmittance spectrum of the first filter array 310, and "D2" denotes a transmittance spectrum of the second filter array 320. Referring to FIG. 8, it may be seen than the spectral filter 1300 implements broadband characteristics and high transmittance.

Figure 9:
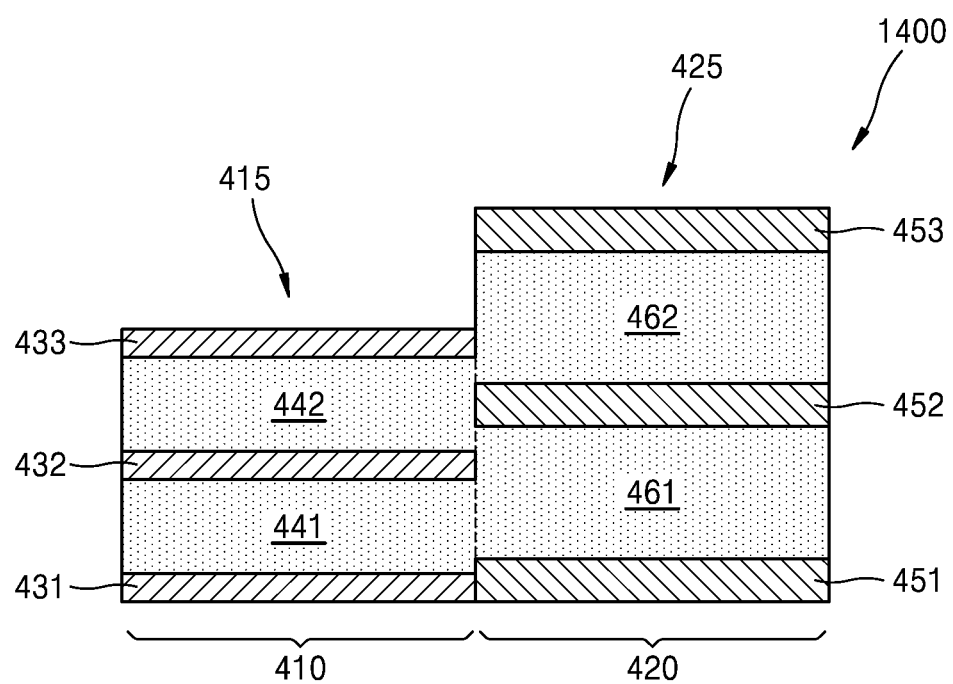
FIG. 9 is a schematic cross-sectional view of a spectral filter according to another example embodiment.

FIG. 9 is a schematic cross-sectional view of a spectral filter 1400 according to an example embodiment. FIG. 9 illustrates a case in which, for convenience of explanation, a first filter array 410 includes one unit filter (a first unit filter 415), and a second filter array 420 includes one unit filter (a second unit filter 425).

The first unit filter 415 constituting the first filter array 410 may include three first metal reflective layers 431, 432, and 433 arranged spaced apart from one another, and two first cavities 441 and 442 provided between the first metal reflective layers 431, 432, and 433.

Each of the first metal reflective layers 431, 432, and 433 may include a first metal capable of reflecting light in a first wavelength range. Each of the first cavities 441 and 442 may include, for example, a dielectric material such as silicon, a silicon oxide, a silicon nitride, a hafnium oxide, a titanium oxide, and the like.

The second unit filter 425 constituting the second filter array 420 may include three second metal reflective layers 451, 452, and 453 arranged spaced apart from one another, and two second cavities 461 and 462 provided between the second metal reflective layers 451, 452, and 453.

Each of the second metal reflective layers 451, 452, and 453 may include a second metal capable of reflecting light in a second wavelength range. Each of the second cavities 461 and 462 may include, for example, a dielectric material such as silicon, a silicon oxide, a silicon nitride, a hafnium oxide, a titanium oxide, and the like.

Although each of the first and second unit filters 415 and 425 is as described above as including two cavities (441 and 442, and 461 and 462), each of the first and second unit filters 415 and 425 may include three or more cavities. Furthermore, although both of the first and second unit filters 415 and 425 are as described above as including a multi-cavity structure, one of the first and second unit filters 415 and 425 may have a single cavity structure and the other may have a multi-cavity structure.

Figure 10:
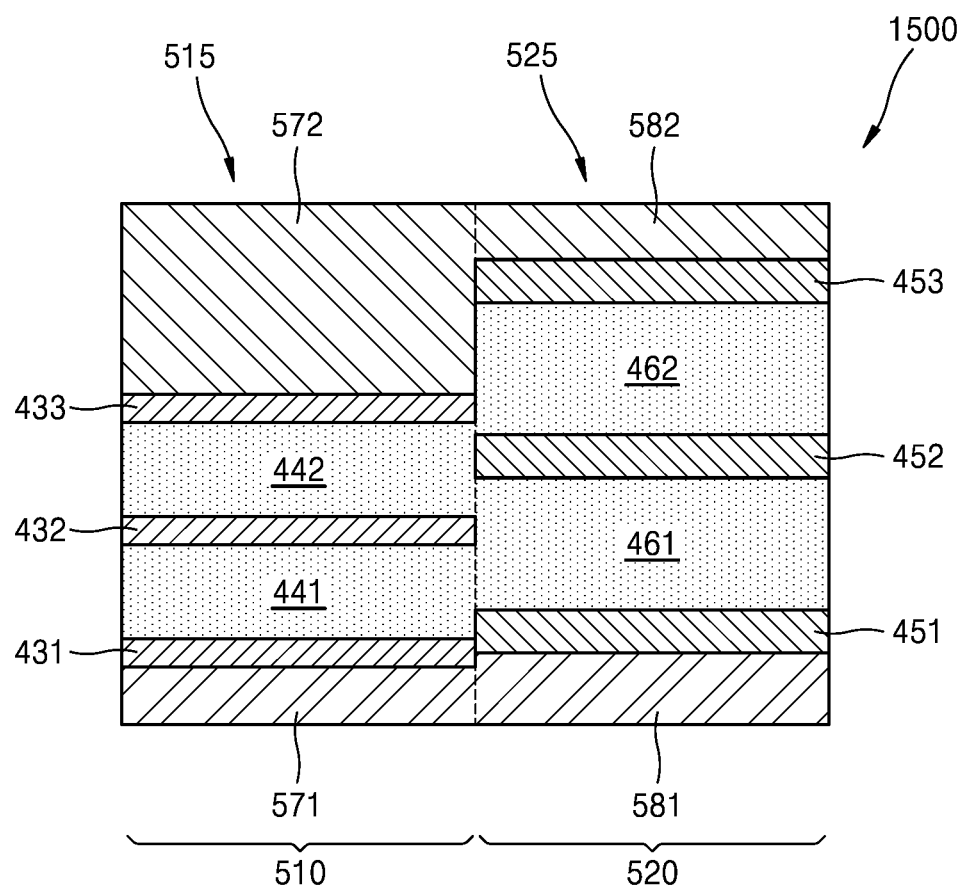
FIG. 10 is a schematic cross-sectional view of a spectral filter according to another example embodiment.

FIG. 10 is a schematic cross-sectional view of a spectral filter 1500 according to another example embodiment. FIG. 10 illustrates a case in which, for convenience of explanation, a first filter array 510 includes one unit filter (a first unit filter 515), and a second filter array 520 includes one unit filter (a second unit filter 525).

Referring to FIG. 10, the first unit filter 515 constituting the first filter array 510 may include the first metal reflective layers 431, 432, and 433 arranged spaced apart from one another, the first cavities 441 and 442 provided between the first metal reflective layers 431, 432, and 433, and first and second dielectric layers 571 and 572 respectively provided below and above the first cavities 441 and 442. The first metal reflective layers 431, 432, and 433 and the first cavities 441 and 442 are as described above.

The first dielectric layer 571 may be provided below the first metal reflective layer 431, and the second dielectric layer 572 may be provided above the first metal reflective layer 433. The first and second dielectric layers 571 and 572 are to improve transmittance, and may have a single layer or a multi-layer structure. Although each of the first and second dielectric layers 571 and 572 may include, for example, a titanium oxide, a silicon nitride, a hafnium oxide, a silicon oxide, a high index polymer, and the like, the disclosure is not limited thereto.

The second unit filter 525 constituting the second filter array 520 may include the second metal reflective layers 451, 452, and 453 arranged spaced apart from one another, the second cavities 461 and 462 provided between the second metal reflective layers 451, 452, and 453, and third and fourth dielectric layers 581 and 582 respectively provided below and above the second cavities 461 and 462. The second metal reflective layers 451, 452, and 453 and the second cavities 461 and 462 are as described above.

The third dielectric layer 581 may be provided below the second metal reflective layer 451, and the fourth dielectric layer 582 may be provided above the second metal reflective layer 453. Although each of the third and fourth dielectric layers 581 and 582 may have a single layer or a multi-layer structure, and include, for example, a titanium oxide, a silicon nitride, a hafnium oxide, a silicon oxide, a high index polymer, and the like, the disclosure is not limited thereto.

Figure 11:
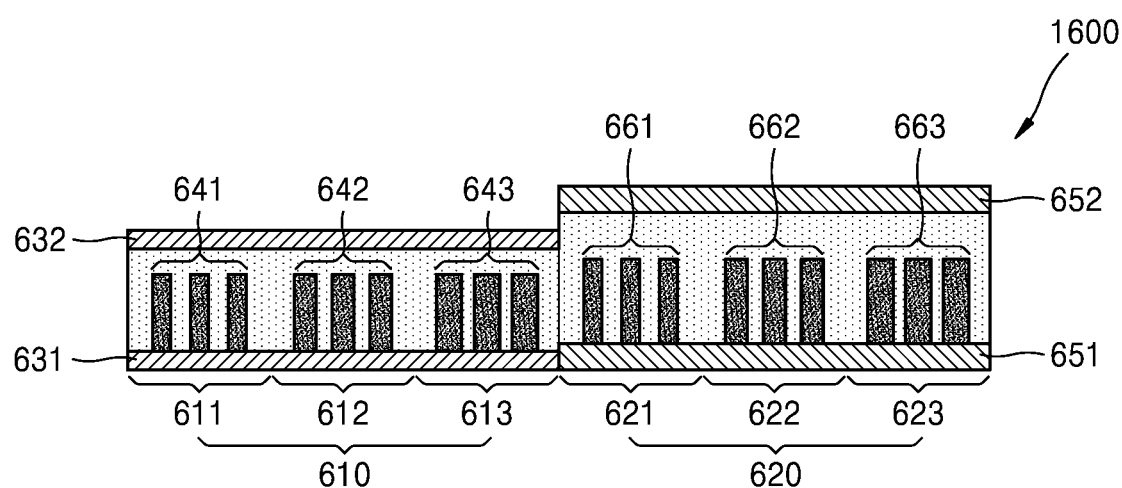
FIG. 11 is a schematic cross-sectional view of a spectral filter according to another example embodiment.

FIG. 11 is a schematic cross-sectional view of a spectral filter 1600 according to another example embodiment.

Referring to FIG. 11, a first filter array 610 may include at least one unit filter having a center wavelength in a first wavelength range, and a second filter array 620 may include at least one unit filter having a center wavelength in a second wavelength range. FIG. 11 illustrates a case in which the first filter array 610 includes first, second, and third unit filters 611, 612, and 613 and the second filter array 620 includes fourth, fifth, and sixth unit filters 621, 622, and 623.

Each of the first, second, and third unit filters 611, 612, and 613 constituting the first filter array 610 may include two first metal reflective layers 631 and 632 provided spaced apart from each other, and the first, second, and third unit filters 611, 612, and 613 may include the first, second, and third cavities 641, 642, and 643 provided between the first metal reflective layers 631 and 632, respectively. As the first metal reflective layers 631 and 632 are as described above, descriptions thereof are omitted.

The first, second, and third unit filters 611, 612, and 613 may have different center wavelengths in the first wavelength range. To this end, the first, second, and third unit filters 611, 612, and 613 may respectively include the first, second, and third cavities 641, 642, and 643 having different effective refractive indexes. Each of the first, second, and third cavities 641, 642, and 643 may include a first material layer and at least one second material layer arranged inside the first material layer and having a refractive index different from the first material layer.

FIG. 11 illustrates a case in which each of the first, second, and third cavities 641, 642, and 643 includes the first material layer and a plurality of second material layers arranged inside the first material layer parallel to each other and perpendicular to the first metal reflective layer 631. Each of the first and second material layers may include, for example, silicon, a silicon oxide, a silicon nitride or a titanium oxide, and the like. In a detailed example, the first material layer may include a silicon oxide, and the second material layer may include a titanium oxide.

In the first, second, and third cavities 641, 642, and 643, an effective refractive index may be changed by adjusting the width of the second material layer. FIG. 11 illustrates a case in which the second material layer has a width gradually increasing from the first cavity 641 to the third cavity 643. In this case, among the first, second, and third cavities 641, 642, and 643, the third cavity 643 may have the highest effective refractive index, and the first cavity 641 may have the lowest effective refractive index. Among the first, second, and third unit filters 611, 612, and 613, the third unit filter 613 may have the longest center wavelength, and the first unit filter 611 may have the shortest center wavelength. Furthermore, some unit filters may have a plurality of center wavelengths according to the thickness or effective refractive index of a cavity.

Although a case of a plurality of second material layers being arranged perpendicular to the first metal reflective layer 631 is described above, the disclosure is not limited thereto, and the second material layers may be arranged parallel to the first metal reflective layer 631.

Each of the fourth, fifth, and sixth unit filters 621, and 622, and 623 constituting the second filter array 620 may include the second metal reflective layers 651 and 652 provided spaced apart from each other and fourth, fifth, and sixth cavities 661, 662, and 663 provided between the second metal reflective layers 651 and 652. As the second material reflective layers 651 and 652 are as described above, descriptions thereof are omitted.

The fourth, fifth, and sixth unit filters 621, 622, and 623 may have different center wavelengths in the second wavelength range. To this end, the fourth, fifth, and sixth unit filters 621, 622, and 623 may respectively include the fourth, fifth, and sixth cavities 661, 662, and 663 having different effective refractive indexes. Each of the fourth, fifth, and sixth cavities 661, 662, and 663 may include a first material layer and at least one second material layer arranged inside the first material layer and having a different refractive index from the first material layer.

FIG. 11 illustrates a case in which each of the fourth, fifth, and sixth cavities 661, 662, and 663 includes the first material layer and a plurality of second material layers arranged inside the first material layer parallel to each other and perpendicular to the second metal reflective layer 651. Each of the first and second material layers may include, for example, silicon, a silicon oxide, a silicon nitride or a titanium oxide, and the like.

In the fourth, fifth, and sixth cavities 661, 662, and 663, an effective refractive index may be changed by adjusting the width of the second material layer. FIG. 11 illustrates a case in which the second material layer has a width gradually increasing from the fourth cavity 661 to the sixth cavity 663. In this case, among the fourth, fifth, and sixth cavities 661, 662, and 663, the sixth cavity 663 may have the highest effective refractive index, and the fourth cavity 661 may have the lowest effective refractive index. Among the fourth, fifth, and sixth unit filters 621, and 622, and 623, the sixth unit filter 623 may have the longest center wavelength, and the fourth unit filter 621 may have the shortest center wavelength. Furthermore, some unit filters may have a plurality of center wavelengths according to the thickness or effective refractive index of a cavity.

A case in which both of the first filter array 610 and the second filter array 620 have a single cavity structure is described as an example. However, both of the first filter array 610 and the second filter array 620 may have a multi-cavity structure. Furthermore, one of the first filter array 610 and the second filter array 620 may have a single cavity structure, and the other may have a multi-cavity structure.

Figure 12:
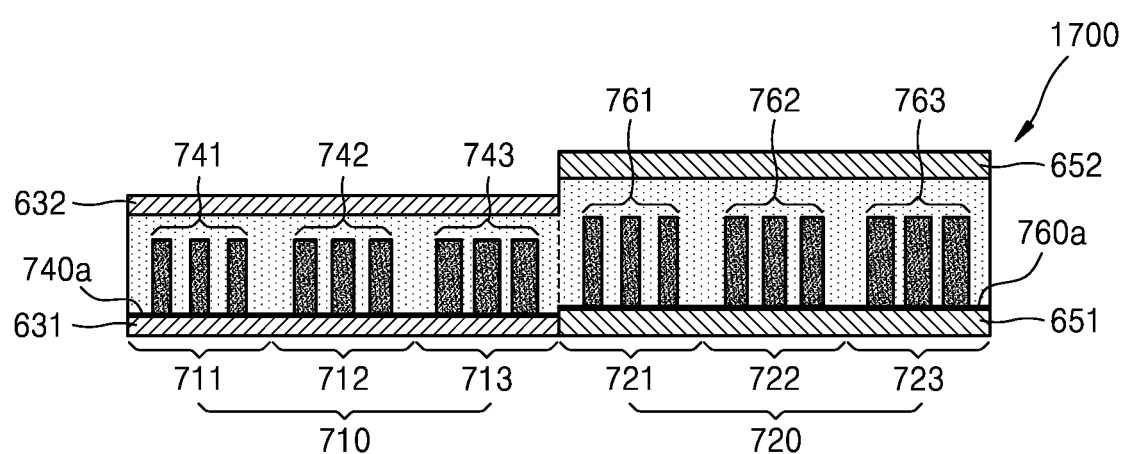
FIG. 12 is a schematic cross-sectional view of a spectral filter according to another example embodiment.

FIG. 12 is a schematic cross-sectional view of a spectral filter 1700 according to another example embodiment. The spectral filter 1700 of FIG. 12 is the same as the spectral filter 1600 of FIG. 11, except that a cavity further includes an etch stop layer.

First, second, and third unit filters 711, 712, and 713 constituting a first filter array 710 may include first, second, and third cavities 741, 742, and 743 having different effective refractive indexes. Each of the first, second, and third cavities 741, 742, and 743 may include an etch stop layer 740a provided on the first metal reflective layer 631, a first material layer provided on the etch stop layer 740a, and at least one second material layer arranged inside the first material layer. The etch stop layer 740a may facilitate a patterning process for forming a cavity. Although the etch stop layer 740a may include, for example, a silicon oxide, titanium oxide, or hafnium oxide, and the like, the disclosure is not limited thereto.

Fourth, fifth, and sixth unit filters 721, 722, and 723 constituting the second filter array 720 may respectively include fourth, fifth, and sixth cavities 761, 762, and 763 having different effective refractive indexes. Each of the fourth, fifth, and sixth cavities 761, 762, and 763 may include an etch stop layer 760a provided on the second metal reflective layer 651, a first material layer provided on the etch stop layer 760a, and at least one second material layer arranged inside the first material layer.

Figure 13:
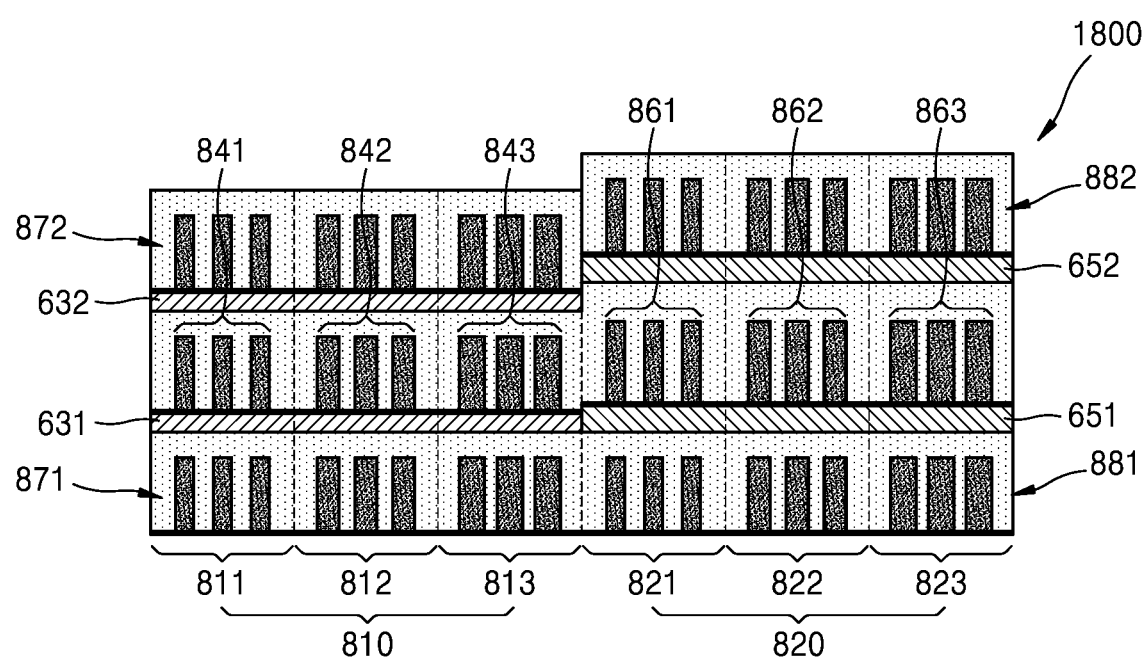
FIG. 13 is a schematic cross-sectional view of a spectral filter according to another example embodiment.

FIG. 13 is a schematic cross-sectional view of a spectral filter 1800 according to another example embodiment. The spectral filter 1800 of FIG. 13 may be substantially the same as the spectral filter 1700 of FIG. 12, except that first and second dielectric layers 871 and 872 are respectively provided lower and upper portions of a first filter array 810, and third and fourth dielectric layers 881 and 882 are respectively provided lower and upper portions of a second filter array 820.

Referring to FIG. 13, first, second, and third unit filters 811, 812, and 813 constituting the first filter array 810 may include the first metal reflective layers 631 and 632 arranged spaced apart from each other, first, second, and third cavities 841, 842, and 843 provided between the first metal reflective layers 631 and 632, and the first and second dielectric layers 871 and 872 respectively provided below and above the first, second, and third cavities 841, 842, and 843. The first, second, and third unit filters 811, 812, and 813 may respectively include the first, second, and third cavities 841, 842, and 843 having different effective refractive indexes, to have different center wavelengths in the first wavelength range.

The first dielectric layer 871 may be provided below the first metal reflective layer 631, and the second dielectric layer 872 may be provided above the first metal reflective layer 632. The first and second dielectric layers 871 and 872 are to improve transmittance of the first, second, and third unit filters 811, 812, and 813.

Each of the first and second dielectric layers 871 and 872 may include a first material layer and at least one second material layer arranged inside the first material layer and having a refractive index different from the first material layer. Each of the first and second material layers may include, for example, a titanium oxide, a silicon nitride, a hafnium oxide, a silicon oxide, a high index polymer, and the like, but the disclosure is not limited thereto. Effective refractive indexes of the first and second dielectric layers 871 and 872 may be adjusted by changing the width of the second material layer according to the center wavelengths of the first, second, and third unit filters 811, 812, and 813. Each of the first and second dielectric layers 871 and 872 may further include an etch stop layer.

Each of fourth, fifth, and sixth unit filters 821, 822, and 823 constituting the second filter array 820 may include the second metal reflective layers 651 and 652 arranged spaced apart from each other, fourth, fifth, and sixth cavities 861, 862, and 863 provided between the second metal reflective layers 651 and 652, and the third and fourth dielectric layers 881 and 882 respectively provided below and above fourth, fifth, and sixth cavities 861, 862, and 863. The fourth, fifth, and sixth unit filters 821, 822, and 823 may respectively include the fourth, fifth, and sixth cavities 861, 862, and 863 having different effective refractive indexes, to have different center wavelengths in the second wavelength range.

The third dielectric layer 881 may be provided below the second metal reflective layer 651, and the fourth dielectric layer 822 may be provided above the second metal reflective layer 652. Each of the third and fourth dielectric layers 881 and 882 may include a first material layer and at least one second material layer arranged inside the first material layer and having a different refractive index from the first material layer. Effective refractive indexes of the third and fourth dielectric layers 881 and 882 may be adjusted by changing the width of the second material layer according to the center wavelengths of the fourth, fifth, and sixth unit filters 821, 822, and 823. Each of the third and fourth dielectric layers 881 and 882 may further include an etch stop layer.

Figure 14:
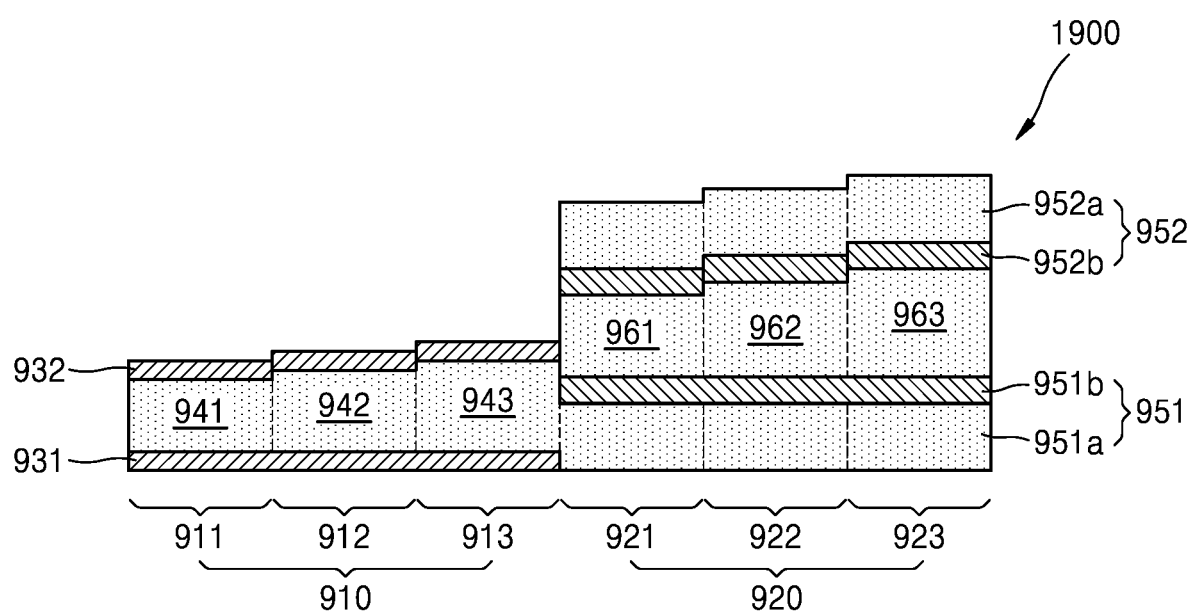
FIG. 14 is a schematic cross-sectional view of a spectral filter according to another example embodiment.

FIG. 14 is a schematic cross-sectional view of a spectral filter 1900 according to another example embodiment.

Referring to FIG. 14, a first filter array 910 may include at least one unit filter having a center wavelength in a first wavelength range, and a second filter array 920 may include at least one unit filter having a center wavelength in a second wavelength range. FIG. 14 illustrates a case in which the first filter array 910 includes first, second, and third unit filters 911, 912, and 913, and the second filter array 920 includes fourth, fifth, and sixth unit filters 921, 922, and 923.

The first wavelength range may be shorter than the second wavelength range. For example, the first wavelength range may be a range of about 250 nm to about 600 nm, and the second wavelength range may be a range of about 600 nm to about 1100 nm. However, this is merely exemplary, and the first and second wavelength ranges may be variously changed according to a design condition. Alternatively, the first wavelength range may be longer than the second wavelength range.

Each of the first, second, and third unit filters 911, 912, and 913 constituting the first filter array 910, which transmits light having a specific center wavelength in the first wavelength range, may have a Fabry-Perot structure in which cavities 941, 942, and 943 are provided between two metal reflective layers 931 and 932 spaced apart from each other.

When light is incident on the first, second, and third cavities 941, 942, and 943 by transmitting through the metal reflective layers 931 and 932, the light may reciprocate between the metal reflective layers 931 and 932 inside the first, second, and third cavities 941, 942, and 943, during which a constructive interference and a destructive interference occur. Light having a specific center wavelength and satisfying a constructive interference condition may exit to the outside of each of the first, second, and third unit filters 911, 912, and 913. The wavelength band and the center wavelength of the light passing through the first, second, and third unit filters 911, 912, and 913 may be determined according to a reflection band of the metal reflective layers 931 and 932 and the characteristics of the first, second, and third cavities 941, 942, and 943.

The metal reflective layers 931 and 932 may include a certain metal capable of reflecting light in the first wavelength range. When the first wavelength range is shorter than the second wavelength range, each of the metal reflective layers 931 and 932 may include, for example, Al, Ag, Au, TiN, and the like. When the first wavelength range is longer than the second wavelength range, the metal reflective layers 931 and 932 may include, for example, Cu, Ag, Au, TiN, and the like. However, this is merely exemplary. Although the metal reflective layers 931 and 932 may have a thickness of tens of nanometers, the disclosure is not limited thereto.

Although the first, second, and third cavities 941, 942, and 943 provided between the metal reflective layers 931 and 932 may include, for example, silicon, a silicon oxide, a silicon nitride, or a titanium oxide, the disclosure is not limited thereto. The first, second, and third unit filters 911, 912, and 913 may have different center wavelengths in the first wavelength range. To this end, the first, second, and third unit filters 911, 912, and 913 may respectively include the first, second, and third cavities 941, 942, and 943 having different thicknesses. Although not illustrated, as the first, second, and third unit filters 911, 912, and 913 include cavities having different effective refractive indexes, the first, second, and third unit filters 911, 912, and 913 may have different center wavelengths.

Each of the fourth, fifth, and sixth unit filters 921, 922, and 923 constituting the second filter array 920, which transmits light having a specific center wavelength in the second wavelength range, may have a Fabry-Perot structure in which the fourth, fifth, and sixth cavities 961, 962, and 963 are provided between two Bragg reflective layers 951 and 952 spaced apart from each other.

When light is incident on the fourth, fifth, and sixth cavities 961, 962, and 963 by transmitting through the Bragg reflective layers 951 and 952, the light may reciprocate between the Bragg reflective layers 951 and 952 inside the fourth, fifth, and sixth cavities 961, 962, and 963, during which a constructive interference and a destructive interference occur. Light having a specific center wavelength and satisfying a constructive interference condition may exit to the outside of each of the fourth, fifth, and sixth unit filters 921, 922, and 923. The wavelength band and the center wavelength of the light passing through the first, second, and third unit filters 911, 912, and 913 may be determined according to a reflection band of the Bragg reflective layers 951 and 952 and the characteristics of the fourth, fifth, and sixth cavities 961, 962, and 963.

The Bragg reflective layers 951 and 952 may include a distributed Bragg reflector (DBR). Each of the Bragg reflective layers 951 and 952 may have a structure in which at least one of first material layers 951a and 952 and at least one of second material layers 951b and 952 having different refractive indexes are alternately stacked. The first material layers 951a and 952a or the second material layers 951b and 952b may include, for example, a silicon oxide, a titanium oxide, a silicon nitride, or silicon. However, this is merely exemplary.

When any one of the first and second material layer 951a and 952a, and 951b and 952b constituting the Bragg reflective layers 951 and 952 includes a material, for example, silicon, and the like, capable of absorbing light in the first wavelength range, that is, light of a short wavelength, the light in the first wavelength range may be prevented from transmitting through the fourth, fifth, and sixth unit filters 921, 922, and 923.

Although the fourth, fifth, and sixth cavities 961, 962, and 963 provided between the Bragg reflective layers 951 and 952 may include, for example, silicon, a silicon oxide, a silicon nitride, a hafnium oxide, or a titanium oxide, the disclosure is not limited thereto.

The fourth, fifth, and sixth unit filters 921, 922, and 923 may have different center wavelengths in the second wavelength range. To this end, the fourth, fifth, and sixth unit filters 921, 922, and 923 may include the fourth, fifth, and sixth cavities 961, 962, and 963 having different thicknesses. Although not illustrated, as the fourth, fifth, and sixth unit filters 921, 922, and 923 include cavities having different effective refractive indexes, the fourth, fifth, and sixth unit filters 921, 922, and 923 may have different center wavelengths.

As described above, as the first filter array 910 in which the first, second, and third cavities 941, 942, and 943 are provided between the metal reflective layers 931 and 932 and the second filter array 920 in which the fourth, fifth, and sixth cavities 961, 962, and 963 are provided between the Bragg reflective layers 951 and 952 are arranged on a plane, a spectral filter having the characteristics of a broadband including the first wavelength range and the second wavelength range may be implemented.

Figure 15:
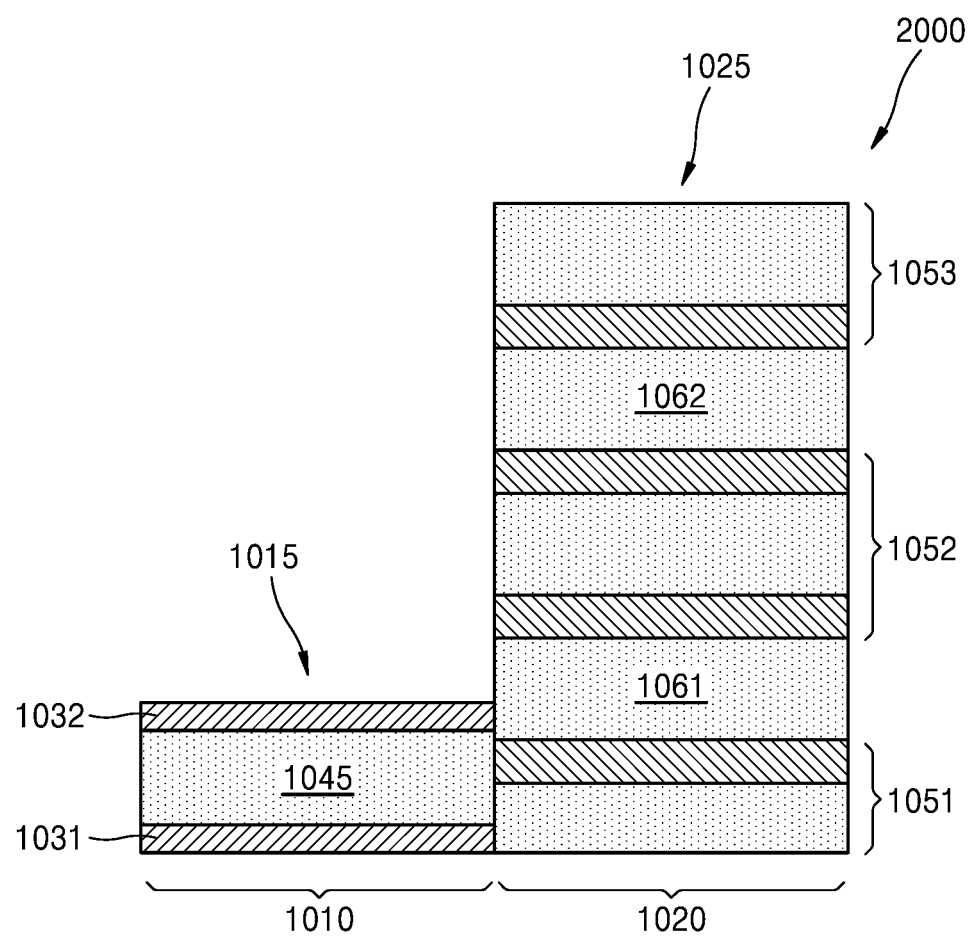
FIG. 15 is a schematic cross-sectional view of a spectral filter according to another example embodiment.

FIG. 15 is a schematic cross-sectional view of a spectral filter 2000 according to another example embodiment. FIG. 15 illustrates a case in which, for convenience of explanation, a first filter array 1010 includes one unit filter (a first unit filter 1015), and a second filter array 1020 includes one unit filter (a second unit filter 1025).

Referring to FIG. 15, the first unit filter 1015 constituting the first filter array 1010 may include two metal reflective layers 1031 and 1032 arranged spaced apart from each other and a first cavity 1045 provided between the metal reflective layers 1031 and 1032. The metal reflective layers 1031 and 1032 and the first cavity 1045 are as described above.

The second unit filter 1025 constituting the second filter array 1020 may have a multi-cavity structure. In detail, the second unit filter 1025 may include three Bragg reflective layers 1051, 1052, and 1053 arranged spaced apart from one another and two second cavities 1061 and 1062 provided between the Bragg reflective layers 1051, 1052, and 1053. The Bragg reflective layers 1051, 1052, and 1053 and the second cavities 1061 and 1062 are as described above. The numbers of first and second material layers constituting each of the Bragg reflective layers 1051, 1052, and 1053 may be variously changed. Although FIG. 15 illustrates a case of the second unit filter 1025 including the second cavities 1061 and 1062, the disclosure is not limited thereto, and the second unit filter 1025 may include three or more cavities.

Figure 16:
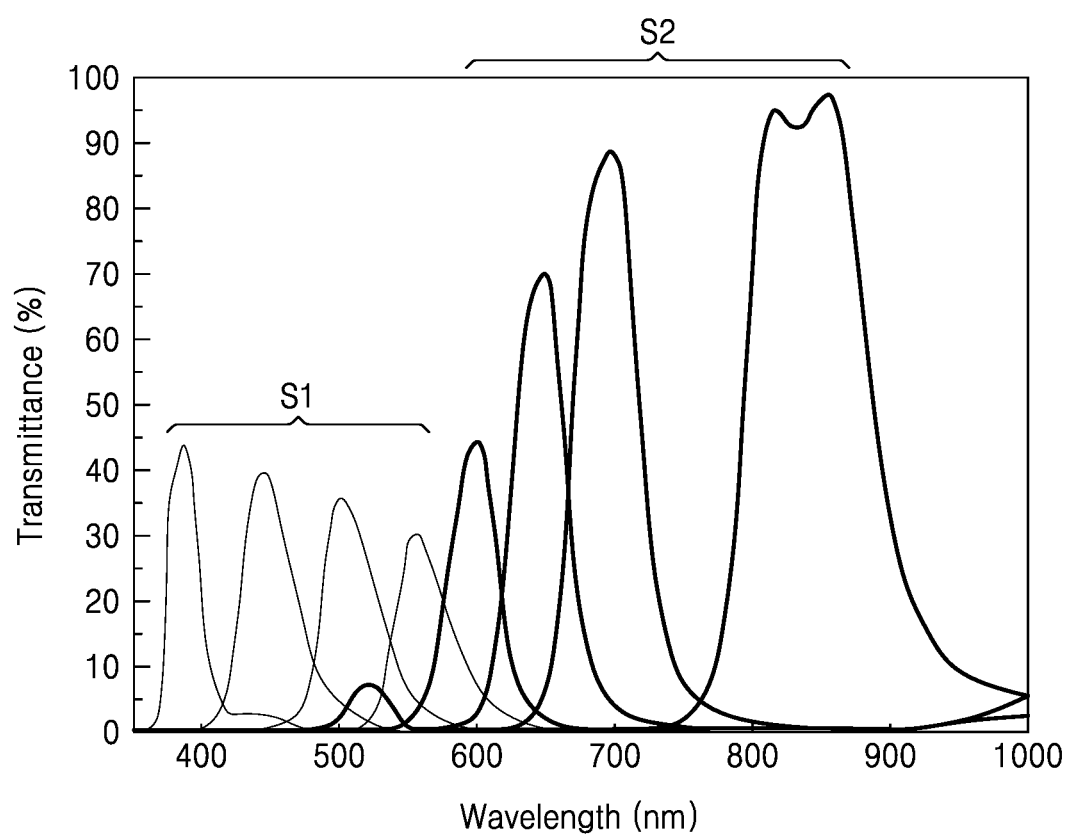
FIG. 16 is a graph of transmittance spectrums of the spectral filter of FIG. 15.

FIG. 16 is a graph of a transmittance spectrums of the spectral filter 2000 of FIG. 15. FIG. 16 shows transmittance spectrums of a case in which, in the spectral filter 2000 of FIG. 15, the first filter array 1010 includes four unit filters having different center wavelengths and the second filter array 1020 includes four unit filters having different center wavelengths.

In the first filter array 1010, the metal reflective layers 1031 and 1032 include Al, and the first cavity 1045 includes a multi-layer film of $TiO_2$ and SiN. In the second filter array 1020, each of the Bragg reflective layers 1051, 1052, and 1053 may include Si and $SiO_2$, and the second cavities 1061 and 1062 include $SiO_2$. In FIG. 16, "S1" indicates a transmittance spectrum of the first filter array 1010, and "S2" indicates a transmittance spectrum of the second filter array 1020.

In the above description, a case in which the first unit filter 1015 has a single cavity structure and the second unit filter 1025 has a multi-cavity structure is described. However, the first unit filter 1015 may have a multi-cavity structure and the second unit filter 1025 may have a single cavity structure. Furthermore, both of the first and second unit filters 1015 and 1025 may have a multi-cavity structure.

Figure 17:
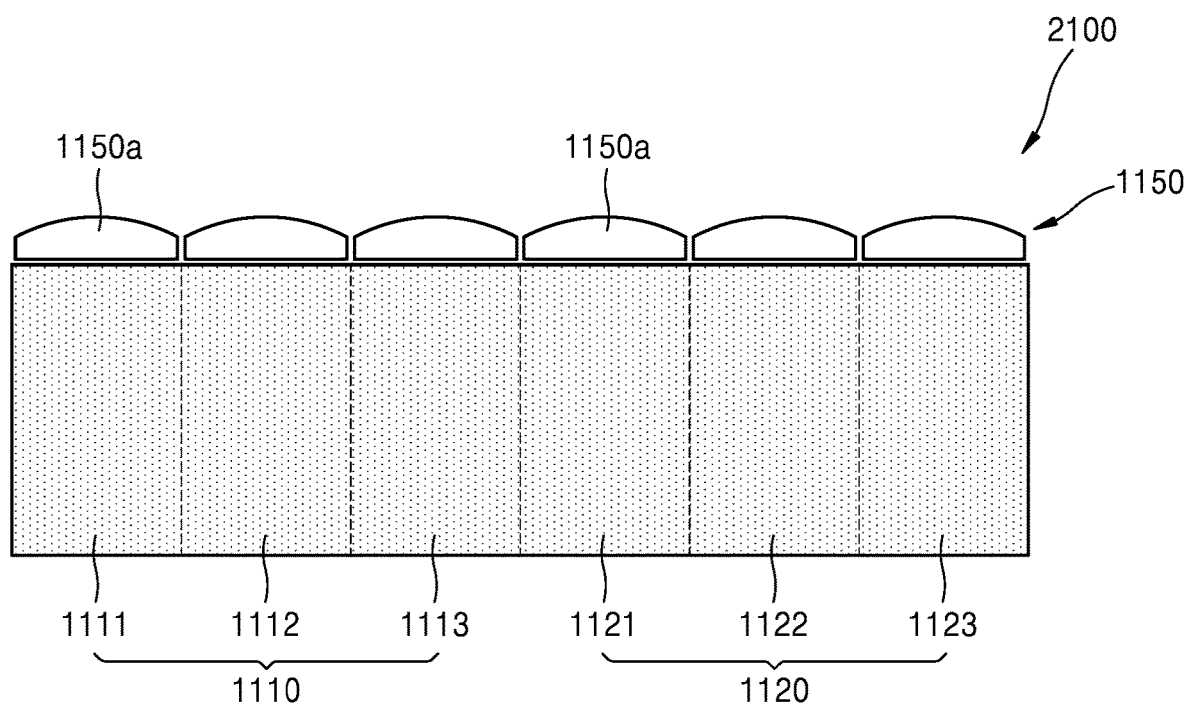
FIG. 17 is a schematic cross-sectional view of a spectral filter according to another example embodiment.

FIG. 17 is a schematic cross-sectional view of a spectral filter 2100 according to another example embodiment.

Referring to FIG. 17, the spectral filter 2100 may include first and second filter arrays 1110 and 1120 and a microlens array 1150 provided on the first and second filter arrays 1110 and 1120. The first filter array 1110 may include first, second, and third unit filters 1111, 1112, and 1113 having center wavelengths in a first wavelength range, and the second filter array 1120 may include fourth, fifth, and sixth unit filters 1121, 1122, and 1123 having center wavelengths in a second wavelength range.

The first filter array 1110 may include any one of the above-described first filter arrays 110 to 1010, and the second filter array 1120 may include any one of the above-described second filter arrays 120 to 1020. The descriptions of the first and second filter arrays 1110 and 1120 are omitted.

The microlens array 1150 having a plurality of microlenses 1150a may be provided above the first and second filter arrays 1110 and 1120. The microlenses 1150a may serve to focus external light to be incident on corresponding unit filters 1111, 1112, 1113, 1121, 1122, and 1123.

FIG. 17 illustrates a case in which the microlenses 1150a are provided to have a one-to-one correspondence to the unit filters 1111, 1112, 1113, 1121, 1122, and 1123. However, this is merely exemplary, and at least two of the unit filters 1111, 1112, 1113, 1121, 1122, and 1123 may be provided corresponding to one microlens 1150a.

The spectral filter according to the example embodiments described above may be provided in the image sensor 1000 (i.e., image sensor in FIG. 1), and the pixel array 4100 of the image sensor 1000 may receive the light transmitted through the spectral filter, convert the light into electric image signals, and output the electric image signals. Furthermore, the image signals output from the pixel array 4100 may be output after being image-processed by the processor 4200. The pixel array 4200 may be provided to correspond to the plurality of unit filters of the spectral filter. The pixel array 4100 may be provided to have a one-to-one correspondence to the plurality of unit filters. However, the disclosure is not limited thereto, and two or more pixels may be provided to correspond to one unit filter.

Figure 18:
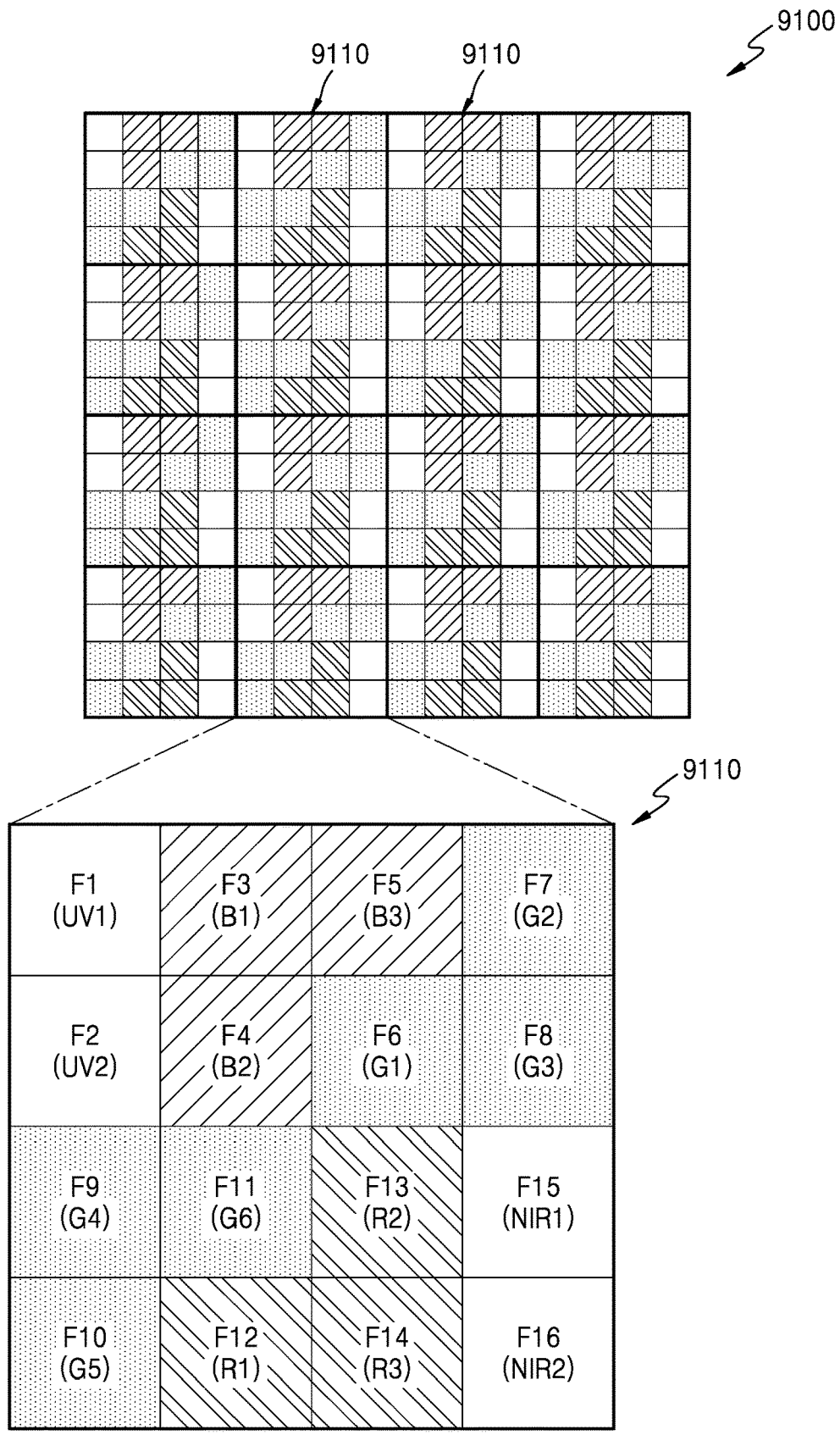
FIG. 18 is a plan view of an example of a spectral filter that is applicable to the image sensor of FIG. 1.

FIG. 18 is a plan view of an example of a spectral filter 9100 that is applicable to the image sensor 1000 of FIG. 1 according to an example embodiment.

Referring to FIG. 18, the spectral filter 9100 may include a plurality of filter groups 9110 arranged in two dimensions. Each of the filter groups 9110 may include sixteen unit filters F1 to F16 arranged in a 4×4 array. However, the disclosure is not limited thereto, and as such, according to another example embodiment, different number filter grounds and different number of unit filters may be provided.

The first and second unit filters F1 and F2 may have center wavelengths UV1 and UV2 in an ultraviolet range, and the third to fifth unit filters F3, F4, and F5 may have center wavelengths B1, B2 and B3 in a blue light range. The sixth to eleventh unit filter F6, F7, F8, F9, F10 and F11 may have center wavelengths G1, G2, G3, G4, G5 and G6 in a green light range, and the twelfth to fourteenth unit filters F12, F13 and F14 may have center wavelengths R1, R2 and R3 in a red light range. The fifteenth and sixteenth unit filters F15 and F16 may have center wavelengths NIR1 and NIR2 in a near infrared range.

Figure 19:
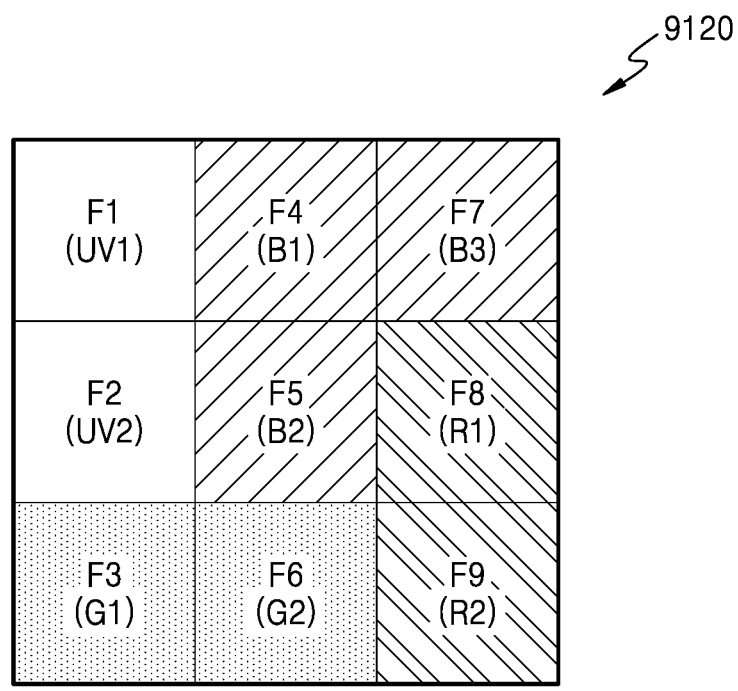
FIG. 19 is a plan view of another example of the spectral filter that is applicable to the image sensor of FIG. 1.

FIG. 19 is a plan view of another example of the spectral filter 9100 that is applicable to the image sensor 1000 of FIG. 1 according to another example embodiment. FIG. 19 is a plan view of one filter group 9120, for convenience of explanation.

Referring to FIG. 19, each filter group 9120 may include nine unit filters F1 to F9 arranged in a 3×3 array. The first and second unit filters F1 and F2 may have center wavelengths UV1 and UV2 in the ultraviolet range, and the fourth, fifth, and seventh unit filters F4, F5, and F7 may have center wavelengths B1, B2 and B3 in the blue light range. The third and sixth unit filters F3 and F6 may have center wavelengths G1 and G2 in the green light range, and the eighth and ninth unit filters F8 and F9 may have center wavelengths R1 and R2 in the red light range.

Figure 20:
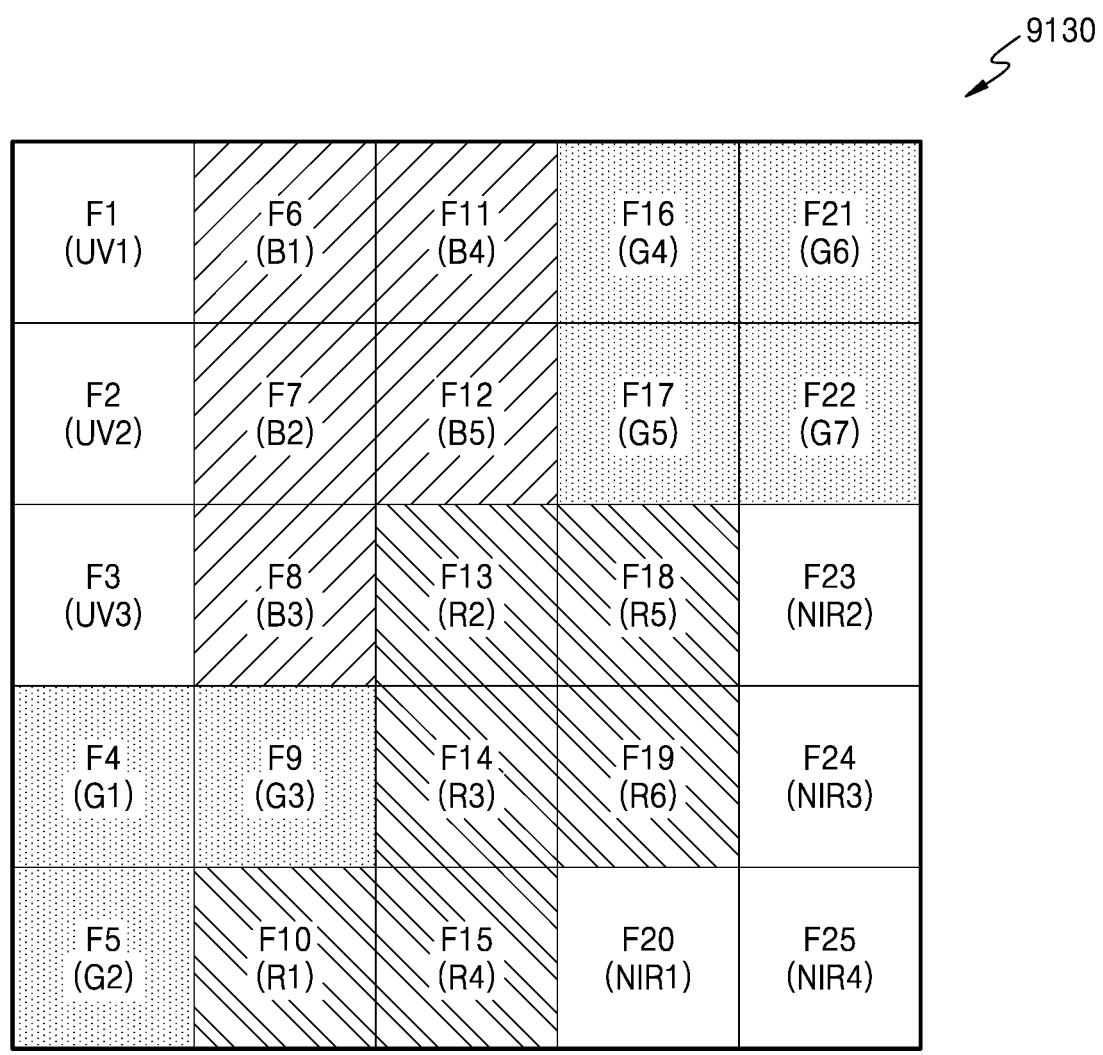
FIG. 20 is a plan view of another example of a spectral filter that is applicable to the image sensor of FIG. 1.

FIG. 20 is a plan view of another example of the spectral filter 9100 that is applicable to the image sensor 1000 of FIG. 1 according to another example embodiment. FIG. 20 is a plan view of one filter group 9130, for convenience of explanation.

Referring to FIG. 20, each filter group 9130 may include twenty-five unit filters F1 to F25 arranged in a 5×5 array. The first to third unit filter F1, F2 and F3 may have center wavelengths UV1, UV2, and UV3 in the ultraviolet range, and the sixth, seventh, eighth, eleventh, and twelfth unit filters F6, F7, F8, F11, and F12 may have center wavelengths B1, B2, B3, B4 and B5 in the blue light range. The fourth, fifth, and ninth unit filters F4, F5, and F9 may have center wavelengths G1, G2 and G3 in the green light range, and the tenth, thirteenth, fourteenth, fifteenth, eighteenth, and nineteenth unit filters F10, F13, F14, F15, F18, and F19 may have center wavelengths R1, R2, R3, R4, and R6 in a red light range. The twentieth, twenty-third, twenty-fourth, and twenty-fifth unit filters F20, F23, F24, and F25 may have center wavelengths NIR1, NIR2, NIR3 and NIR4 in the near infrared range.

Hereinafter, an image processing method performed on image signals output from the image sensor 1000 will be described.

Figure 21:
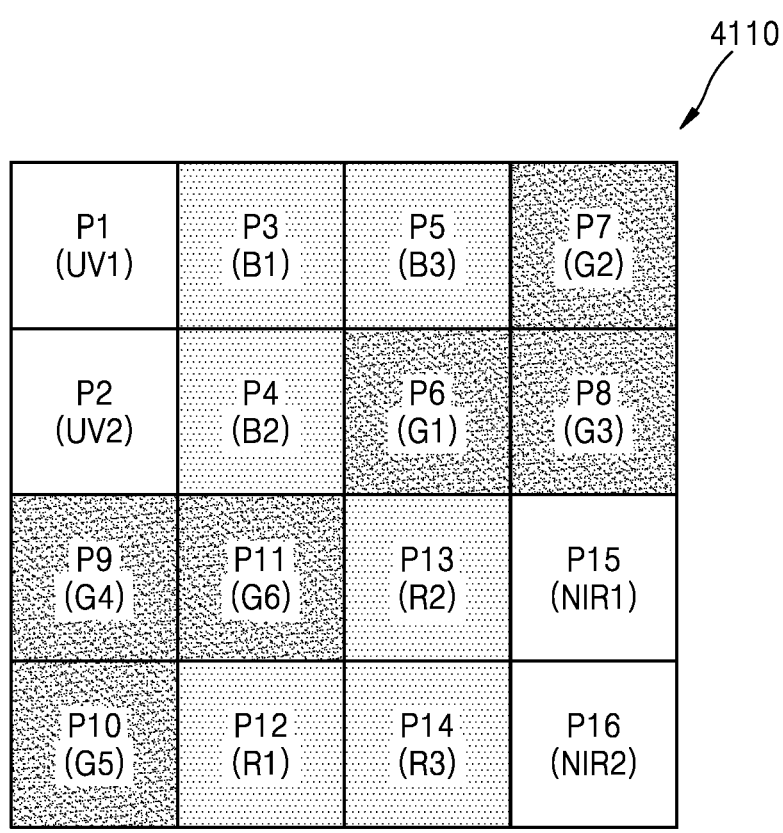
FIG. 21 is an example of a plan view of a pixel array of an image sensor according to an example embodiment.

FIG. 21 is a plan view of an example of a pixel array 4110 of the image sensor according to an example embodiment.

Referring to FIG. 21, the pixel array 4110 includes a plurality of pixels P1 to P16 arranged in two dimensions. FIG. 21 illustrates a case in which the sixteen pixels P1 through P16 are arranged in a 4×4 array. FIG. 21 illustrates a case in which the first to sixteenth pixels P1 to P16 output image signals between the UV range and the NIR range. However, this is merely exemplary, and as such, according to another example embodiment, the number of pixels and the wavelength range of the output image signals from the pixels may be different. Here, the plurality of unit filters may be arranged such that the center wavelengths thereof are adjacent one another. However, the disclosure is not limited thereto. For instance, according to another example embodiment, the plurality of unit filters may be arranged such that the center wavelengths thereof are not adjacent one another, The first and second pixels P1 and P2 may include ultraviolet pixels outputting image signals in the ultraviolet range. In this case, unit filters corresponding to the first and second pixels P1 and P2 may have center wavelengths UV1 and UV2 in the ultraviolet range. The third to fifth pixels P3, P4 and P5 may include blue pixels outputting image signals in the blue light range. In this case, unit filters corresponding to the third to fifth pixels P3, P4 and P5 may have center wavelengths B1, B2, and B3 in the blue light range.

The sixth to eleventh pixels P6, P7, P8, P9, P10 and P11 may include green pixels outputting image signals in the green light range. In this case, unit filters corresponding to the sixth to eleventh pixels P6, P7, P8, P9, P10 and P11 may have center wavelengths G1, G2, G3, G4, G5 and G6 in the green light range. The twelfth to fourteenth pixels P12, P13 and P14 may include red pixels outputting image signals in the red light range. In this case, unit filters corresponding to the twelfth to fourteenth pixels P12, P13 and P14 may have center wavelengths R1, R2 and R3 in the red light range. Furthermore, the fifteenth and sixteenth pixels P15 and P16 may include near-infrared pixels outputting image signals in the near-infrared range. In this case, unit filters corresponding to the fifteenth and sixteenth pixels P15 and P16 may have center wavelengths in the near-infrared range.

The plurality of pixels P1 to P16 shown in FIG. 21 may receive the light transmitted through the unit filters of the spectral filter, convert the light into electric image signals, and output the electric image signals. In this case, the processor 4200 (i.e., the processor 4200 in FIG. 1) may independently perform image processing on each of the image signals output from the plurality of pixels P1 to P16 and output the image signals. As such, spectral images with high resolutions may be obtained by independently performing image processing on each of the image signals output from the plurality of pixels P1 to P16.

Figure 22:
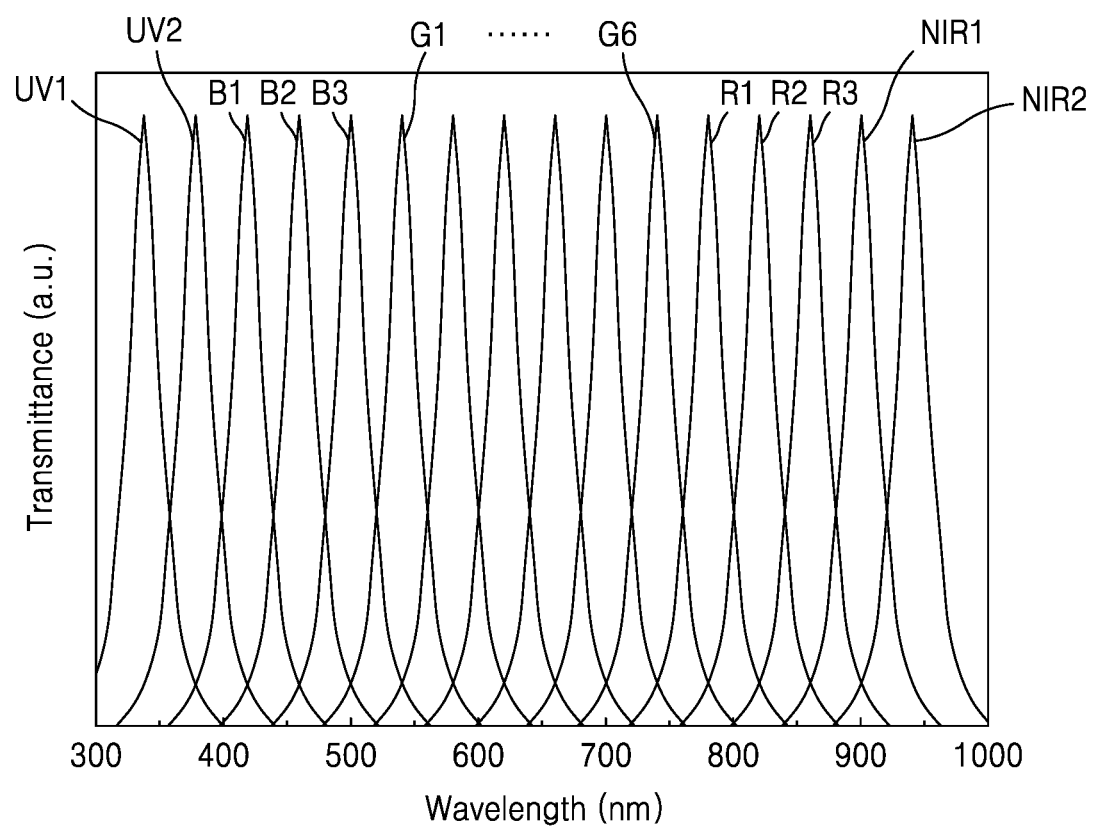
FIG. 22 illustrates a transmittance spectrum obtained by an image processing method according to an example embodiment from the pixel array of FIG. 21.

FIG. 22 illustrates a result obtained by independently performing image processing on each of the image signals output from the plurality of pixels P1 to P16 by the processor 4200 in the pixel array 4110 of FIG. 21. Referring to FIG. 22, sixteen transmittance spectrums are output as image processing is independently performed, by the processor 4200, on each of sixteen image signals P1 to P16.

Figure 23:
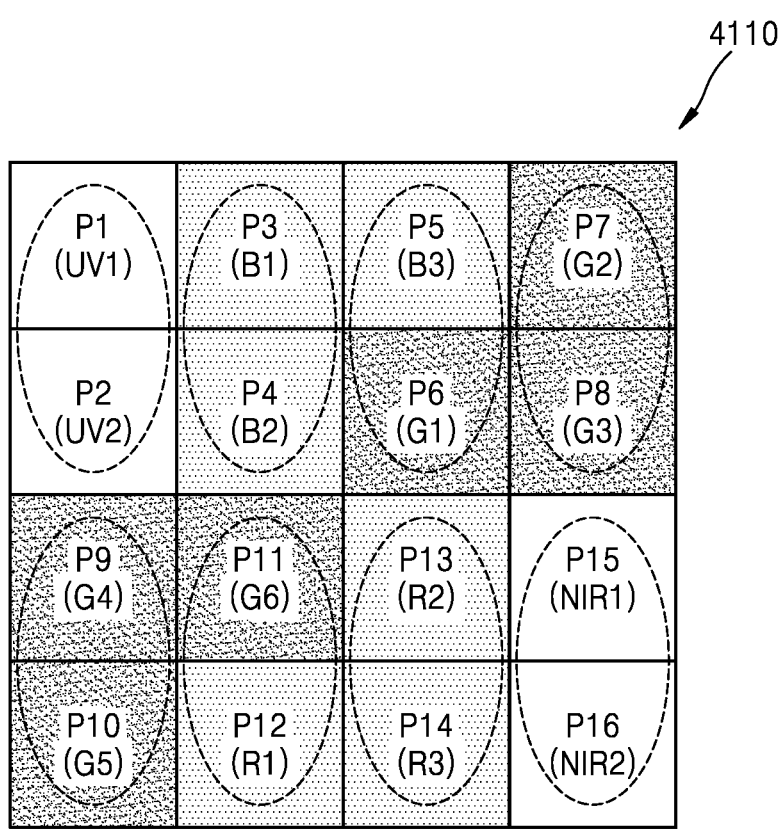
FIG. 23 is a diagram for describing an image processing method according to another example embodiment.
Figure 24:
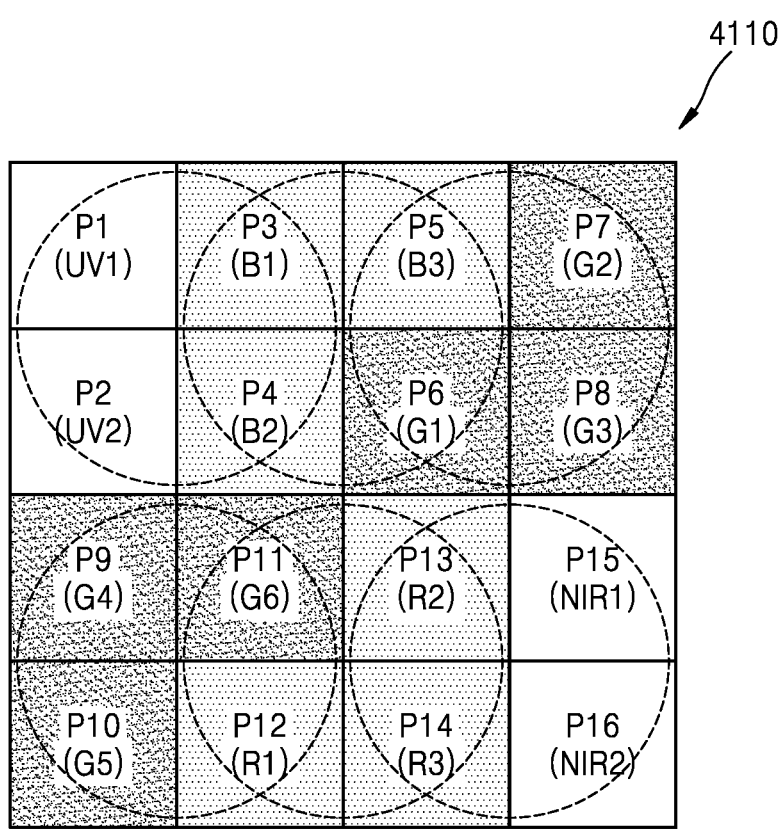
FIG. 24 is a diagram for describing an image processing method according to another example embodiment.

FIGS. 23 and 24 illustrate a method by which the processor 4200 performs image processing by using a pixel binning technology. The image processing method using the pixel binning technology describes a method by which the processor 4200 groups two or more image signals output from two or more adjacent pixels and performs image processing on the two or more image signals. For example, when the pixel array includes a plurality of blue pixels, a plurality of green pixels, and a plurality of red pixels, the processor 4200 may group at least one of image signals output from the blue pixels and perform image processing on the at least one of image signals, group at least one of image signals output from the green pixels and perform image processing on the at least one of image signals, and group at least one of image signals output from the red pixels and perform image processing on the at least one of image signals.

When the pixel array further includes a plurality of UV pixels, the processor 4200 may group at least one of UV image signals output from the UV pixels and perform image processing the at least one of the UV image signals. In addition, when the pixel array 4200 further includes a plurality of NIR pixels, the processor 4200 may group at least one of image signals output from the NIR pixels and perform image processing on the at least one of image signals. Furthermore, the processor 4200 may group image signals output from pixels in different wavelength ranges adjacent one another and perform image processing on the image signals.

FIG. 23 is a diagram for describing an image processing method according to another example embodiment. Referring to FIG. 23, the pixel array 4110 includes the plurality of pixels P1 to P16 arranged in two dimensions. The pixels P1 to P16 of FIG. 23 are the same as the pixels P1 to P16 of FIG. 21, and therefore, descriptions thereof are omitted.

The plurality of pixels P1 to P16 of FIG. 23 may receive the light transmitted through the unit filters of the spectral filter, convert the light into electric image signals, and output the electric image signals. In this case, the processor 4200 (i.e., the processor 4200 in FIG. 1) may group two image signals output from two adjacent pixels among the pixels P1 to P16, and perform image processing on the two image signals. Unit filters corresponding to the two pixels, among the plurality of pixels P1 to P16, being grouped and image-processed may be arranged such that center wavelengths of the unit filters are adjacent each other.

As illustrated in FIG. 23, when the processor 4200 groups two image signals output from two adjacent pixels among the plurality of pixels P1 to P16, sixteen image signals output from sixteen pixels P1 to P16 may be image-processed into eight image signals by the processor 4200 and then the eight image signals processed by th processor 4200 may be output. As described above, eight transmittance spectrums having high signal intensity may be output as the unit filters corresponding to the two pixels, among the plurality of pixels P1 to P16, grouped and image-processed are arranged such that center wavelengths of the unit filters are adjacent each other.

FIG. 24 is a diagram for describing an image processing method according to another example embodiment.

Referring to FIG. 24, the pixel array 4110 includes the plurality of pixels P1 to P16 arranged in two dimensions. The pixels P1 to P16 of FIG. 24 are the same as the pixels P1 to P16 of FIG. 21, and therefore, descriptions thereof are omitted.

The plurality of pixels P1 to P16 of FIG. 24 may receive the light transmitted through the unit filters of the spectral filter, convert the light into electric image signals, and output the electric image signals. In this case, the processor 4200, (i.e., the processor 4200 in FIG. 1) may group four image signals output from four adjacent pixels among the plurality of pixels P1 to P16 and perform image processing on the four image signals. Unit filters corresponding to the four pixels, among the plurality of pixels P1 to P16, grouped and image-processed may be arranged such that center wavelengths of the unit filters are adjacent one another.

As illustrated in FIG. 24, when the processor 4200 groups four image signals output from four adjacent pixels among the plurality of pixels P1 to P16, sixteen image signals output from sixteen pixels P1 to P16 may be image-processed into six image signals by the processor 4200, and then the six image signals processed by the processor 4200 may be output. As such, six transmittance spectrums having high signal intensity may be output as the unit filters corresponding to four pixels, among the plurality of pixels P1 to P16, grouped and image-processed are arranged such that center wavelengths of the unit filters are adjacent to one another.

Although an example in which the number of pixels being grouped and image-processed is two or four is described above, the disclosure is not limited thereto. As such, various numbers of pixels P1 to P16 may be grouped and image-processed according to other example embodiment.

According to an example embodiment, the processor 4200 may perform image processing on the image signals output from the pixel array 4110 by using a sum of the image signals or a difference between the image signals. In this case, a weight according to a specific wavelength range may be applied to at least one of the image signals. However, the disclosure is not limited thereto, and the weight according to the specific wavelength range may be not applied to the image signals. Furthermore, in addition to the image processing described above, the processor 4200 may process spectrum information of each of the image signals output from the pixel array 4110 and output the spectrum information.

Figure 25:
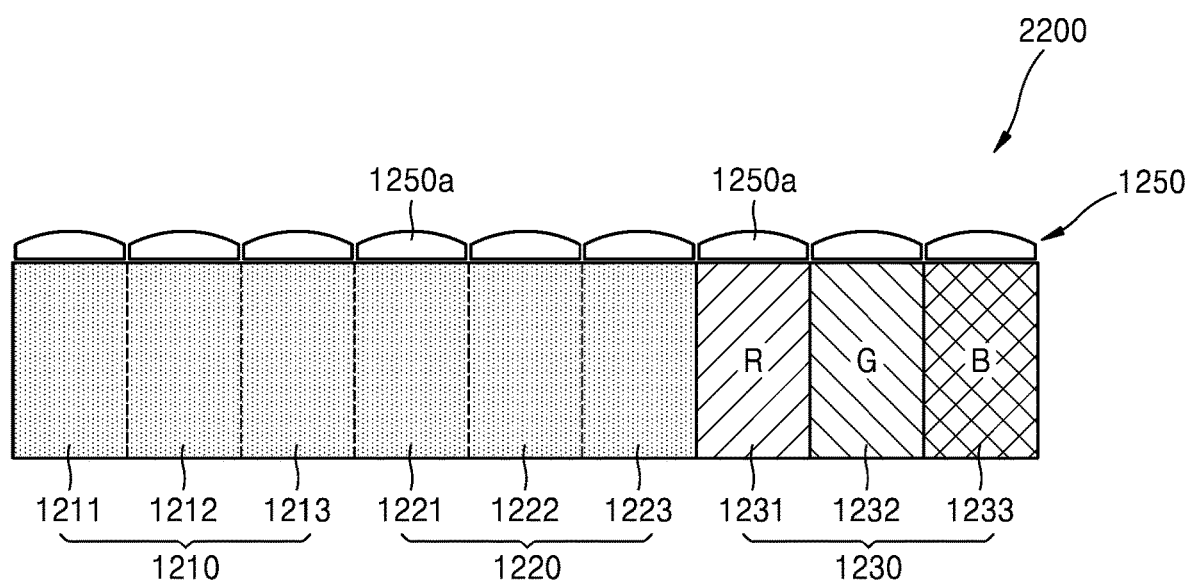
FIG. 25 is a schematic cross-sectional view of a spectral filter according to another example embodiment.

FIG. 25 is a schematic cross-sectional view of a spectral filter 2200 according to another example embodiment.

Referring to FIG. 25, the spectral filter 2200 may include the first and second filter arrays 1210 and 1220 and a color filter array 1230. The first and second filter arrays 1210 and 1220 and the color filter array 1230 may be arranged on substantially the same plane.

The first filter array 1210 may include first, second, and third unit filters 1211, 1212, and 1213 having center wavelengths in a first wavelength range, and the second filter array 1220 may include fourth, fifth, and sixth unit filters 1221, 1222, and 1223 having wavelengths in a second wavelength range. The first filter array 1210 may include any one of the above-described first filter arrays 110, 220, 320, 420, 520, 620, 720, 820, 920 or 1010, and the second filter array 1220 may include any one of the above-described second filter arrays 120, 220, 320, 420, 520, 620, 720, 820, 920 or 1020. The descriptions of the first and second filter arrays 1210 and 1220 are omitted.

The color filter array 1230 may include, for example, a red color filter 1231, a green color filter 1232, and a blue color filter 1233. The red color filter 1231 may transmit red light having a wavelength band of about 600 nm to about 700 nm, the green color filter 1232 may transmit green light having a wavelength band of about 500 nm to about 600 nm, and the blue color filter 1233 may transmit blue light having a wavelength band of about 400 nm to about 500 nm. For example, typical color filters applied to color display apparatuses such as liquid crystal display apparatuses, organic light-emitting display apparatuses, and the like may be used as the red, green and blue color filters 1231, 1232, and 1233. A microlens array 1250 including a plurality of microlenses 1250*a* may be further provided above the first and second filter arrays 1210 and 1220 and the color filter array 1230.

According to an example embodiment, not only information about center wavelengths of the unit filters 1211, 1212, 1213, 1221, 1222, and 1223 may be obtained by using the first and second filter arrays 1210 and 1220, but also information about wavelengths of the red, green, and blue light may be additionally obtained by using the color filter array 1230.

Figure 26:
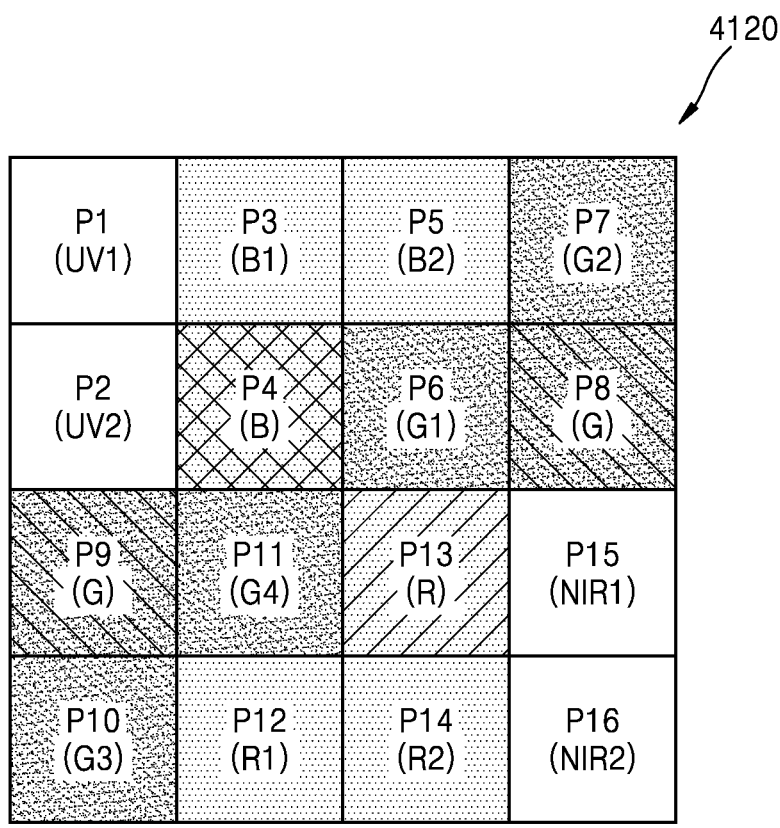
FIG. 26 is a plan view of an example of a pixel array of an image sensor that may be provided to correspond to the spectral filter of FIG. 25.

FIG. 26 is a plan view of an example of a pixel array 4120 of the image sensor that may be provided to correspond to the spectral filter 2200 of FIG. 25 according to another example embodiment.

Referring to FIG. 26, the pixel array 4120 includes the plurality of pixels P1 to P16 arranged in two dimensions. FIG. 26 illustrates that the sixteen pixels P1 to P16 are arranged in a 4×4 array. However, the disclosure is not limited thereto.

For example, the unit filters corresponding to the first and second pixels P1 and P2 may have center wavelengths UV1 and UV2 in the ultraviolet range, and unit filters corresponding to the third and fifth pixels P3 and P5 may have center wavelengths B1 and B2 in the blue light range. The unit filters corresponding to the sixth, seventh, tenth, and eleventh pixels P6, P7, P10, and P11 may have center wavelengths G1, G2, G3, and G4 in the green light range, and the unit filters corresponding to the twelfth and fourteenth pixels P12 and P14 may have center wavelengths R1 and R2 in the red light range. The unit filters corresponding to the fifteenth and sixteenth pixels P15 and P16 may have the center wavelengths NIR and NIR2 in the near infrared range.

Furthermore, the blue color filter corresponding to the fourth pixel P4 may have a center wavelength B in the blue light range, the green color filters corresponding to the eighth and ninth pixels P8 and P9 may have a center wavelength G in the green light range, and the unit filter corresponding to the thirteenth pixel P13 may have a center wavelength R in the red light range.

The plurality of pixels P1 to P16 of FIG. 26 may receive the light transmitted through the unit filters of the spectral filter, convert the light into electric image signals, and output the electric image signals. The processor 4200 (i.e., the processor 4200 of FIG. 1) may independently perform image processing on each of image signals output from the pixels P1, P2, P3, P5, P6, P7, P10, P11, P12, P14, P15, and P16 corresponding to the unit filters. As described above, the processor 4200 may group two or more image signals from the image signals output from the pixels P1, P2, P3, P5, P6, P7, P10, P11, P12, P14, P15, and P16 corresponding to the unit filters and perform image processing on the two or more image signals. Furthermore, the processor 4200 may perform image processing on image signals output from the pixels P4, P8, P9, and P13 corresponding to the red, green, and blue color filters.

Figure 27:
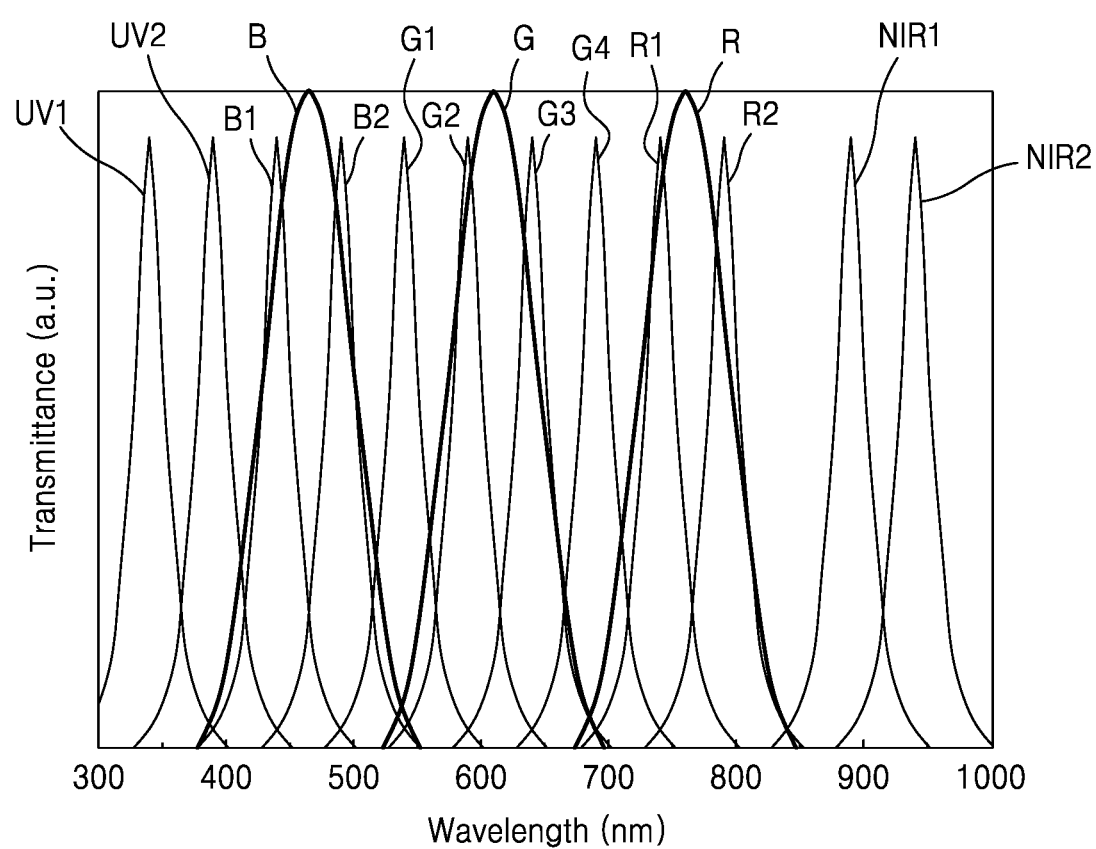
FIG. 27 illustrates an example of transmittance spectrums obtained by an image processing method according to another example embodiment from the pixel array of FIG. 26.

FIG. 27 illustrates a result obtained by performing image processing, by the processor 4200, on the image signals output from the plurality of pixels P1 to P16 of FIG. 26. Referring to FIG. 27, twelve transmittance spectrums are output by independently performing image processing on each of the image signals output from the pixels P1, P2, P3, P5, P6, P7, P10, P11, P12, P14, P15, and P16 corresponding to the unit filters, and three transmittance spectrums are output by performing image processing on image signals output from the pixels P4, P8, P9, and P13 corresponding to the red, green, and blue color filters.

Figure 28:
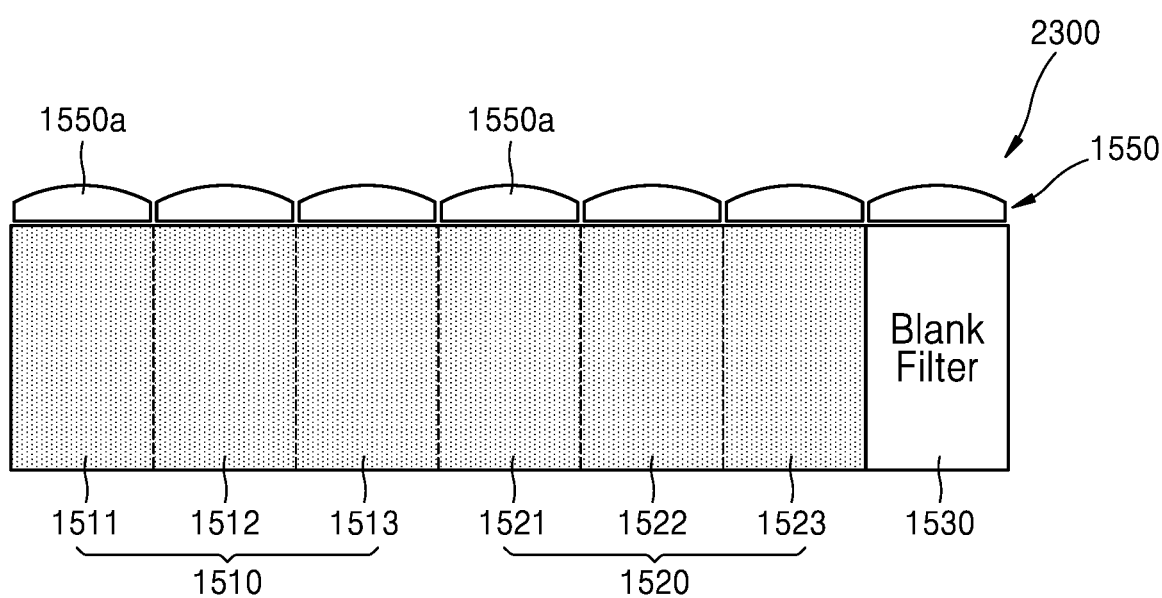
FIG. 28 is a schematic cross-sectional view of a spectral filter according to another example embodiment.

FIG. 28 is a schematic cross-sectional view of a spectral filter 2300 according to another example embodiment.

Referring to FIG. 28, the spectral filter 2300 may include first and second filter arrays 1510 and 1520 and a blank filter 1530. The first and second filter arrays 1510 and 1520 and the blank filter 1530 may be arranged on substantially the same plane.

The first filter array 1510 may include first, second, and third unit filters 1511, 1512, and 1513 having center wavelengths in a first wavelength range, and the second filter array 1520 may include fourth, fifth, and sixth unit filters 1521, 1522, and 1523 having center wavelengths in a second wavelength range. The first filter array 1510 may include any one of the above-described first filter arrays 110, 220, 320, 420, 520, 620, 720, 820, 920 or 1010, and the second filter array 1120 may include any one of the above-described second filter arrays 120, 220, 320, 420, 520, 620, 720, 820, 920 or 1020. The descriptions of the first and second filter arrays 1510 and 1520 are omitted.

The blank filter 1530 may include a filter to directly transmit incident light. The blank filter 1530 may include, for example, a transparent dielectric material or air. A microlens array 1550 including a plurality of microlenses 1550*a* may be further provided above the first and second filter arrays 1510 and 1520 and the blank filter 1530.

According to an example embodiment, not only information about center wavelengths of the unit filters 1511, 1512, 1513, 1521, 1522, and 1513 may be obtained by using the first and second filter arrays 1510 and 1520, but also information about intensity of light incident on the spectral filter 2300 may be additionally obtained by using the blank filter 1530.

Figure 29:
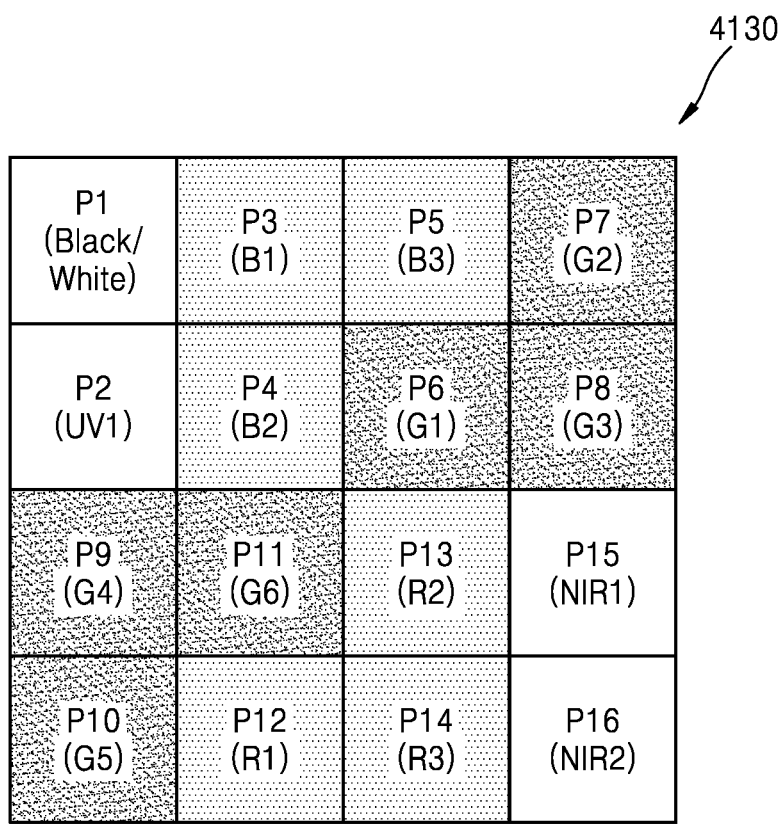
FIG. 29 is a plan view of an example of a pixel array of an image sensor that may be provided to correspond to the spectral filter of FIG. 28.

FIG. 29 is a plan view of an example of a pixel array 4130 that may be provided to correspond to the spectral filter 2300 of FIG. 28.

Referring to FIG. 29, the pixel array 4130 may include a plurality of pixels P1 to P16 arranged in two dimensions. FIG. 29 illustrates in which sixteen pixels P1 to P16 are arranged in a 4×4 array.

For example, unit filters corresponding to the second pixel P2 may have a center wavelength UV1 in the ultraviolet range, and unit filters corresponding to the third to fifth filter P3, P4 and P5 may have center wavelengths B1, B2 and B3 in the blue light range. Unit filters corresponding to the sixth to eleventh pixels P6, P7, P8, P9, P10 and P11 may have center wavelengths G1, G2, G3, G4, G5 and G6 in the green light range, and unit filters corresponding to the twelfth to fourteenth pixels P12, P13 and P14 may have center wavelengths R1, R2 and R3 in the red light range. Furthermore, unit filters corresponding to the fifteenth and sixteenth pixels P15 and P16 may have center wavelengths NIR1 and NIR2 in the near infrared range.

The first pixel P1 may be provided to correspond to the blank filter 1530 of FIG. 28. The first pixel P1 may receive light transmitting through the blank filter 1530 and output the light as an electric image signal, and the processor 4200 (i.e., the processor 4200 of FIG. 2) may perform image processing on the image signal and output the image signal. A black-and-white image having a contrast that varies according to intensity may be obtained as the image signal output from the first pixel P1 is processed by the processor 4200.

Figure 30:
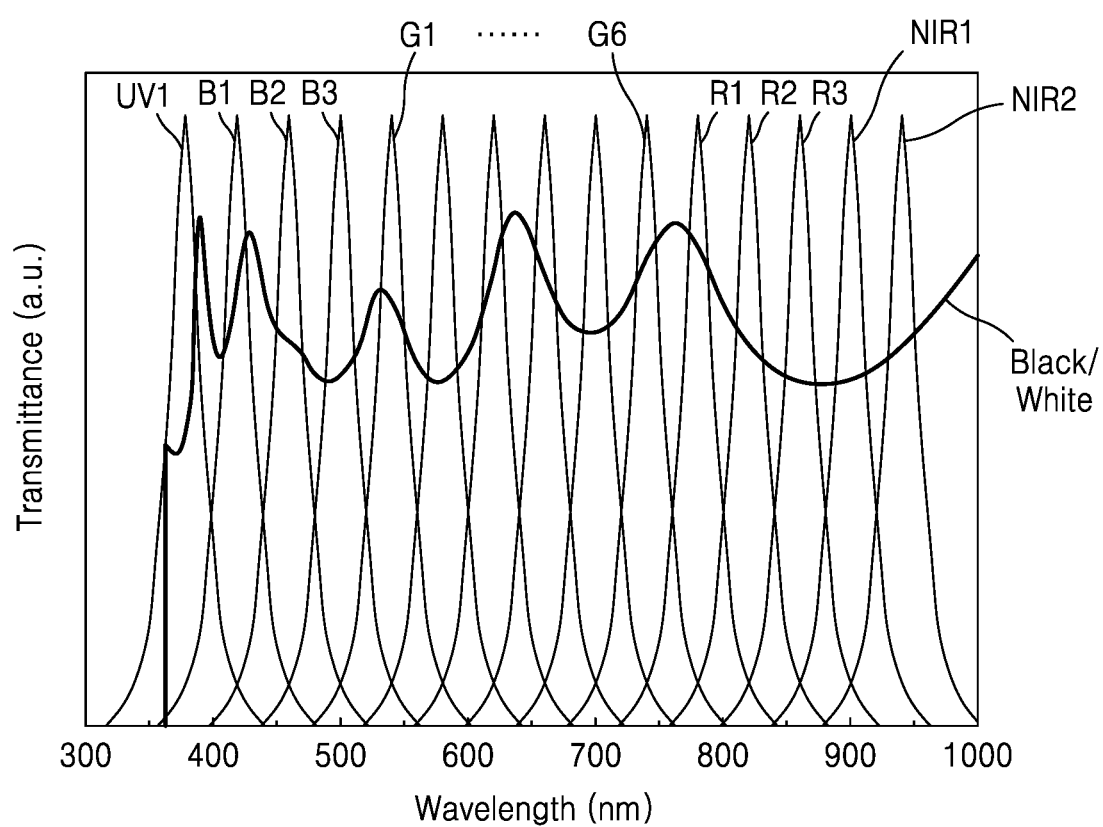
FIG. 30 illustrates an example of transmittance spectrums obtained by an image processing method according to an example embodiment from the pixel array of FIG. 29.

FIG. 30 illustrates a result obtained by performing image processing, by the processor 4200, on the image signals output from the plurality of pixels P1 to P16 of FIG. 29.

Referring to FIG. 30, fifteen transmittance spectrums are output by independently performing image processing on each of the image signals output from the pixels P2 to P16 corresponding to the unit filters, and one transmittance spectrum having an intensity changing according to a wavelength is output by performing image processing on the image signal output from the first pixel P1 corresponding to the blank filter.

Figure 31:
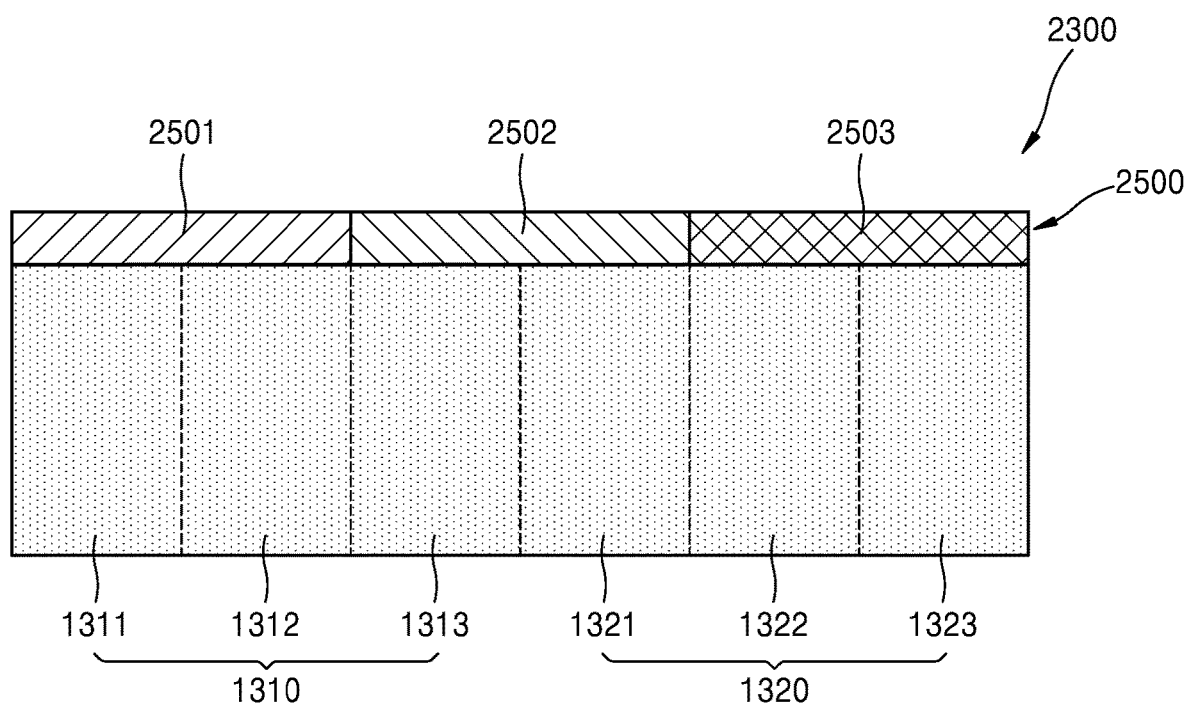
FIG. 31 is a schematic cross-sectional view of a spectral filter according to another example embodiment.

FIG. 31 is a schematic cross-sectional view of a spectral filter 2300 according to another example embodiment.

Referring to FIG. 31, the spectral filter 2300 may include first and second filter arrays 1310 and 1320 and an additional filter array 2500 provided on the first and second filter arrays 1310 and 1320. The first filter array 1310 may include first, second, and third unit filters 1311, 1312, and 1313 having center wavelengths in a first wavelength range, and the second filter array 1320 may include fourth, fifth, and sixth unit filters 1321, 1322, and 1323 having center wavelengths in a second wavelength range.

The first filter array 1310 may include any one of the above-described first filter arrays 110, 220, 320, 420, 520, 620, 720, 820, 920 or 1010, and the second filter array 1320 may include any one of the above-described second filter arrays 120, 220, 320, 420, 520, 620, 720, 820, 920 or 1020. The descriptions of the first and second filter arrays 1310 and 1320 are omitted.

The additional filter array 2500 may include a plurality of first to third additional filters 2501, 2502, and 2503. FIG. 31 illustrates a case in which the first additional filter 2501 is provided to correspond to first and second unit filters 1311 and 1312, the second additional filter 2502 is provided to correspond to third and fourth unit filters 1313 and 1321, and the third additional filter 2503 is provided to correspond to fifth and sixth filters 1322 and 1323. However, this is merely exemplary, and each of the first, second, and third additional filters 2501, 2502, and 2503 may be provided to correspond to one unit filter (1311, 1312, 1313, 1321, 1322, or 1323) or three or more unit filters (1311, 1312, 1313, 1321, 1322, and 1323).

Each of the first, second, and third additional filters 2501, 2502, and 2503 may block light in a wavelength band that the corresponding unit filters (1311, 1312, 1313, 1321, 1322, and 1323) do not desire. For example, when the first and second unit filters 1311 and 1312 have center wavelengths in a wavelength band of about 400 nm to about 500 nm, the first additional filter 2501 may include a blue filter that transmits blue light. Furthermore, when the third and fourth unit filters 1313 and 1321 have center wavelengths in a wavelength band of about 500 nm to about 600 nm, the second additional filter 2502 may include a green filter that transmits green light. When the fifth and sixth unit filters 1322 and 1323 have center wavelengths in a wavelength band of about 600 nm to about 700 nm, the third additional filter 2503 may include a red filter that transmits red light.

The additional filter array 2500 may include a color filter array. In this case, the first, second, and third additional filters 2501, 2502, and 2503 may respectively include blue, green, and red color filters. For example, typical color filters applied to color display apparatuses such as liquid crystal display apparatuses, organic light-emitting display apparatuses, and the like may be used as the blue, green, and red color filters.

The additional filter array 2500 may include a broadband filter array. In this case, the first, second, and third additional filters 2501, 2502, and 2503 may respectively include first, second, and third broadband filters. Each of the first, second, and third broadband filters may have, for example, a multi-cavity structure or a metal mirror structure.

Figure 32:
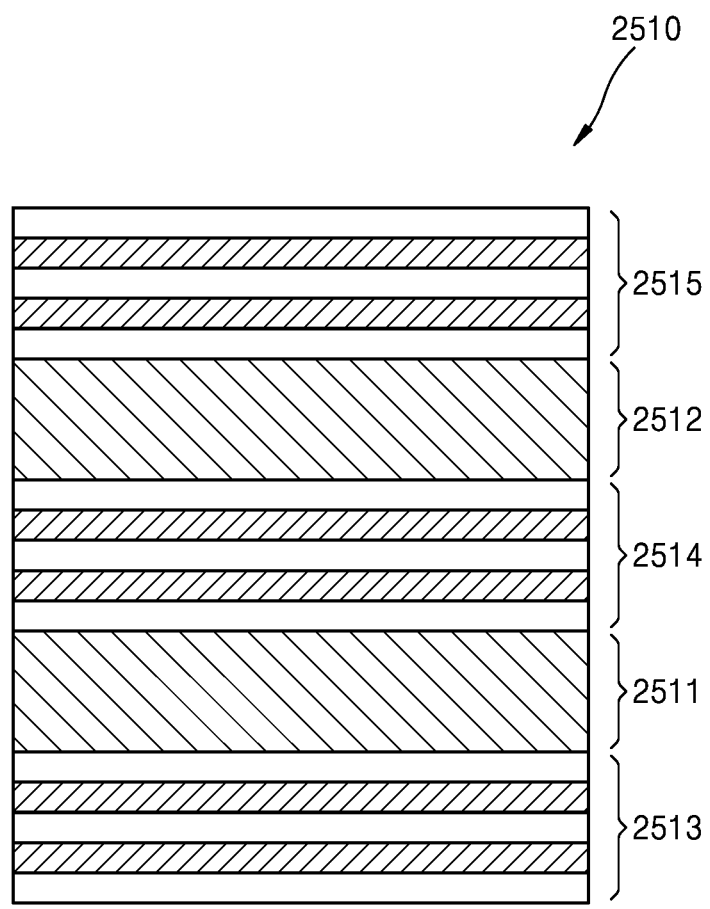
FIG. 32 is a schematic cross-sectional view of a broadband filter according to an example embodiment.

FIG. 32 is a schematic cross-sectional view of a broadband filter 2510 that is usable as the first to third additional filters 2501, 2502, and 2503 of FIG. 31 according to an example embodiment.

Referring to FIG. 32, the broadband filter 2510 may include a plurality of reflective layers 2513, 2514, and 2515 arranged spaced apart from one another and a plurality of cavities 2511 and 2512 provided between the reflective layers 2513, 2514, and 2515. Although FIG. 32 illustrates an example of the three reflective layers 2513, 2514, and 2515 and the two cavities 2511 and 2512, the numbers of the reflective layers 2513, 2514, and 2515 and the cavities 2511 and 2512 may be variously changed according to other example embodiments.

Each of the reflective layers 2513, 2514, and 2515 may include a distributed Bragg reflector (DBR). Each of the reflective layers 2513, 2514, and 2515 may have a structure in which a plurality of material layers having different refractive indexes are alternately stacked. Each of the cavities 2511 and 2512 may include a material having a certain refractive index or two or more materials having different refractive indexes.

Figure 33:
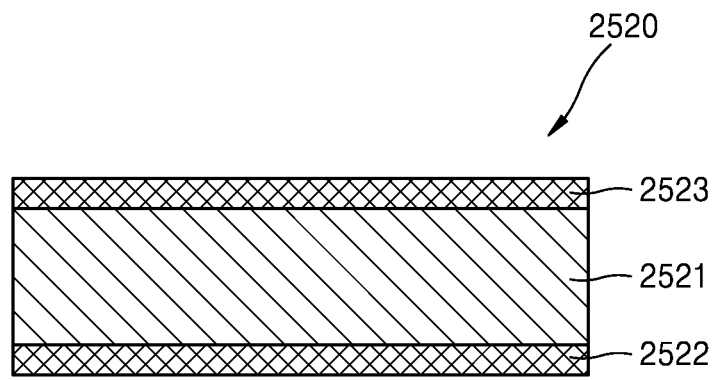
FIG. 33 is a schematic cross-sectional view of a broadband filter according to another example embodiment.

FIG. 33 is a schematic cross-sectional view of a broadband filter 2520 that is usable as the first to third additional filters 2501, 2502, and 2503 of FIG. 31, according to another example embodiment.

Referring to FIG. 33, the broadband filter 2520 may include two metal mirror layers 2522 and 2523 arranged spaced apart from each other and a cavity 2521 provided between the metal mirror layers 2522 and 2523.

Figure 34:
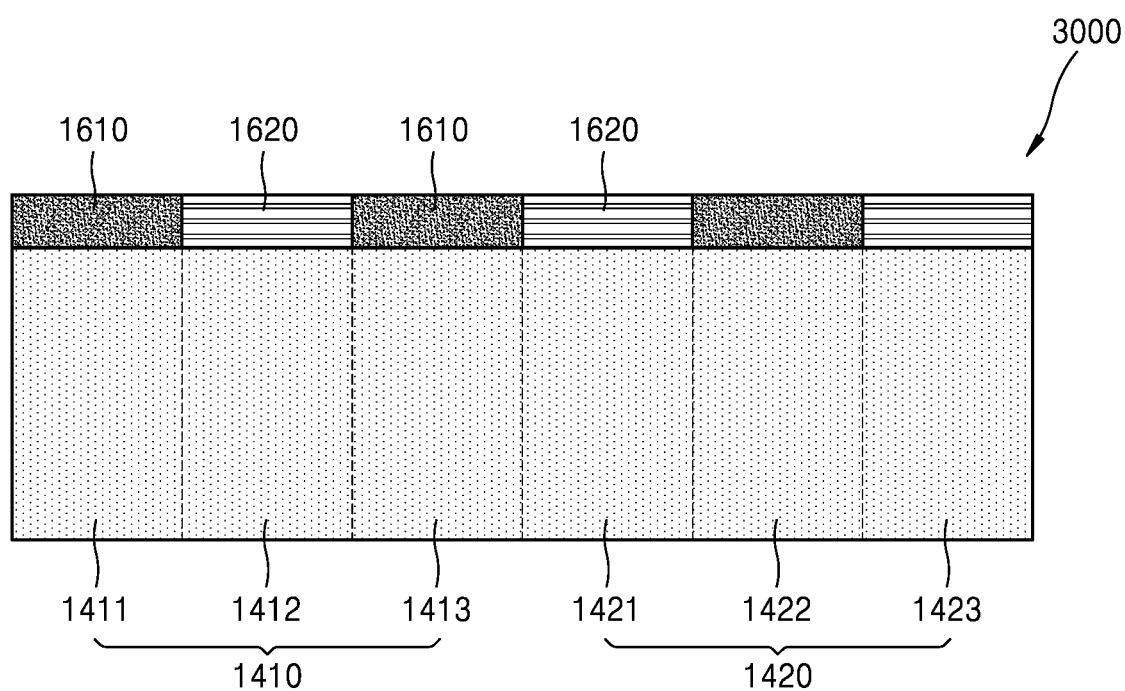
FIG. 34 is a schematic cross-sectional view of a spectral filter according to another example embodiment.

FIG. 34 is a schematic cross-sectional view of a spectral filter 3000 according to another example embodiment.

Referring to FIG. 34, the spectral filter 3000 may include first and second filter arrays 1410 and 1420, and a short wavelength absorption filter 1610 and a long wavelength cut-off filter 1620 provided on the first and second filter arrays 1410 and 1420.

The first filter array 1410 may include first, second, and third unit filters 1411, 1412, and 1413 having center wavelengths in a first wavelength range, and the second filter array 1420 may include fourth, fifth, and sixth unit filters 1421, 1422, and 1423 having center wavelengths in a second wavelength range.

The first filter array 1410 may include any one of the above-described first filter arrays 110, 220, 320, 420, 520, 620, 720, 820, 920 or 1010, and the second filter array 1420 may include any one of the above-described second filter arrays 120, 220, 320, 420, 520, 620, 720, 820, 920 or 1020. The descriptions of the first and second filter arrays 1410 and 1420 are omitted.

The short wavelength absorption filter 1610 may be provided in some unit filters (1411, 1413, and 1422) of the first to sixth unit filters 1411, 1412, 1413, 1421, 1422, and 1423, and the long wavelength cut-off filter 1620 may be provided in the other unit filters (1412, 1421, and 1423) of the first to sixth unit filters 1411, 1412, 1413, 1421, 1422, and 1423. Although FIG. 34 illustrates a case in which each of the short wavelength absorption filter 1610 and the long wavelength cut-off filter 1620 is provided to correspond to one unit filter (1411, 1412, 1413, 1421, 1422, or 1423), the disclosure is not limited thereto, and each of the short wavelength absorption filter 1610 and the long wavelength cut-off filter 1620 may be provided to correspond to two or more unit filters (1411, 1412, 1413, 1421, 1422, and 1423) according to other example embodiments.

The short wavelength absorption filter 1610 may cut off, for example, light of a short wavelength such as visible light. The short wavelength absorption filter 1610 may be manufactured by depositing, for example, silicon that is a material for absorbing visible light, on some unit filters (1411, 1413, and 1422) of the first to sixth unit filters 1411, 1412, 1413, 1421, 1422, and 1423. The unit filters (1411, 1413, and 1422) where the short wavelength absorption filter 1610 is provided may transmit near infrared (NIR) light having a wavelength longer than the visible light.

The long wavelength cut-off filter 1620 may cut off, for example, light having a long wavelength such as NIR light. The long wavelength cut-off filter 1620 may include a NIR light cut-off filter. The unit filters (1412, 1421, and 1423) where the long wavelength cut-off filter 1620 is provided may transmit visible light having a wavelength shorter than NIR light.

According to an example embodiment, as the short wavelength absorption filter 1610 and the long wavelength cut-off filter 1620 are provided on the first and second filter arrays 1410 and 1420, the spectral filter 3000 having the broadband characteristics capable of implementing from a visible light band to an NIR band may be manufactured.

The image sensor 1000 described above may be employed in various high performance optical devices or high performance electronic devices. The electronic devices may include, for example, smart phones, mobile phones, cellular phones, personal digital assistants (PDAs), laptop computers, personal computers (PCs), various portable devices, home appliances, security cameras, medical cameras, automobiles, Internet of Things (IoT) devices, and other mobile or no-mobile computing devise, but the disclosure is not limited thereto.

The electronic devices may further include, in addition to the image sensor 1000, a processor for controlling an image sensor, for example, an application processor (AP), control a number of hardware or software constituent elements by driving operating systems or application programs through the processor, and perform various data processing and calculations. The processors may further include graphics processing units (GPUs) and/or image signal processors. When the processors include image signal processors, an image (or video) obtained through an image sensor may be stored and/or output using the processor.

Figure 35:
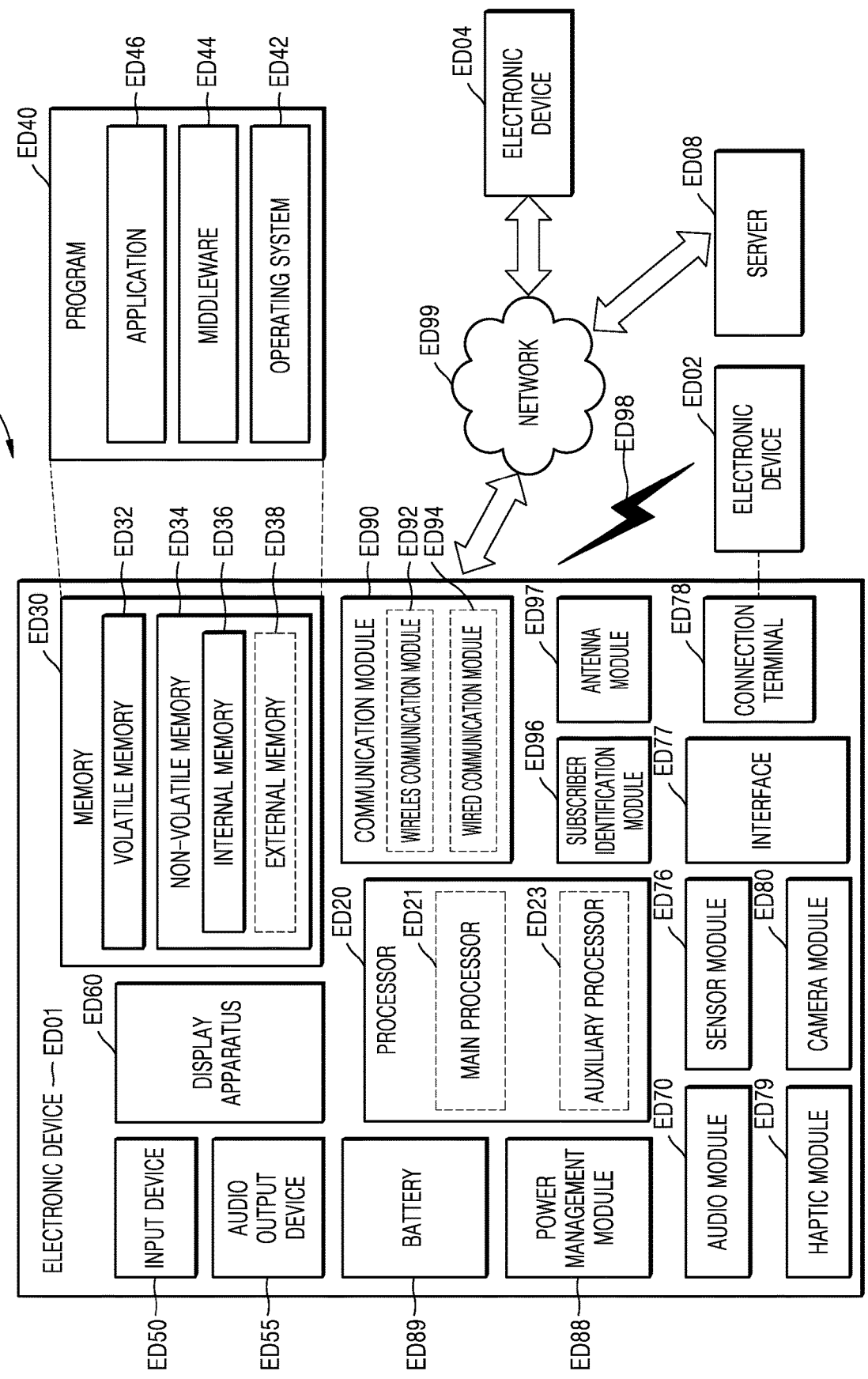
FIG. 35 is a schematic block diagram of an electronic device including an image sensor according to example embodiments.

FIG. 35 is a schematic block diagram of an electronic device ED01 including the image sensor 1000, according to an example embodiment. Referring to FIG. 35, in a network environment ED00, the electronic device ED01 may communicate with another electronic device ED02 through a first network ED98 (short-range wireless communication network, and the like), or communicate with another electronic device ED04 and/or a server ED08 through a second network ED99 (long-range wireless communication network, and the like). The electronic device ED01 may communicate with the electronic device ED04 through the server ED08. The electronic device ED01 may include a processor ED20, a memory ED30, an input device ED50, an audio output device ED55, a display apparatus ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic device ED01, some (the display apparatus ED60, and the like) of constituent elements may be omitted or other constituent elements may be added. Some of the constituent elements may be implemented by one integrated circuit. For example, the sensor module ED76 (a fingerprint sensor, an iris sensor, an illuminance sensor, and the like) may be implemented by being embedded in the display apparatus ED60 (a display, and the like). Furthermore, when the image sensor 1000 includes a spectral function, some functions (a color sensor and an illuminance sensor) of the sensor module ED76 may be implemented by the image sensor 1000, not by a separate sensor module.

The processor ED20 may control one or a plurality of other constituent elements (hardware and software constituent elements, and the like) of the electronic device ED01 connected to the processor ED20 by executing software (a program ED40, and the like), and perform various data processing or calculations. As part of the data processing or calculations, the processor ED20 may load, in a volatile memory ED32, commands and/or data received from other constituent elements (the sensor module ED76, the communication module ED90, and the like), process the command and/or data stored in the volatile memory ED32, and store result data in a non-volatile memory ED34. The processor ED20 may include a main processor ED21 (a central processing unit, an application processor, and the like) and an auxiliary processor ED23 (a graphics processing unit, an image signal processor, a sensor hub processor, a communication processor, and the like) that is operable independently of or together with the main processor ED21. The auxiliary processor ED23 may use less power than the main processor ED21 and may perform a specialized function.

Instead of the main processor ED21 when the main processor ED21 is in an inactive state (sleep state), or with the main processor ED21 when the main processor ED21 is in an active state (application execution state), the auxiliary processor ED23 may control functions and/or states related to some constituent elements (the display apparatus ED60, the sensor module ED76, the communication module ED90, and the like) of the constituent elements of the electronic device ED01. The auxiliary processor ED23 (an image signal processor, a communication processor, and the like) may be implemented as a part of functionally related other constituent elements (the camera module ED80, the communication module ED90, and the like).

The memory ED30 may store various data needed by the constituent elements (the processor ED20, the sensor module ED76, and the like) of the electronic device ED01. The data may include, for example, software (the program ED40, and the like) and input data and/or output data about commands related thereto. The memory ED30 may include the volatile memory ED32 and/or the non-volatile memory ED34. The non-volatile memory ED34 may include an internal memory ED36 fixedly installed in the electronic device ED01 and an external memory ED38 that is removable.

The program ED40 may be stored in the memory ED30 as software, and may include an operating system ED42, middleware ED44, and/or an application ED46.

The input device ED50 may receive commands and/or data to be used for constituent elements (the processor ED20, and the like) of the electronic device ED01, from the outside (a user, and the like) of the electronic device ED01. The input device ED50 may include a microphone, a mouse, a keyboard, and/or a digital pen (a stylus pen, and the like).

The audio output device ED55 may output an audio signal to the outside of the electronic device ED01. The audio output device ED55 may include a speaker and/or a receiver. The speaker may be used for general purposes such as multimedia playback or recording playback, and the receiver may be used to receive incoming calls. The receiver may be implemented by being coupled as a part of the speaker or by an independent separate device.

The display apparatus ED60 may visually provide information to the outside of the electronic device ED01. The display apparatus ED60 may include a display, a hologram device, or a projector, and a control circuit to control a corresponding device. The display apparatus ED60 may include a touch circuitry set to detect a touch and/or a sensor circuit (a pressure sensor, and the like) set to measure the strength of a force generated by the touch.

The audio module ED70 may convert sound into electrical signals or reversely electrical signals into sound. The audio module ED70 may obtain sound through the input device ED50, or output sound through a speaker and/or a headphone of another electronic device (the electronic device ED02, and the like) connected to the audio output device ED55 and/or the electronic device ED01 in a wired or wireless manner.

The sensor module ED76 may detect an operation state (power, temperature, and the like) of the electronic device ED01, or an external environment state (a user state, and the like), and generate an electrical signal and/or a data value corresponding to a detected state. The sensor module ED76 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface ED77 may support one or a plurality of specified protocols used for the electronic device ED01 to be connected to another electronic device (the electronic device ED02, and the like) in a wired or wireless manner. The interface ED77 may include a high definition multimedia interface (HDMI), a universal serial bus (USB) interface, an SD card interface, and/or an audio interface.

A connection terminal ED78 may include a connector for the electronic device ED01 to be physically connected to another electronic device (the electronic device ED02, and the like). The connection terminal ED78 may include an HDMI connector, a USB connector, an SD card connector, and/or an audio connector (a headphone connector, and the like).

The haptic module ED79 may convert electrical signals into mechanical stimuli (vibrations, movements, and the like) or electrical stimuli that are perceivable by a user through tactile or motor sensations. The haptic module ED79 may include a motor, a piezoelectric device, and/or an electrical stimulation device.

The camera module ED80 may capture a still image and a video. The camera module ED80 may include a lens assembly including one or a plurality of lenses, the image sensor 1000 of FIG. 1, image signal processors, and/or flashes. The lens assembly included in the camera module ED80 may collect light emitted from a subject for image capturing.

The power management module ED88 may manage power supplied to the electronic device ED01. The power management module ED88 may be implemented as a part of a power management integrated circuit (PMIC).

The battery ED89 may supply power to the constituent elements of the electronic device ED01. The battery ED89 may include non-rechargeable primary cells, rechargeable secondary cells, and/or fuel cells.

The communication module ED90 may establish a wired communication channel and/or a wireless communication channel between the electronic device ED01 and another electronic device (the electronic device ED02, the electronic device ED04, the server ED08, and the like), and support a communication through an established communication channel. The communication module ED90 may be operated independent of the processor ED20 (the application processor, and the like), and may include one or a plurality of communication processors supporting a wired communication and/or a wireless communication. The communication module ED90 may include a wireless communication module ED92 (a cellular communication module, a short-range wireless communication module, a global navigation satellite system (GNSS) communication module, and the like), and/or a wired communication module ED94 (a local area network (LAN) communication module, a power line communication module, and the like). Among the above communication modules, a corresponding communication module may communicate with another electronic device through the first network ED98 (a short-range communication network such as Bluetooth, WiFi Direct, or infrared data association (IrDA)) or the second network ED99 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module ED92 may verify and authenticate the electronic device ED01 in a communication network such as the first network ED98 and/or the second network ED99 by using subscriber information (an international mobile subscriber identifier (IMSI), and the like) stored in the subscriber identification module ED96.

The antenna module ED97 may transmit signals and/or power to the outside (another electronic device, and the like) or receive signals and/or power from the outside. An antenna may include an emitter formed in a conductive pattern on a substrate (a printed circuit board (PCB), and the like). The antenna module ED97 may include one or a plurality of antennas. When the antenna module ED97 includes a plurality of antennas, the communication module ED90 may select, from among the antennas, an appropriate antenna for a communication method used in a communication network such as the first network ED98 and/or the second network ED99. Signals and/or power may be transmitted or received between the communication module ED90 and another electronic device through the selected antenna. Other parts (an RFIC, and the like) than the antenna may be included as a part of the antenna module ED97.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device ED01 and the external electronic device ED04 through the server ED08 connected to the second network ED99. The electronic devices ED02 and ED04 may be of a type that is the same as or different from the electronic device ED01. All or a part of operations executed in the electronic device ED01 may be executed in one or a plurality of the electronic devices (ED02, ED04, and ED08). For example, when the electronic device ED01 needs to perform a function or service, the electronic device ED01 may request one or a plurality of electronic devices to perform part of the whole of the function or service, instead of performing the function or service. The one or a plurality of the electronic devices receiving the request may perform additional function or service related to the request, and transmit a result of the performance to the electronic device ED01. To this end, cloud computing, distributed computing, and/or client-server computing technology may be used.

Figure 36:
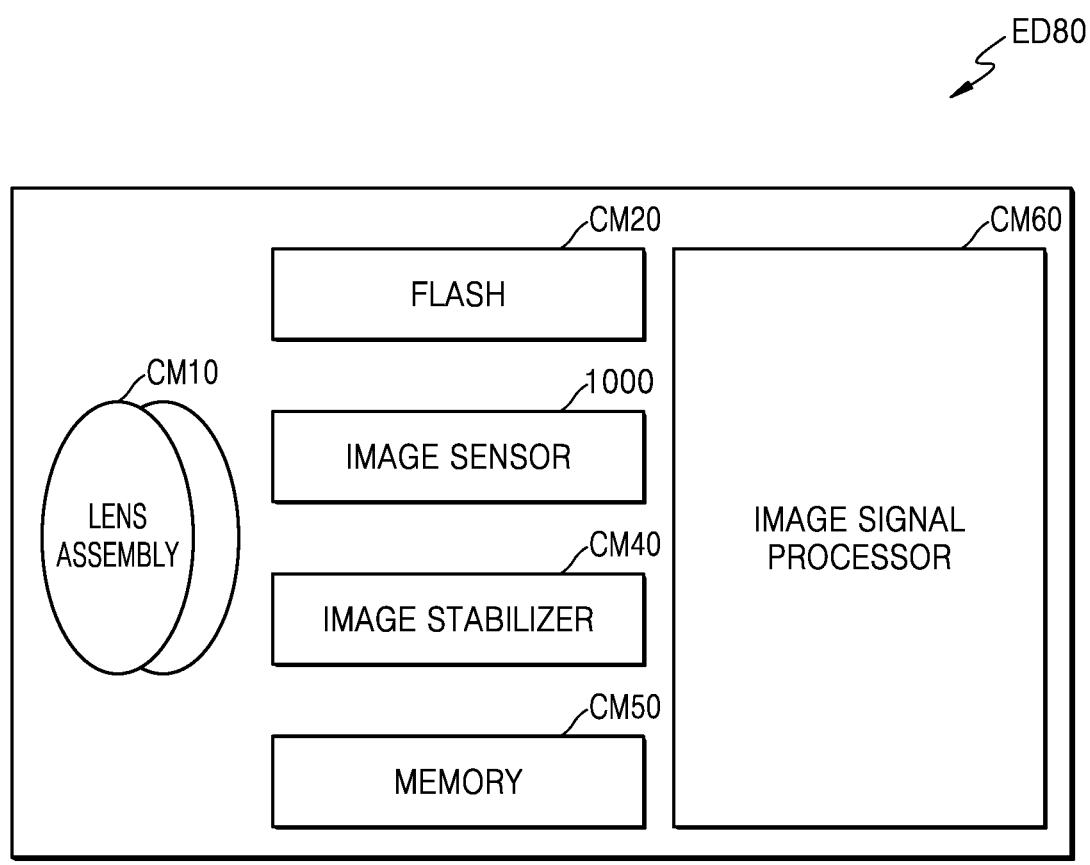
FIG. 36 is a schematic block diagram of a camera module of FIG. 35.

FIG. 36 is a block diagram of the camera module ED80 of FIG. 35. Referring to FIG. 36, the camera module ED80 may include a lens assembly CM10, a flash CM20, the image sensor 1000 (the image sensor 1000 of FIG. 1, and the like), an image stabilizer CM40, a memory CM50 (a buffer memory, and the like), and/or an image signal processor CM60. The lens assembly CM10 may collect light emitted from a subject for image capturing. The camera module ED80 may include a plurality of lens assemblies CM10, and in this case, the camera module ED80 may include a dual camera, a 360 degrees camera, or a spherical camera. Some of the lens assemblies CM10 may have the same lens attributes (a viewing angle, a focal length, auto focus, F Number, optical zoom, and the like), or different lens attributes. The lens assembly CM10 may include a wide angle lens or a telescopic lens.

The flash CM20 may emit light used to reinforce light emitted or reflected from a subject. The flash CM20 may include one or a plurality of light-emitting diodes (a red-green-blue (RGB) LED, a white LED, an infrared LED, an ultraviolet LED, and the like), and/or a xenon lamp. The image sensor 1000 may include the image sensor of FIG. 1, and convert light emitted or reflected from the subject and transmitted through the lens assembly CM10 into electrical signals, thereby obtaining an image corresponding to the subject. The image sensor 1000 may include one or a plurality of sensors selected from image sensors having different attributes such as an RGB sensor, a black and white (BW) sensor, an IR sensor, or UV sensor. Each sensor included in the image sensor 1000 may be implemented by a charged coupled device (CCD) sensor and/or a complementary metal oxide semiconductor (CMOS) sensor.

The image stabilizer CM40 may move, in response to a movement of the camera module ED80 or an electronic device ED01 including the same, one or a plurality of lenses included in the lens assembly CM10 or the image sensor 1000 in a particular direction or may compensate a negative effect due to the movement by controlling (adjusting a read-out timing, and the like) the movement characteristics of the image sensor 1000. The image stabilizer CM40 may detect a movement of the camera module ED80 or the electronic device ED01 by using a gyro sensor or an acceleration sensor arranged inside or outside the camera module ED80. The image stabilizer CM40 may be implemented in an optical form.

The memory CM50 may store a part or entire data of an image obtained through the image sensor 1000 for a subsequent image processing operation. For example, when a plurality of images are obtained at high speed, only low resolution images are displayed while the obtained original data (Bayer-Patterned data, high resolution data, and the like) is stored in the memory CM50. Then, the memory CM50 may be used to transmit the original data of a selected (user selection, and the like) image to the image signal processor CM60. The memory CM50 may be incorporated into the memory ED30 of the electronic device ED01, or configured to be an independently operated separate memory.

The image signal processor CM60 may perform image processing on the image obtained through the image sensor 1000 or the image data stored in the memory CM50. The image processing may include depth map generation, three-dimensional modeling, panorama generation, feature point extraction, image synthesis, and/or image compensation (noise reduction, resolution adjustment, brightness adjustment, blurring, sharpening, softening, and the like). The image signal processor CM60 may perform control (exposure time control, or read-out timing control, and the like) on constituent elements (the image sensor 1000, and the like) included in the camera module ED80. The image processed by the image signal processor CM60 may be stored again in the memory CM50 for additional processing or provided to external constituent elements (the memory ED30, the display apparatus ED60, the electronic device ED02, the electronic device ED04, the server ED08, and the like) of the camera module ED80. The image signal processor CM60 may be incorporated into the processor ED20, or configured to be a separate processor operated independently of the processor ED20. When the image signal processor CM60 is configured by a separate processor from the processor ED20, the image processed by the image signal processor CM60 may undergo additional image processing by the processor ED20 and then displayed through the display apparatus ED60.

The electronic device ED01 may include a plurality of camera modules ED80 having different attributes or functions. In this case, one of the camera modules ED80 may be a wide angle camera, and another may be a telescopic camera. Similarly, one of the camera modules ED80 may be a front side camera, and another may be a rear side camera.

According to an example embodiment, there may be provided an image processing apparatus including a memory and a processor. The memory may store one or more instructions, and the processor may be configured to execute the one or more instructions to receive image signals output from an image sensor including a spectral filter and a pixel array, the spectral filter comprising a plurality of unit filters having different center wavelength, group two or more image signals from among the image signals output from the image sensor based on a wavelength range, perform image processing on the two or more image signals, and output processed image signals.

According to an example embodiment, there may be provided an image processing method, which may include receiving image signals output from an image sensor including a spectral filter and a pixel array, the spectral filter comprising a plurality of unit filters having different center wavelength, grouping two or more image signals from among the image signals output from the image sensor based on a wavelength range, performing image processing on the two or more image signals, and outputting processed image signals.

According to an example embodiment, there may be provided a non-transitory computer readable medium having stored thereon a program for performing a method including receiving image signals output from an image sensor including a spectral filter and a pixel array, the spectral filter comprising a plurality of unit filters having different center wavelength, grouping two or more image signals from among the image signals output from the image sensor based on a wavelength range, performing image processing on the two or more image signals, and outputting processed image signals.

Figure 37:
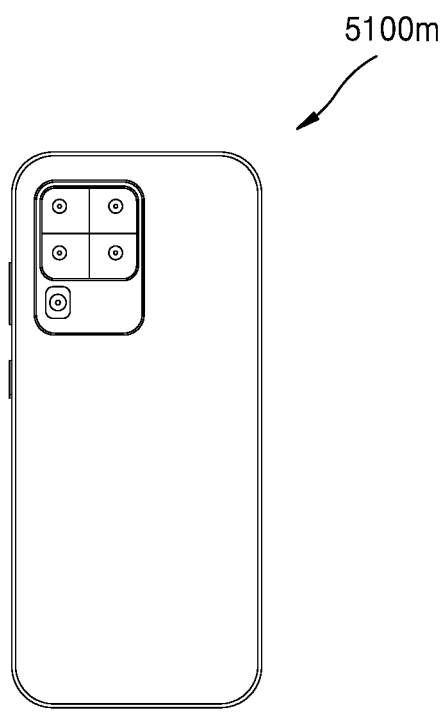
FIGS. 37 through 46 illustrate various examples of an electronic device to which image sensors according to example embodiments are applied.
Figure 38:
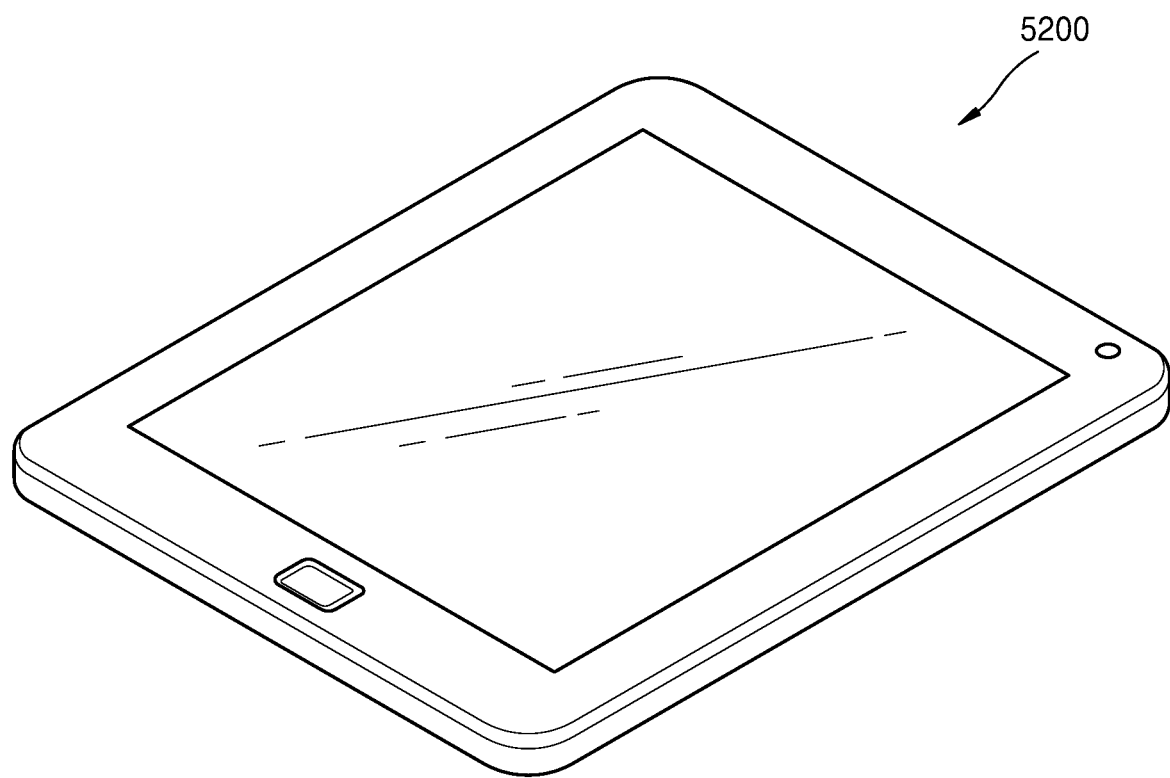
Figure 39:
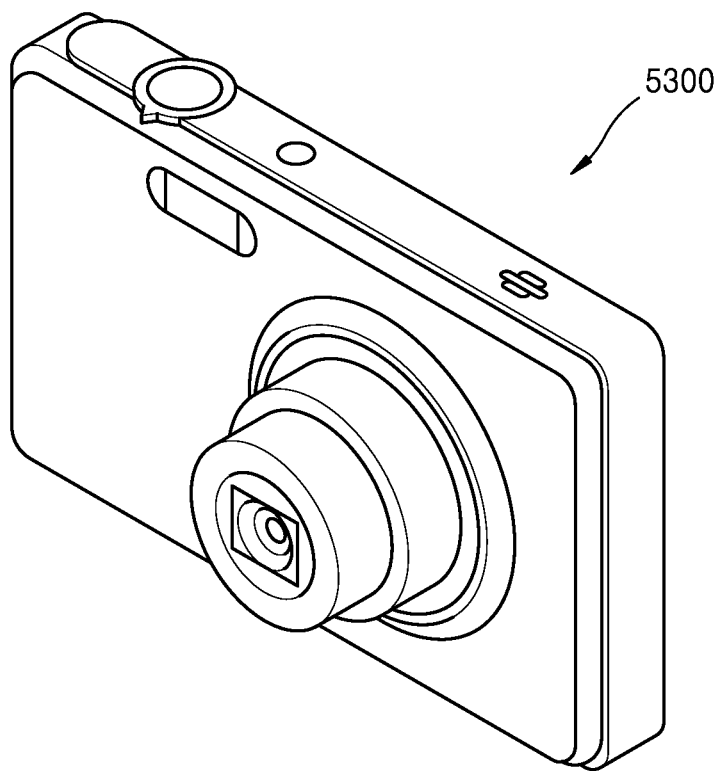
Figure 40:
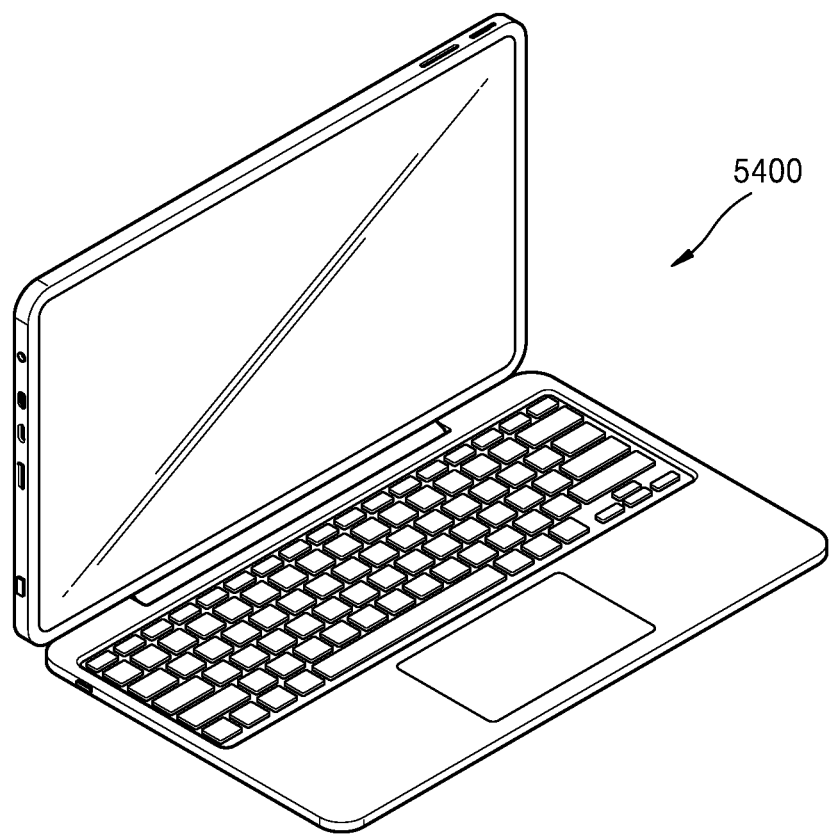
Figure 41:
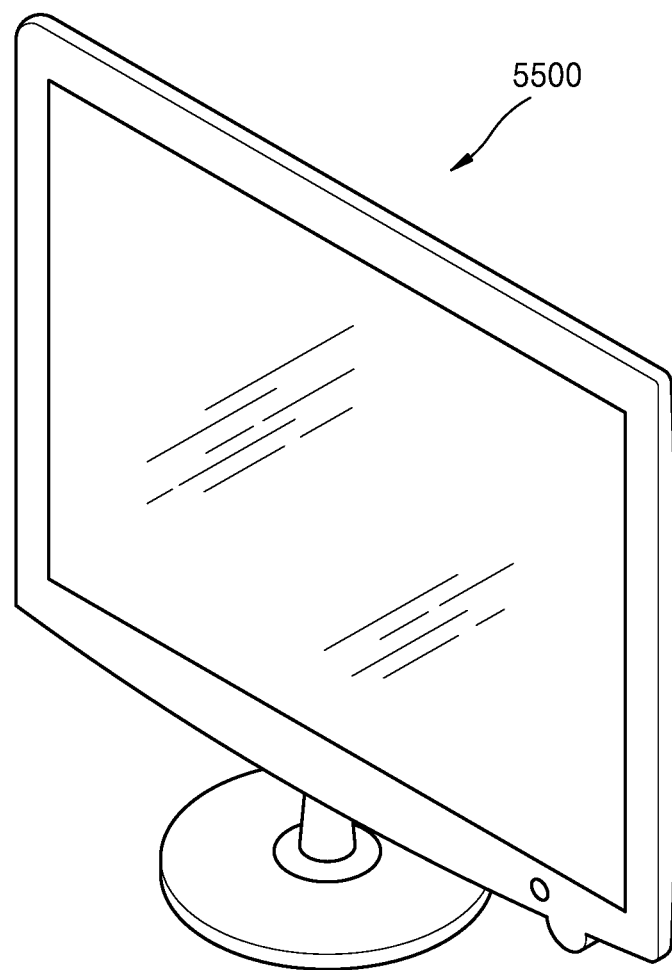

The image sensor 1000 according to example embodiments may be applied to a mobile phone or smartphone 5100*m* illustrated in FIG. 37, a tablet or smart tablet 5200 illustrated in FIG. 38, a digital camera or camcorder 5300 illustrated in FIG. 39, a notebook computer 5400 illustrated in FIG. 40, a television or smart television 5500 illustrated in FIG. 41, and the like. For example, the smartphone 5100*m* or the smart tablet 5200 may include a plurality of high resolution cameras, each having a high resolution image sensor mounted thereon. Depth information of subjects in an image may be extracted by using a high resolution cameras, out focusing of the image may be adjusted, or subjects in the image may be automatically identified.

Figure 42:
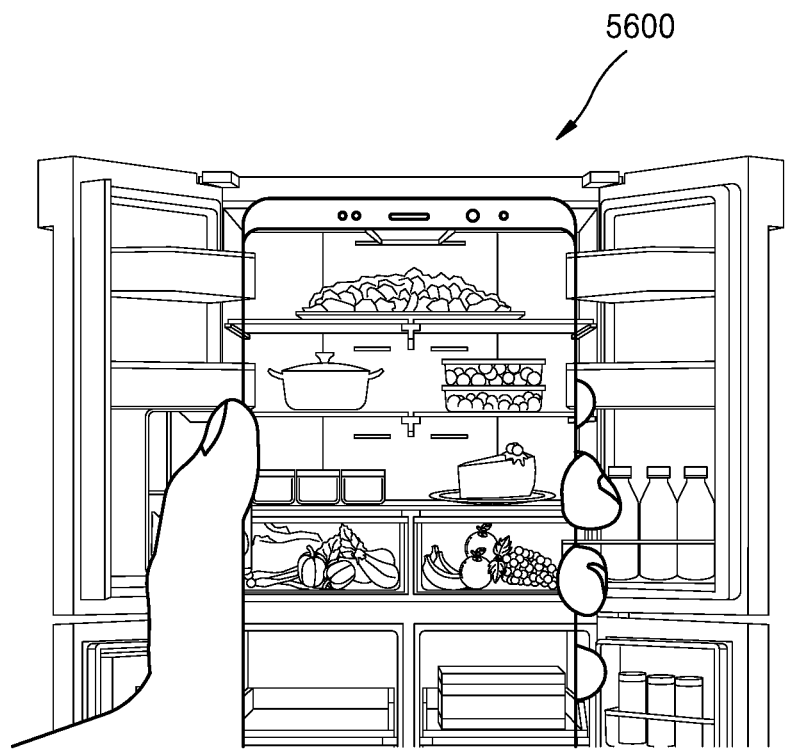
Figure 43:
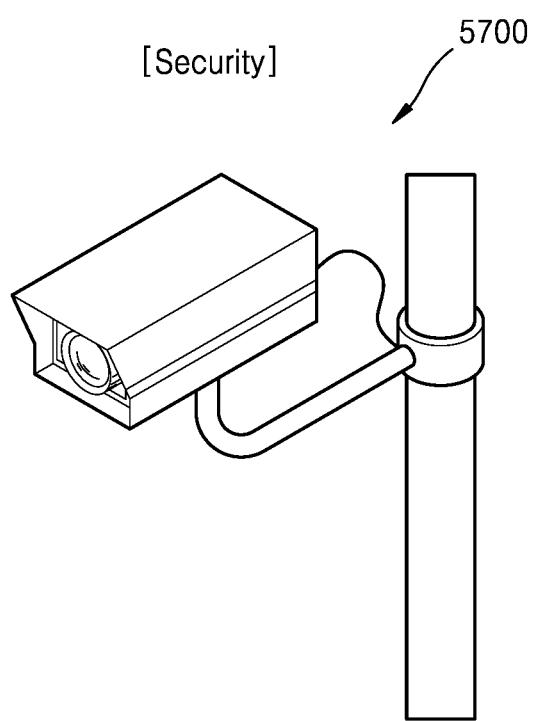
Figure 44:
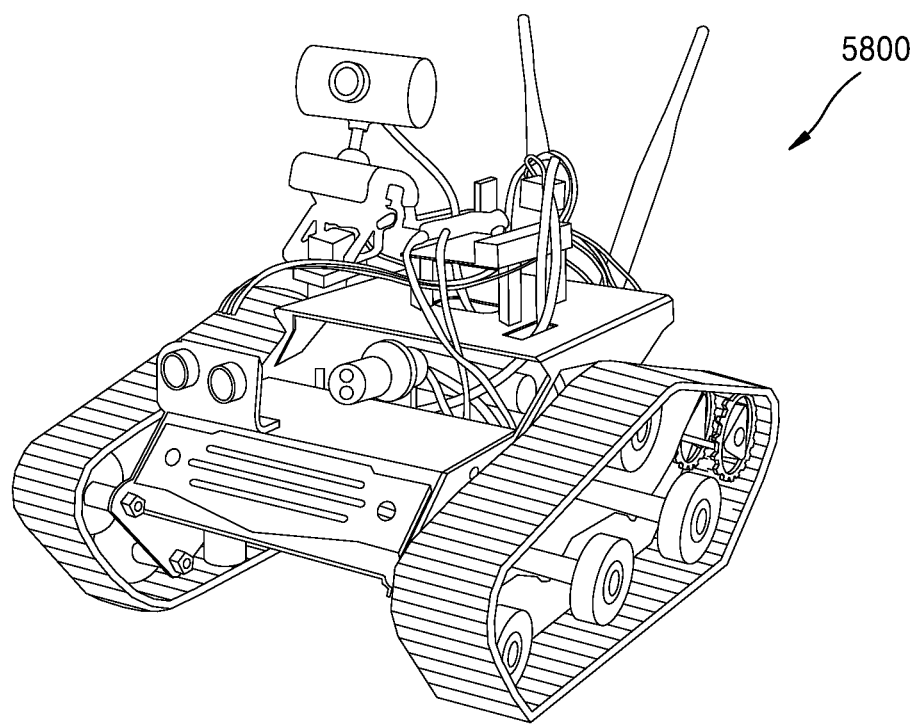
Figure 45:
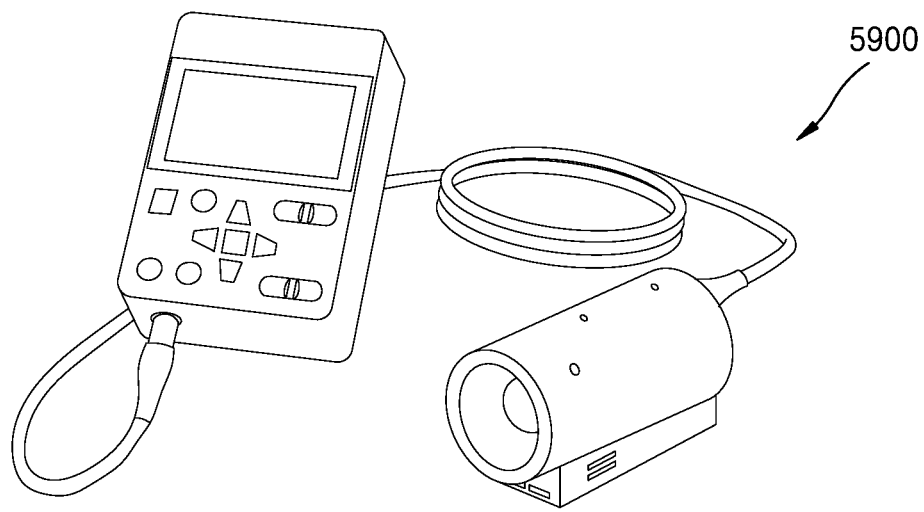

Furthermore, the image sensor 1000 may be applied to a smart refrigerator 5600 illustrated in FIG. 42, a security camera illustrated in FIG. 43, a robot 5800 illustrated in FIG. 44, a medical camera 5900 illustrated in FIG. 45, and the like. For example, the smart refrigerator 5600 may automatically recognize food in a refrigerator, by using an image sensor, and notify a user of the presence of a particular food, the type of food that is input or output, and the like, through a smartphone. The security camera 5700 may provide an ultrahigh resolution image and may recognize an object or a person in an image in a dark environment by using high sensitivity. The robot 5800 may be provided in a disaster or industrial site that is not directly accessible by people, and may provide a high resolution image. The medical camera 5900 may provide a high resolution image for diagnosis or surgery, and thus a field of vision may be dynamically adjusted.

Figure 46:
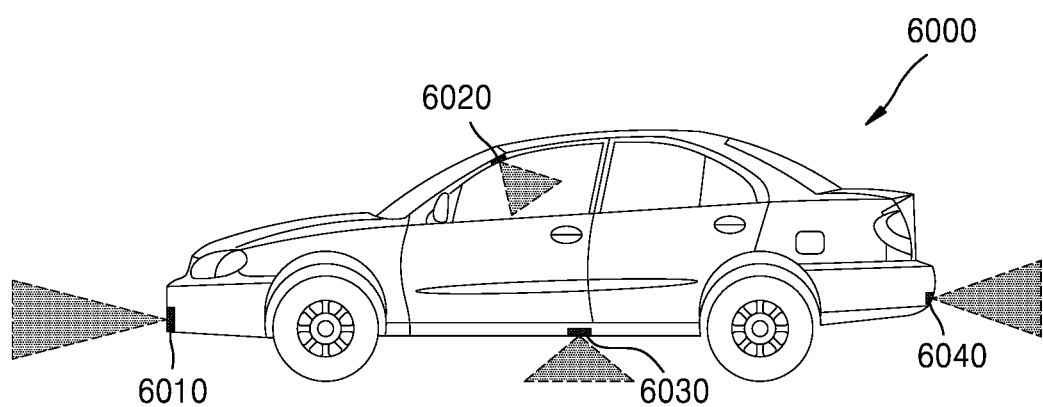

Furthermore, the image sensor 1000 may be applied to a vehicle 6000 as illustrated in FIG. 46. The vehicle 6000 may include a plurality of vehicle cameras 6010, 6020, 6030, and 6040 arranged at various positions. Each of the vehicle cameras 6010, 6020, 6030, and 6040 may include an image sensor according to an example embodiment. The vehicle 6000 may provide a driver with various pieces of information about the inside or periphery of the vehicle 6000, by using the vehicle cameras 6010, 6020, 6030, and 6040, and thus an object or a person in an image may be automatically recognized and information needed for autonomous driving is provided.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. An image sensor comprising:
   a spectral filter comprising a plurality of unit filters arranged in two dimensions, the plurality of unit filters having different center wavelengths;
   a pixel array comprising a plurality of pixels configured to receive light transmitted through the spectral filter and output image signals; and
   a processor configured to perform image processing on the image signals output from the pixel array,
   wherein the plurality of unit filters comprise:
      at least one first unit filter having a first center wavelength in a first wavelength range; and
      at least one second unit filter having a second center wavelength in a second wavelength range, and
   wherein the at least one first unit filter comprises:
      a plurality of first metal reflective layers spaced apart from each other and comprising a first metal; and
      at least one first cavity provided between the plurality of first metal reflective layers, wherein the at least one first unit filter comprises a plurality of first unit filters provided to form a first filter array, and the at least one second unit filter comprises a plurality of second unit filters provided to form a second filter array.

2. The image sensor of claim 1, wherein the pixel array is provided to correspond to the plurality of unit filters.

3. The image sensor of claim 2, wherein the processor is further configured to independently perform image processing on each of the image signals output from the pixel array and output processed image signals.

4. The image sensor of claim 2, wherein the processor is further configured to:
   group two or more image signals from among the image signals output from the pixel array,
   perform the image processing on the two or more image signals, and
   output processed image signals.

5. The image sensor of claim 4, wherein the processor is further configured to:
   group two or four image signals from among the image signals output from the pixel array,
   perform the image processing on the two or four image signals, and
   output processed image signals.

6. The image sensor of claim 4, wherein the two or more image signals are output from adjacent pixels, and the plurality of unit filters are arranged such that center wavelengths of the plurality of unit filters corresponding to the two or more image signals are adjacent to one another.

7. The image sensor of claim 1, wherein the spectral filter further comprises a red color filter, a green color filter, and a blue color filter provided on a same plane as the plurality of unit filters.

8. The image sensor of claim 7, wherein the pixel array is provided to correspond to the plurality of unit filters and the red color filter, the green color filter, and the blue color filter.

9. The image sensor of claim 8, wherein the processor is further configured to perform image processing on image signals output from pixels in the pixel array corresponding to the red color filter, the green color filter, and the blue color filter.

10. The image sensor of claim 1, wherein the spectral filter comprises a blank filter provided on a same plane as the plurality of unit filters, and wherein the blank filter is configured to directly transmit incident light.

11. The image sensor of claim 10, wherein the pixel array is provided to correspond to the plurality of unit filters and the blank filter.

12. The image sensor of claim 11, wherein the processor is further configured to perform image processing on an image signal output from a pixel in the pixel array corresponding to the blank filter.

13. The image sensor of claim 1, wherein the plurality of first unit filters have different center wavelengths provided to form the first filter array, and the plurality of second unit filters have different center wavelengths provided to form the second filter array.

14. The image sensor of claim 1,
wherein the at least one second unit filter comprises:
a plurality of second metal reflective layers spaced apart from each other and comprising a second metal different from the first metal; and
at least one second cavity provided between the plurality of second metal reflective layers.

15. The image sensor of claim 14,
wherein the center wavelength of the at least one first unit filter is adjusted by changing a thickness or an effective refractive index of the at least one first cavity, and the center wavelength of the at least one second unit filter is adjusted by changing a thickness or an effective refractive index of the at least one second cavity.

16. The image sensor of claim 14,
wherein the at least one first unit filter further comprises a first dielectric layer provided below the at least one first cavity and a second dielectric layer provided above the at least one first cavity, and
wherein the at least one second unit filter further comprises a third dielectric layer provided below the at least one second cavity and a fourth dielectric layer provided above the at least one second cavity.

17. The image sensor of claim 16,
wherein a thickness or an effective refractive index of each of the first dielectric layer and the second dielectric layer is adjusted based on the center wavelength of the at least one first unit filter, and a thickness or an effective refractive index of each of the third dielectric layer and the fourth dielectric layer is adjusted according to the center wavelength of the at least one second unit filter.

18. The image sensor of claim 1,
wherein the at least one second unit filter comprises:
a plurality of Bragg reflective layers spaced apart from each other; and
at least one second cavity provided between the plurality of Bragg reflective layers.

19. The image sensor of claim 1,
wherein the image sensor further comprises a timing controller, a row decoder, and an output circuit.

20. An electronic device comprising the image sensor of claim 1.

21. The electronic device of claim 20,
wherein the electronic device comprises a mobile phone, a smartphone, a tablet, a smart tablet, a digital camera, a camcorder, a notebook computer, a television, a smart television, a smart refrigerator, a security camera, a robot, or a medical camera.

22. The image sensor of claim 1, wherein the at least one first cavity comprises a first material layer and a second material layer provided in the first material layer.

23. The image sensor of claim 1, wherein the at least one first cavity comprises a first material layer and a plurality of second material layers provided in the first material layer.

24. The image sensor of claim 1, wherein the plurality of second material layer are provided parallel to each other and the plurality of second material layer are perpendicular to one of the plurality of first metal reflective layers.

25. An image sensor comprising:
a spectral filter comprising a plurality of unit filters having different center wavelengths;
a pixel array comprising a plurality of pixels configured to receive light transmitted through the spectral filter and outputting image signals; and
a processor configured to perform image processing on the image signals output from the pixel array,
wherein the processor is further configured to group two or more image signals from among the image signals output from the same pixel array, perform image processing on the two or more image signals, and output processed image signals.

26. The image sensor of claim 25,
wherein the pixel array comprises a plurality of blue pixels, a plurality of green pixels, and a plurality of red pixels.

27. The image sensor of claim 26,
wherein the processor is further configured to:
group at least one of first image signals output from the blue pixels and perform image processing on the at least one of the first image signals,
group at least one of second image signals output from the green pixels and perform image processing on the at least one of the second image signals, and
group at least one of third image signals output from the red pixels and perform image processing on the at least one of the third image signals.

28. The image sensor of claim 27,
wherein the pixel array further comprises one or more ultraviolet (UV) pixels.

29. The image sensor of claim 28,
wherein the processor is further configured to group at least one of UV image signals output from the one or more ultraviolet pixels and perform image processing on the at least one of the UV image signals.

30. The image sensor of claim 27,
wherein the pixel array further comprises one or more near-infrared (NIR) pixels.

31. The image sensor of claim 30,
wherein the processor is further configured to group at least one of NIR image signals output from the one or more NIR pixels and perform image processing on the at least one of NIR image signals.

32. The image sensor of claim 25,
wherein the processor is further configured to perform processing on spectrum information regarding each of the image signals output from the pixel array and output the spectrum information.

33. The image sensor of claim 25,
wherein the processor is further configured apply a weight to at least one of image signals output from the pixel array based on a specific wavelength range corresponding to the image signals, and perform image processing based on a sum of the image signals or a difference between the image signals.

34. The image sensor of claim 25,
wherein the plurality of unit filters comprise:
at least one first unit filter having a first center wavelength in a first wavelength range; and
at least one second unit filter having a second center wavelength in a second wavelength range.

35. The image sensor of claim 34,
wherein the at least one first unit filter comprises:
a plurality of first metal reflective layers spaced apart from each other and comprising a first metal; and
at least one first cavity provided between the plurality of first metal reflective layers.

36. The image sensor of claim 35,
wherein the at least one second unit filter comprises: a plurality of second metal reflective layers spaced apart from each other and comprising a second metal different from the first metal; and
at least one second cavity provided between the plurality of second metal reflective layers.

37. The image sensor of claim 35,
wherein the at least one second unit filter comprises:
- a plurality of Bragg reflective layers spaced apart from each other; and
- at least one second cavity provided between the plurality of Bragg reflective layers.

38. The image sensor of claim 25,
wherein the image sensor further comprises a timing controller, a row decoder, and an output circuit.

39. An electronic device comprising the image sensor of claim 25.

40. The electronic device of claim 39,
wherein the electronic device comprises a mobile phone, a smartphone, a tablet, a smart tablet, a digital camera, a camcorder, a notebook computer, a television, a smart television, a smart refrigerator, a security camera, a robot, or a medical camera.

41. The image sensor of claim 25, wherein the two or more image signals are output from adjacent pixels in the pixel array.

42. The image sensor of claim 25, wherein the plurality of unit filters are arranged such that center wavelengths of two or more unit filters, among the plurality of unit filters, corresponding to the two or more image signals are adjacent to one another.

* * * * *